(12) United States Patent
Yamazaki et al.

(10) Patent No.: US 10,593,811 B2
(45) Date of Patent: *Mar. 17, 2020

(54) SEMICONDUCTOR DEVICE COMPRISING OXIDE SEMICONDUCTOR

(71) Applicant: Semiconductor Energy Laboratory Co., Ltd., Atsugi-shi, Kanagawa-ken (JP)

(72) Inventors: Shunpei Yamazaki, Setagaya (JP); Kengo Akimoto, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/372,930

(22) Filed: Apr. 2, 2019

(65) Prior Publication Data

US 2019/0288120 A1   Sep. 19, 2019

Related U.S. Application Data

(63) Continuation of application No. 15/909,165, filed on Mar. 1, 2018, now Pat. No. 10,256,349, which is a (Continued)

(30) Foreign Application Priority Data

Sep. 1, 2008   (JP) ................................. 2008-224034

(51) Int. Cl.
*H01L 29/786* (2006.01)
*H01L 29/49* (2006.01)
(Continued)

(52) U.S. Cl.
CPC .... *H01L 29/78696* (2013.01); *H01L 21/0234* (2013.01); *H01L 21/02318* (2013.01);
(Continued)

(58) Field of Classification Search
None
See application file for complete search history.

(56) References Cited

U.S. PATENT DOCUMENTS

| 5,338,959 A | 8/1994 | Kim et al. |
| 5,731,856 A | 3/1998 | Kim et al. |

(Continued)

FOREIGN PATENT DOCUMENTS

| EP | 1737044 A | 12/2006 |
| EP | 1933293 A | 6/2008 |

(Continued)

OTHER PUBLICATIONS

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

(Continued)

*Primary Examiner* — J. E. Schoenholtz
(74) *Attorney, Agent, or Firm* — Robinson Intellectual Property Law Office; Eric J. Robinson

(57) ABSTRACT

An object is to provide favorable interface characteristics of a thin film transistor including an oxide semiconductor layer without mixing of an impurity such as moisture. Another object is to provide a semiconductor device including a thin film transistor having excellent electric characteristics and high reliability, and a method by which a semiconductor device can be manufactured with high productivity. A main point is to perform oxygen radical treatment on a surface of a gate insulating layer. Accordingly, there is a peak of the oxygen concentration at an interface between the gate insulating layer and a semiconductor layer, and the oxygen concentration of the gate insulating layer has a concentration gradient. The oxygen concentration is increased toward the (Continued)

interface between the gate insulating layer and the semiconductor layer.

11 Claims, 49 Drawing Sheets

Related U.S. Application Data continuation of application No. 14/947,109, filed on Nov. 20, 2015, now Pat. No. 9,911,865, which is a continuation of application No. 14/471,632, filed on Aug. 28, 2014, now Pat. No. 9,196,713, which is a continuation of application No. 13/356,044, filed on Jan. 23, 2012, now Pat. No. 8,822,264, which is a continuation of application No. 12/549,415, filed on Aug. 28, 2009, now Pat. No. 8,129,719.

(51) Int. Cl.
*H01L 21/02* (2006.01)
*H01L 29/66* (2006.01)
*H01L 29/24* (2006.01)

(52) U.S. Cl.
CPC .. *H01L 21/02323* (2013.01); *H01L 21/02565* (2013.01); *H01L 29/247* (2013.01); *H01L 29/4908* (2013.01); *H01L 29/66969* (2013.01); *H01L 29/7869* (2013.01); *H01L 29/78693* (2013.01)

(56) References Cited

U.S. PATENT DOCUMENTS

| | | | |
|---|---|---|---|
| 5,744,864 A | 4/1998 | Cillessen et al. |
| 5,847,410 A | 12/1998 | Nakajima |
| 6,228,751 B1 | 5/2001 | Yamazaki et al. |
| 6,294,274 B1 | 9/2001 | Kawazoe et al. |
| 6,563,174 B2 | 5/2003 | Kawasaki et al. |
| 6,703,264 B2 | 3/2004 | Yamazaki et al. |
| 6,727,522 B1 | 4/2004 | Kawasaki et al. |
| 6,734,069 B2 | 5/2004 | Eriguchi |
| 6,900,872 B2 | 5/2005 | Kang |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,071,037 B2 | 7/2006 | Suzawa et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,339,187 B2 | 3/2008 | Wager, III et al. |
| 7,385,224 B2 | 6/2008 | Ishii et al. |
| 7,393,723 B2 | 7/2008 | Yamazaki et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,595,143 B2 | 9/2009 | Park et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,759,736 B2 | 7/2010 | Joshi |
| 7,767,505 B2 | 8/2010 | Son et al. |
| 7,791,072 B2 | 9/2010 | Kumomi et al. |
| 7,816,680 B2 | 10/2010 | Kim et al. |
| 7,829,444 B2 | 11/2010 | Yabuta et al. |
| 7,884,360 B2 | 2/2011 | Takechi et al. |
| 7,893,431 B2 | 2/2011 | Kim et al. |
| 7,982,215 B2 | 7/2011 | Inoue et al. |
| 8,013,331 B2 | 9/2011 | Wakita |
| 8,030,195 B2 | 10/2011 | Inoue et al. |
| 8,084,307 B2 | 12/2011 | Itagaki et al. |
| 8,093,589 B2 | 1/2012 | Sugihara et al. |
| 8,143,678 B2 | 3/2012 | Kim et al. |
| 8,148,721 B2 | 4/2012 | Hayashi et al. |
| 8,164,256 B2 | 4/2012 | Sano et al. |
| 8,415,198 B2 | 4/2013 | Itagaki et al. |
| 8,421,070 B2 | 4/2013 | Kim et al. |
| 8,558,323 B2 | 10/2013 | Kim et al. |
| 8,735,882 B2 | 5/2014 | Kim et al. |
| 9,082,857 B2 | 7/2015 | Yamazaki et al. |
| 9,911,865 B2 | 3/2018 | Yamazaki et al. |
| 10,256,349 B2 * | 4/2019 | Yamazaki ............ H01L 29/4908 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017244 A1 | 1/2005 | Hoffman et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170067 A1 | 8/2006 | Maekawa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 * | 3/2007 | Akimoto ............ H01L 27/1225 438/795 |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0264761 A1 | 11/2007 | Lee et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0176364 A1 | 7/2008 | Yang et al. |
| 2008/0182358 A1 | 7/2008 | Cowdery-Corvan et al. |
| 2008/0191204 A1 | 8/2008 | Kim et al. |
| 2008/0203387 A1 | 8/2008 | Kang et al. |
| 2008/0224133 A1 | 9/2008 | Park et al. |
| 2008/0254569 A1 | 10/2008 | Hoffman et al. |

(56) References Cited

U.S. PATENT DOCUMENTS

| | | |
|---|---|---|
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0142887 A1 | 6/2009 | Son et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0051936 A1 | 3/2010 | Hayashi et al. |
| 2010/0059746 A1 | 3/2010 | Itai |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0267198 A1 | 10/2010 | Yabuta et al. |
| 2010/0283049 A1 | 11/2010 | Sato et al. |
| 2011/0097844 A1 | 4/2011 | Takechi et al. |
| 2012/0112186 A1 | 5/2012 | Ye |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-104096 A | 4/2004 |
| JP | 2004-273614 A | 9/2004 |
| JP | 2004-273732 A | 9/2004 |
| JP | 2006-165531 A | 6/2006 |
| JP | 2007-058216 A | 3/2007 |
| JP | 2007-073959 A | 3/2007 |
| JP | 2007-096055 A | 4/2007 |
| JP | 2007-123861 A | 5/2007 |
| JP | 2007-165861 A | 6/2007 |
| JP | 2007-243045 A | 9/2007 |
| JP | 2007-311404 A | 11/2007 |
| JP | 2008-042088 A | 2/2008 |
| JP | 2008-053356 A | 3/2008 |
| JP | 2008-060419 A | 3/2008 |
| JP | 2008-130814 A | 6/2008 |
| JP | 2008-199005 A | 8/2008 |
| WO | WO-2004/114391 | 12/2004 |
| WO | WO-2007/040194 | 4/2007 |
| WO | WO-2007/108293 | 9/2007 |
| WO | WO-2007/120010 | 10/2007 |
| WO | WO-2007/148601 | 12/2007 |
| WO | WO-2008/023553 | 2/2008 |
| WO | WO-2008/062720 | 5/2008 |
| WO | WO-2008/069286 | 6/2008 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04: SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08: Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08: SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m=3, 4, and 5), $InGaO_3(ZnO)3$, and $Ga_2O_3(ZnO)m$ (m=7, 8, 9, and 16) in the $In_2O_3$—$ZnGa_2O_4$—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09: SID International Symposium Digest of Technical Papers, May 31, 2009, vol. 40, pp. 184-187.

Nomura.K et al., "Carrier transport in transparent oxide semiconductor with intrinsic structural randomness probed using single-crystalline $InGaO_3(ZnO)5$ films", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08: SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08: SID International Symposium Digest of Technical Papers, May 20, 2008, vol. 39, pp. 625-628.

Nowatari.H et al., "60.2: Intermediate Connector With Suppressed Voltage Loss for White Tandom OLEDs", SID Digest '09: SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer", Adv. Mater. (Advanced Materials), 2006, vol. 18, No. 3, pp. 339-342.

(56) References Cited

OTHER PUBLICATIONS

Tsuda.K et al., "Ultra Low Power Consumption Technologies for Mobile TFT-LCDs", IDW '02: Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09: SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09: SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09: SID International Symposium Digest of Technical Papers, May 31, 2009, pp. 983-985.

Sakata.J et al., "Development of 4.0-In. AMOLED Display With Driver Circuit Using Amophous In—Ga—Zn-Oxide TFTs", IDW '09: Proceedings of the 16th International Display Workshops, 2009, pp. 689-692.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by PEALD Grown ZNO TFT", IMID '07 Digest, 2007, pp. 1249-1252.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZNO TFTs) for AMLCDs", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07: SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT", SID Digest '09: SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09: SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09: SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07: SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08: SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

(56) References Cited

OTHER PUBLICATIONS

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Chowdhury.M, "Bias and UV induced instabilities in amorphous indium-gallium-zinc-oxide thin-film-transistors", Thesis for the Degree of Master of Science, Aug. 1, 2011.

Nomura.K et al., "Relationship between non-localized tail states and carrier transport in amorphous oxide semiconductor, In—Ga—Zn—O", Phys. Stat. Sol. (A) (Physica Status Solidi. A.), 2008, vol. 205, No. 8, pp. 1910-1914.

Kamiya.T et al., "Electronic structure of oxygen deficient amorphous oxide semiconductor a-InGaZnO4-x:Optical analyses and first-principle calculations", Phys. Stat. Sol. (C) (Physica Status Solidi. C.), 2008, vol. 5, No. 9, pp. 3098-3100.

Lim.W et al., "High-Performance Indium Gallium Zinc Oxide Transparent Thin-Film Transistors Fabricated by Radio-Frequency Sputtering", Journal of the Electrochemical Society, Apr. 10, 2008, vol. 155, No. 6, pp. H383-H385.

Fung.T et al., "Two-dimensional numerical simulation of radio frequency sputter amorphous In—Ga—Zn—O thin-film transistors", J. Appl. Phys. (Journal of Applied Physics), Oct. 28, 2009, vol. 106, No. 8, pp. 084511-1-084511-10.

Fung.T, "Amorphous In—Ga—Zn—O Thin Film Transistor for Future Optoelectronics", 2010, pp. 1-189.

Suresh.A et al., "Bias stress stability of indium gallium zinc oxide channel based transparent thin film transistors", Appl. Phys. Lett. (Applied Physics Letters), 2008, vol. 92, No. 3, pp. 033502-1-033502-3.

Kim.C et al., "Density-of-States Modeling of Solution-Processed InGaZnO Thin-Film Transistors", IEEE Electron Device Letters, Oct. 1, 2010, vol. 31, No. 10, pp. 1131-1133.

Chung.K et al., "The Effect of Oxide and Nitride Passivation on the Behavior of In—Ga—Zn—O Thin-Film Transistors under Negative and Positive Bias Illumination Stress: A Photo-excited Charge Collection Spectroscopic Analysis", J. Korean Phys. Soc.(Journal of the Korean Physical Society), vol. 59, No. 6, pp. 3376-3379.

Sundholm.E, Nontraditional Amorphous Oxide Semiconductor Thin-Film Transistor Fabrication, Sep. 11, 2012, pp. 1-162, Oregon State University.

Liu.S et al., "Influence of Passivation Layers on Characteristics of a-InGaZnO Thin-Film Transistors", IEEE Electron Device Letters, Feb. 1, 2011, vol. 32, No. 2, pp. 161-163.

Jeong.J et al., "3.1:Distinguished Paper: 12.1-inch WXGA AMOLED Display Driven by indium-Gallium-Zinc Oxide TFTs Array", SID Digest '08: SID International Symposium Digest of Technical Papers, May 20, 2008, vol. 39, pp. 1-4.

Chiang.H et al., "Processing effects on the stability of amorphous indium gallium zinc oxide thin-film transistors", J. Non-Cryst. Solids (Journal of Non-Crystalline Solids), May 1, 2008, vol. 354, pp. 2826-2830.

Suresh.A, "Amorphous Indium Gallium Zinc Oxide Thin-Film Transistors, Non-volatile Memory and Circuits for Transparent Electronics", 2009.

Park.J et al., "High-performance amorphous gallium indium zinc oxide thin-film transistors through N2O plasma passivation", Appl. Phys. Lett. (Applied Physics Letters), Aug. 7, 2008, vol. 93, pp. 053505-1-053505-3.

Nayak.P et al., "High performance In2O3 thin film transistors using chemically derived aluminum oxide dielectric", Appl. Phys. Lett. (Applied Physics Letters), 2013, vol. 103, pp. 033518-1-033518-4.

Khan.S et al., "Metal Oxide-based (IZO and ZnO) TFTs for Flexible Electronics", Mat. Res. Soc. Symp. Proc. (Materials Research Society Symposia Proceedings), 2008, vol. 1109, 2009 Materials Research Society.

Ku.D et al., "Structural and electrical properties of sputtered indium-zinc oxide thin films", Thin Solid Films, Dec. 5, 2006, vol. 515, No. 4, pp. 1364-1369, Elsevier.

* cited by examiner

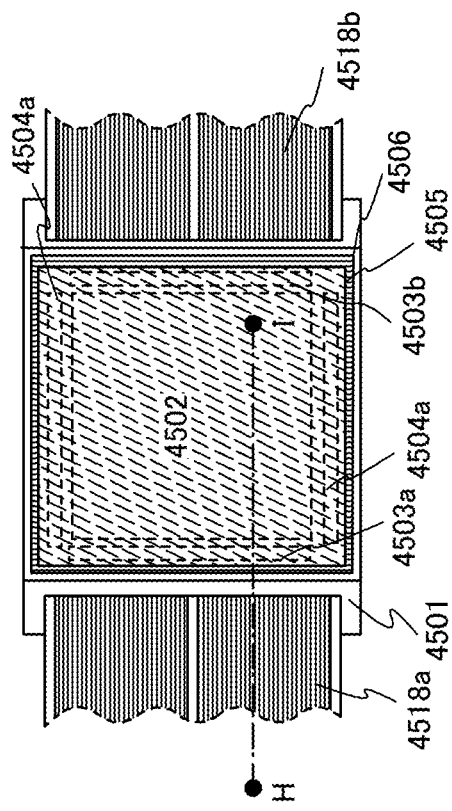
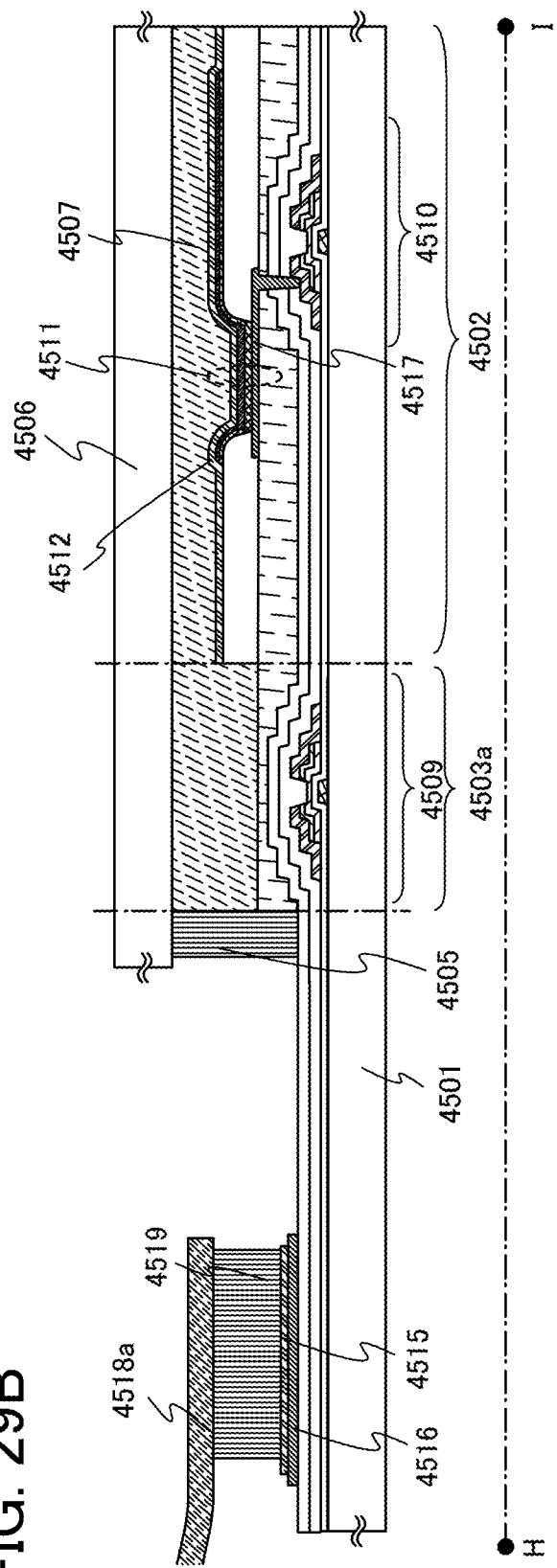
FIG. 29A
FIG. 29B

SEMICONDUCTOR DEVICE COMPRISING OXIDE SEMICONDUCTOR

BACKGROUND OF THE INVENTION

1. Field of the Invention

The present invention relates to a semiconductor device which has a circuit including a thin film transistor (hereinafter referred to as a TFT) in which a channel formation region is formed using an oxide semiconductor film and a manufacturing method thereof. For example, the present invention relates to an electronic appliance in which an electro-optical device typified by a liquid crystal display panel or a light-emitting display device including an organic light-emitting element is mounted as its component.

Note that the semiconductor device in this specification indicates all the devices which can operate by using semiconductor characteristics, and an electro-optical device, a semiconductor circuit, and an electronic appliance are all included in the semiconductor devices.

2. Description of the Related Art

In recent years, active matrix display devices (such as liquid crystal display devices, light-emitting display devices, or electrophoretic display devices) in which a switching element including a TFT is provided in each of display pixels arranged in a matrix have been actively developed. In the active matrix display devices, a switching element is provided in each of pixels (or each of dots), and thus, there is such an advantage that the active matrix display devices can be driven at lower voltage than passive matrix display devices in the case where the pixel density is increased.

In addition, a technique has attracted attention, where a thin film transistor (TFT) in which a channel formation region is formed using an oxide semiconductor film, or the like is manufactured and such a TFT or the like is applied to electronic devices or optical devices. For example, a TFT in which zinc oxide (ZnO) is used as an oxide semiconductor film or a TFT in which $InGaO_3(ZnO)_m$ is used as an oxide semiconductor film can be given. A technique in which a TFT including such an oxide semiconductor film is formed over a light-transmitting substrate and used as a switching element or the like of an image display device, is disclosed in Patent Document 1 and Patent Document 2

REFERENCE

Patent Document

[Patent Document 1] Japanese Published Patent Application No. 2007-123861.
[Patent Document 2] Japanese Published Patent Application No. 2007-96055

SUMMARY OF THE INVENTION

Thin film transistors in which an oxide semiconductor film is used for a channel formation region have many problems relating to reliability such as instability of an interface of the oxide semiconductor film. However, interface characteristics of thin film transistors in which IGZO is used have not been discussed at all up to now. In addition, cause of instability relating to reliability has been unclear.

Thus, an object of an embodiment of the present invention is to provide favorable interface characteristics of a thin film transistor in which an oxide semiconductor film including indium (In), gallium (Ga), and zinc (Zn) is used, without mixing of an impurity such as moisture.

In addition, in the case where a gate insulating layer in contact with the oxide semiconductor film includes hydrogen, the hydrogen in the gate insulating layer may possibly be diffused and react with oxygen in the oxide semiconductor film to be a $H_2O$ component.

Further, in the case where the oxygen concentration of the gate insulating layer is low, the oxygen concentration in the oxide semiconductor film may possibly be reduced.

Furthermore, another object of an embodiment of the present invention is to provide a channel formation region including a large amount of oxygen in a thin film transistor in which an oxide semiconductor film including indium (In), gallium (Ga), and zinc (Zn) is used.

In addition, high-speed operation, a comparatively simple manufacturing process, sufficient reliability are needed for a thin film transistor in which an oxide semiconductor film is used for a channel formation region.

In formation of a thin film transistor, a low resistance metal material is used for a source electrode and a drain electrode. In particular, when a display device with a large-area display is manufactured, a problem of signal delay due to resistance of a wiring significantly arises. Accordingly, it is preferable that a metal material with a low electrical resistance value be used as a material of a wiring and an electrode. In a thin film transistor having a structure in which an oxide semiconductor film and source and drain electrodes formed using a metal material with a low electrical resistance value are in direct contact with each other, there is a concern that contact resistance increases. It can be considered that one cause of increase of contact resistance is that a Schottky junction is formed at a contact surface between the source and drain electrodes and the oxide semiconductor film.

In addition, capacitance is formed in a portion where the source and drain electrodes and the oxide semiconductor film have a direct contact with each other, and there are risks that frequency characteristics (called "f characteristics") decrease and high speed operation of the thin film transistor is hindered.

An object of an embodiment of the present invention is to provide a thin film transistor and a manufacturing method thereof, in which an oxide semiconductor film including indium (In), gallium (Ga), and zinc (Zn) is used and the contact resistance of a source or drain electrode is reduced.

Another object is to improve operation characteristics and reliability of the thin film transistor in which an oxide semiconductor film including In, Ga, and Zn is used.

Further, another object is to reduce variation in electrical characteristics of the thin film transistor in which an oxide semiconductor film including In, Ga, and Zn is used. In particular, in a liquid crystal display device where variation between elements is large, there is a risk that display unevenness due to variation in the TFT characteristics is caused.

Further, in a display device including a light-emitting element, in the case where there is large variation in on-current ($I_{on}$) of TFTs (TFTs provided in a driver circuit or TFTs supplying current to light-emitting elements arranged in pixels) arranged so as to make constant current flow in a pixel electrode, there is a risk that variation in luminance is generated on a display screen.

An object of an embodiment of the present invention is to solve at least one of the above problems.

A main point of an embodiment of the present invention is to perform oxygen radical treatment on a surface of the gate insulating layer. Accordingly, there is a peak of the oxygen concentration at an interface between the gate insulating layer and a semiconductor layer, and the oxygen concentration of the gate insulating layer has a concentration gradient. The oxygen concentration is increased toward the interface between the gate insulating layer and the semiconductor layer.

In addition, an embodiment of the present invention is an inverted staggered (bottom gate) thin film transistor in which an oxygen-excess oxide semiconductor film is used as a semiconductor film and source and drain regions are provided using an oxygen-deficient oxide semiconductor film between the semiconductor layer and source and drain electrode layers.

As the semiconductor layer and the source and drain regions, oxide semiconductor films containing In, Ga, and Zn can be used. Furthermore, tungsten, molybdenum, titanium, nickel, or aluminum may be substituted for any one of In, Ga, and Zn.

In this specification, a semiconductor layer formed using an oxide semiconductor film including In, Ga, and Zn is also referred to as an "IGZO semiconductor layer."

By oxygen radical treatment of the gate insulating layer, oxygen radicals can be implanted into the gate insulating layer so that the gate insulating layer in the vicinity of the interface with the oxygen-excess oxide semiconductor layer includes an excessive amount of oxygen relative to the bulk GI.

By oxygen radical treatment, the gate insulating layer in the vicinity of the interface with the oxide semiconductor layer can be reformed into a gate insulating layer having an oxygen-excess region.

The gate insulating layer having an oxygen-excess region and the oxygen-excess oxide semiconductor layer are compatible with each other and can provide a favorable interface.

In addition, the gate insulating layer having an oxygen-excess region and the oxygen-excess oxide semiconductor layer are preferably stacked by successive formation.

Oxygen radicals may be supplied from a plasma generating apparatus with use of a gas including oxygen or from an ozone generating apparatus. According to an embodiment of the present invention, by irradiating a thin film with oxygen radicals or oxygen supplied, the film surface can be reformed.

In addition, the present invention is not limited to oxygen radical treatment, and argon and oxygen radical treatment may be performed. The term "argon and oxygen radical treatment" means modifying a thin film surface by introducing an argon gas and an oxygen gas and generating plasma.

An Ar atom (Ar) in a reactive space in which an electric field is applied and discharge plasma is generated is excited or ionized by an electron (e) in discharge plasma to an argon radical (Ar*), an argon ion (Ar$^+$), or an electron (e). An argon radical (Ar*) is in a metastable state with high energy, and tends to return to a stable state by reacting with an atom of the same kind or a different kind in its vicinity and exciting or ionizing the atom; thus, reaction occurs like an avalanche phenomenon. In the presence of oxygen in its vicinity at that time, an oxygen atom (O) is excited or ionized to an oxygen radical (O*), an oxygen ion (O$^+$), or oxygen (O). The oxygen radical (O*) reacts with a material at a surface of a thin film that is an object to be treated, whereby surface reformation is performed, and reacts with an organic substance at the surface, whereby the organic substance is removed; thus, plasma treatment is performed. Note that a feature of a radical of an inert gas is to maintain a metastable state for a longer period compared to a radical of a reactive gas; accordingly, an inert gas is generally used to generate plasma.

The gate insulating layer is most preferably an insulating layer containing a large amount of oxygen which is formed by a sputtering method in which a silicon target is used and an Ar gas and an oxygen gas are introduced. On the other hand, in the case where the gate insulating layer is formed by a plasma CVD (PCVD) method using a TEOS gas or the like, when hydrogen included in the gate insulating layer reacts with oxygen in the oxide semiconductor layer, $H_2O$ or OH is easily produced, which may become an obstacle as a carrier killer and may cause a decrease in reliability. In other words, it is not preferable to use an insulating film including hydrogen which is formed by a PCVD method as the gate insulating layer because hydrogen in the gate insulating layer may react with oxygen in the oxygen-excess oxide semiconductor layer. Thus, the peak of the hydrogen concentration in the gate insulating layer, when measured by secondary ion mass spectrometry (SIMS), is preferably $2 \times 10^{19}$ cm$^{-3}$ or less. In addition, FIG. 3 illustrates a comparative example in which a gate insulating layer having low oxygen concentration is subjected to oxygen radical treatment; however, this case is not preferable because oxygen in the oxygen-excess oxide semiconductor layer may be absorbed.

Therefore, the interface on the gate insulating layer side is subjected to oxygen radical treatment and doped with oxygen such that distribution of oxygen concentration as illustrated in FIG. 1A is obtained. After that, an IGZO film is formed, and then, heat treatment (200° C. to 600° C.) is performed. FIG. 1A is a schematic diagram of the oxygen concentration in the vicinity of the interface between the gate insulating layer and the semiconductor layer before heat treatment. FIG. 1B is a schematic diagram of the oxygen concentration in the vicinity of the interface between the gate insulating layer and the semiconductor layer after heat treatment.

Changing the state illustrated in FIG. 1A to the state of FIG. 1B by heat treatment is effective in preventing excess oxygen in the gate insulating layer from being drifted to the IGZO film side and oxygen in the IGZO film from being drifted to the GI side. With oxygen radicals at a surface of the gate insulating layer, the interface can be stabilized. It is found that a cause of instability in reliability is the interface between the gate insulating layer and the IGZO film, and reliability is stabilized by reformation of not the IGZO film but the gate insulating layer and by heat treatment after that.

After a surface of the gate insulating layer is changed into SiN by plasma treatment, it may be subjected to oxygen radical treatment to suppress diffusion of hydrogen from the gate insulating layer into the IGZO film. As plasma treatment to change a surface into SiN, a method in which a surface of the gate insulating layer is nitrided with nitrogen radicals (including NH radicals in some cases) by causing plasma excitation with microwaves, a method in which reverse sputtering is performed in a nitrogen atmosphere, or the like may be used. FIGS. 2A and 2B are schematic diagrams of oxygen concentration in the vicinity of the interface between the gate insulating layer, a surface of which has been changed into SiN and then subjected to oxygen radial treatment, and the semiconductor layer.

Note that FIGS. 1A and 1B, FIGS. 2A and 2B, and FIG. 3 are schematic diagrams for simply illustrating a concept of an embodiment of the present invention, and it is needless to say that the present invention is not particularly limited thereto.

Ohmic contact is needed between the source electrode layer and the IGZO semiconductor layer, and moreover, its contact resistance is preferably reduced as much as possible. Similarly, ohmic contact is needed between the drain electrode layer and the IGZO semiconductor layer, and its contact resistance is preferably reduced as much as possible.

Thus, a source region and a drain region having a higher carrier concentration than the IGZO semiconductor layer are intentionally provided between the source and drain electrode layers and the IGZO semiconductor layer, so that ohmic contact is made.

An oxygen-excess oxide semiconductor layer is used as a semiconductor layer, and an oxygen-deficient oxide semiconductor layer is used as a source region or a drain region. The oxygen-deficient oxide semiconductor which is the source or drain region includes crystal grains.

When an oxygen-deficient oxide semiconductor layer including crystal grains is positively provided as a source region or a drain region, a junction between a source or a drain electrode layer that is a metal layer and an IGZO film is favorable and has a higher operation stability also in terms of heat than Schottky junction. In addition, it is important to positively provide a source region or a drain region including crystal grains in order to supply carriers to a channel (on the source side), stably absorb carriers from a channel (on the drain side), or prevent resistance from being formed at an interface with the source electrode layer (or the drain electrode layer). Reduction in resistance is also important to ensure favorable mobility even with high drain voltage.

An IGZO film of 400 nm was formed over a glass substrate by a DC sputtering method and measured by XRD (X-ray analysis). The formation conditions were as follows: the pressure was 0.4 Pa; the power was 500 W; the formation temperature was room temperature; the argon gas flow rate was 10 sccm; the oxygen flow rate was 5 sccm; and the target was a target of $In_2O_3:Ga_2O_3:ZnO=1:1:1$. Note that the target having this ratio is intentionally used in order to obtain an amorphous IGZO film.

FIG. 37 is an XRD chart thereof. A chart immediately after the film formation corresponds to that indicated in FIG. 37 as "as-depo." In FIG. 37, a chart after heat treatment in a nitrogen atmosphere at 350° C. for 1 hour after the film formation, a chart after heat treatment in a nitrogen atmosphere at 500° C. for 1 hour after the film formation, a chart after heat treatment in a nitrogen atmosphere at 600° C. for 1 hour after the film formation, and a chart after heat treatment in a nitrogen atmosphere at 700° C. for 1 hour after the film formation are also shown all together for convenience of comparison.

In a sample which has been subjected to the heat treatment at 700° C., peaks indicating crystallinity are clearly observed in the range of 30° to 35° and in the range of 55° to 60°. In addition, a sample in which an IGZO film of 400 nm was formed and then subjected to heat treatment in a nitrogen atmosphere at 700° C. for 1 hour was cut with a focused ion beam (FIB) to expose an end face, and the end face was observed with a high-resolution transmission electron microscope (TEM: "H9000-NAR" manufactured by Hitachi, Ltd.) at an acceleration voltage of 300 kV. The results of observation at a magnification of 0.5 million times are shown in FIG. 48, where crystal grains can be seen. A photograph of a cross-section taken with a scanning transmission electron microscope (STEM: "HD-2700" manufactured by Hitachi, Ltd.) at an acceleration voltage of 200 kV and at a magnification of 6 million times is shown in FIG. 49. In FIG. 49, a clear lattice image can be seen, which corresponds to the fact that the peaks indicating crystallinity are seen by the XRD measurement.

In addition, in order to examine the presence or absence of crystal grains, the size of crystal grains, the distribution state of crystal grains, an IGZO film of 50 nm was formed over a glass substrate by a DC sputtering method and cut with an FIB to expose an end face, and the end face was observed with the high-resolution transmission electron microscope (TEM: "H9000-NAR" manufactured by Hitachi, Ltd.) at an acceleration voltage of 300 kV.

Sample 1 in which film formation was performed by sputtering using a target of $In_2O_3:Ga_2O_3:ZnO=1:1:1$ under oxygen-excess conditions where the pressure was 0.4 Pa, the power was 500 W, the formation temperature was room temperature, the argon gas flow rate was 5 sccm, and the oxygen flow rate was 45 sccm and Sample 2 in which film formation was performed by sputtering under oxygen-deficient conditions where only an argon gas was introduced at a flow rate of 40 sccm without introducing an oxygen gas and the other conditions were the same were prepared and each subjected to cross-section observation.

The results of observation of Sample 1 at a magnification of 0.5 million times are shown in FIG. 38, and the results of observation of Sample 2 at a magnification of 0.5 million times are shown in FIG. 39. In Sample 1, no crystal grains can be seen in the IGZO film, whereas in Sample 2, it can be confirmed that crystal grains with a diameter of about 1 nm to 10 nm, typically, about 2 nm to 4 nm, are scattered in the IGZO film. The crystal grains of Sample 2 have a smaller size than those in FIG. 48 that is a cross-section observation photograph of the sample which has been subjected to heat treatment at 700° C. The results indicate that despite the intentional use of a target of $In_2O_3:Ga_2O_3:ZnO=1:1:1$ in order to obtain an amorphous IGZO film, an IGZO film including crystal grains immediately after the film formation is obtained.

In addition, Sample 3 which was subjected to heat treatment in a nitrogen atmosphere at 350° C. for 1 hour after film formation under the conditions for Sample 1, and Sample 4 which was subjected to heat treatment in a nitrogen atmosphere at 350° C. for 1 hour after film formation under the conditions for Sample 2 were prepared and each subjected to cross-section observation.

The results of observation of Sample 3 at a magnification of 0.5 million times are shown in FIG. 40, and the results of observation of Sample 4 at a magnification of 0.5 million times are shown in FIG. 41. In Sample 3, no crystal grains can be seen in the IGZO film, whereas in Sample 4, it can be confirmed that crystal grains with a diameter of about 1 nm to 10 nm, typically, about 2 nm to 4 nm, are scattered in the IGZO film.

Samples 1 to 4 were measured by XRD, and the results obtained show that no peaks indicating crystallinity can be clearly seen in any of the samples as in the sample which is indicated as "as-depo" in FIG. 37 and the sample which has been subjected to heat treatment in a nitrogen atmosphere at 350° C. for 1 hour.

Thus, no crystal grains can be seen in the TEM photograph of Sample 1 in which the sputtering film formation conditions are oxygen-excess conditions, whereas crystal grains can be seen in the TEM photograph of Sample 2 where the sputtering film formation conditions are oxygen-deficient conditions. A cause thereof is described below.

In Sample 2 obtained under oxygen-deficient conditions, plasma energy of Ar ions is imparted to grains in stoichiometric proportion which are normally crystallized when a sputtering target is sputtered by Ar, and the grains are crystallized or grown while flying (from the target to a substrate). Thus, it can be observed that a crystal grain in a film during deposition has also an angled portion. In addition, it can also be observed that if heat treatment is performed at 350° C., crystal grains tend to have a blurred grain boundary, that is, an indistinct grain boundary, as shown in FIG. 41 compared to FIG. 39, by reacting with oxygen in an amorphous component in the vicinity of the crystal grains. It can be considered that the crystalline order of the crystal grains is developed and expanded to the amorphous component in the vicinity.

Accordingly, under oxygen-deficient conditions, an IGZO film having lower oxygen concentration is formed, and an $n^+$ type region is formed with a higher carrier concentration.

Through this formation process of crystal grains, it can be said that the density of crystal grains can be adjusted and the diameter size can be adjusted within the range of 1 nm to 10 nm by appropriate adjustment of the ratio of target constituents, the film formation pressure (0.1 Pa to 2.0 Pa), the power (250 W to 3000 W, 8 inches $\Phi$), the temperature (room temperature to 100° C.), the reactive sputtering film formation conditions, or the like.

On the other hand, in Sample 1 obtained under oxygen-excess conditions, even if crystals are desired to be grown with plasma energy while flying by sputtering of a sputtering target, excessive oxygen is present. Thus, each element strongly reacts with oxygen, and IGZO crystal growth mechanism cannot be applied; accordingly, all components are deposited in a glassy state (amorphous state) over a substrate.

It is needless to say that a process under intermediate conditions between oxygen-deficient conditions and oxygen-excess conditions is adjusted by changing the degree of oxygen mixture during sputtering film formation.

In addition, it can be considered that, in a sputtering method, strong energy is imparted to a target by Ar ions; thus, strong strain energy exists in an IGZO film formed. In order to release the strain energy, heat treatment is performed at 200° C. to 600° C., typically, 300° C. to 500° C. Through this heat treatment, rearrangement at the atomic level occurs. Because strain energy which inhibits carrier movement is released by the heat treatment, film formation and heat treatment (including optical annealing) are important. Note that heat treatment at 200° C. to 600° C. does not lead to single crystal growth that is caused by great movement of atoms, unlike heat treatment at higher than 700° C.

At a heating temperature of 700° C. or higher, distinct crystal growth can be observed, and a crystal peak can also be observed by XRD as shown in FIG. 37. On the other hand, under both oxygen-deficient conditions and oxygen-excess conditions, no crystalline peaks can be observed by XRD measurement as shown in FIG. 37, although the reason is not clear, whether this is because crystal components are few or the crystallinity thereof is low, because the size of crystal grains is small, or because another factor is involved.

Further enlarged views of the crystal grains observed in FIGS. 39 and 41 are shown in FIGS. 42 and 43. FIG. 42 is a cross-sectional TEM photograph (magnified 8 million times) of Sample 2 obtained under oxygen-deficient conditions. FIG. 43 is a cross-sectional TEM photograph (magnified 8 million times) of Sample 4 obtained under oxygen-deficient conditions and further subjected to heat treatment. In each of FIGS. 42 and 43, a clear lattice image of crystal grains can be observed, and a single crystal with a three-layer structure can be clearly observed.

Further enlarged views of FIGS. 38 and 40 are shown in FIGS. 44, 45, 46, and 47. FIG. 44 is a cross-sectional TEM photograph (magnified 2 million times) of Sample 1 obtained under oxygen-excess conditions, and FIG. 46 is a photograph magnified 8 million times. FIG. 45 is a cross-sectional TEM photograph (magnified 2 million times) of Sample 3 obtained under oxygen-excess conditions and further subjected to heat treatment, and FIG. 47 is a photograph magnified 8 million times. In none of FIGS. 44, 45, 46, and 47, crystal grains can be seen.

An embodiment of the present invention is a thin film transistor which includes a gate electrode layer, a gate insulating layer over the gate electrode layer, an oxide semiconductor layer over the gate insulating layer, source and drain regions over the oxide semiconductor layer; and source and drain electrode layers over the source and drain regions. There is a peak of an oxygen concentration at an interface between the gate insulating layer and the oxide semiconductor layer, and the oxygen concentration of the gate insulating layer has a concentration gradient. The oxygen concentration is increased toward the interface between the gate insulating layer and the semiconductor layer.

An embodiment of the present invention is a thin film transistor which includes a gate electrode layer, a gate insulating layer over the gate electrode layer, an oxide semiconductor layer over the gate insulating layer, source and drain regions over the oxide semiconductor layer; and source and drain electrode layers over the source and drain regions. There is a peak of an oxygen concentration at an interface between the gate insulating layer and the oxide semiconductor layer, and the oxygen concentrations of the gate insulating layer and the oxide semiconductor layer each have a concentration gradient. The oxygen concentration is increased toward the interface between the gate insulating layer and the semiconductor layer.

In above structure, the oxygen concentration of the oxide semiconductor layer is higher than the oxygen concentrations of the source and drain regions. When the oxide semiconductor layer is an oxygen-excess oxide semiconductor layer and the source and drain region are oxygen-deficient oxide semiconductor layers, the carrier concentrations of the source and drain regions can be higher than the carrier concentration of the oxide semiconductor layer.

It is preferable to use a titanium film for the source electrode layer and the drain electrode layer. For example, a stacked layer of a titanium film, an aluminum film, and a titanium film has low resistance and hillock is hardly generated in the aluminum film.

In a manufacturing method according to an embodiment of the present invention, a gate electrode layer is formed over a substrate; a gate insulating layer is formed over the gate electrode layer; the gate insulating layer is exposed to oxygen radical so as to be reformed; an oxide semiconductor layer is formed over the gate insulating layer reformed; source and drain regions are formed over the oxide semiconductor layer; source and drain electrode layers are formed over the source and drain regions; and the gate insulating layer and the oxide semiconductor layer are formed successively without being exposed to the air.

The gate insulating layer, the semiconductor layer, the source and drain regions, and the source and the drain electrode layers can be formed successively without being exposed to the air. With successive formation, defects due to mixing of impurities in the air to be dust into interface can be suppressed.

The gate insulating layer, the semiconductor layer, the source and drain regions, and the source and drain electrode layers may be formed by a sputtering method.

In this manner, by formation employing a sputtering method, productivity is high and reliability of the interface of a thin film is stabilized. In addition, when the gate insulating layer and the semiconductor layer are formed under an oxygen atmosphere so as to include a large amount of oxygen, degradation of reliability due to deterioration, a shift of characteristics of a thin film transistor toward the normally-on side and the like can be suppressed.

In a manufacturing method of an embodiment of the present invention, a gate electrode layer is formed over a substrate; a gate insulating layer is formed over the gate electrode layer; the gate insulating layer is exposed to oxygen radical so as to be reformed; an oxide semiconductor layer is formed over the gate insulating layer reformed; source and drain regions are formed over the oxide semiconductor layer; the oxide semiconductor layer and the source and drain regions are heated at a temperature of 200° C. to 600° C., inclusive; source and drain electrode layers are formed over the source and drain regions; and the gate insulating layer and the oxide semiconductor layer are formed successively without being exposed to the air.

According to an embodiment of the present invention, a thin film transistor with small photoelectric current, small parasitic capacitance, and high on-off ratio can be obtained, so that a thin film transistor having excellent dynamic characteristics can be manufactured. Therefore, a semiconductor device which includes thin film transistors having excellent electrical characteristics and high reliability can be provided.

BRIEF DESCRIPTION OF THE DRAWINGS

FIGS. 29A and 29B illustrate a semiconductor device of an embodiment of the present invention;

Figure 1A:
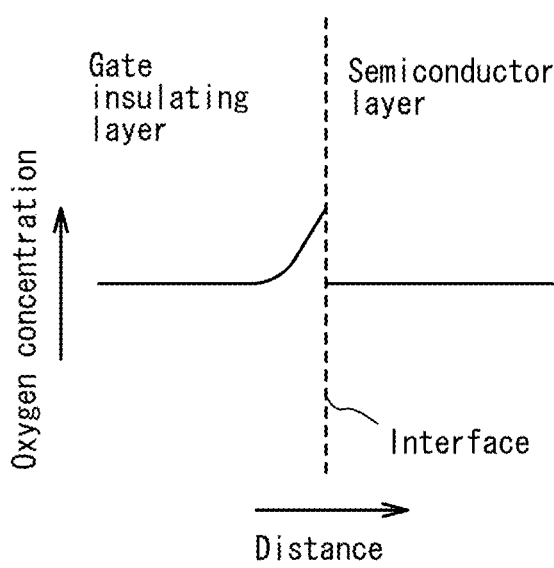
FIGS. 1A and 1B are schematic diagrams of oxygen concentration in the vicinity of the interface between a gate insulating layer and a semiconductor layer before and after heat treatment.
Figure 1B:
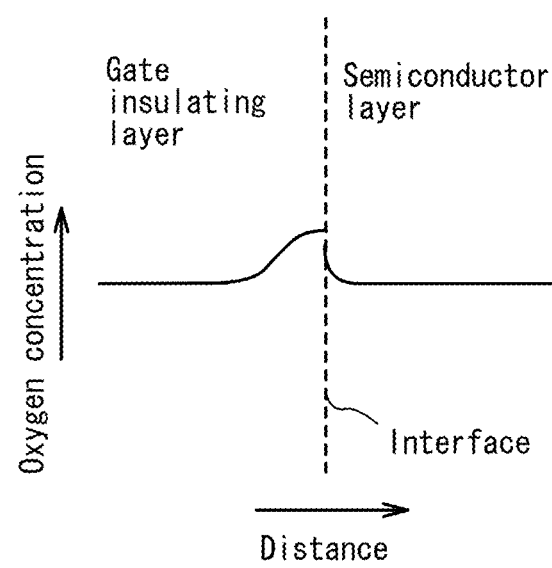
Figure 2A:
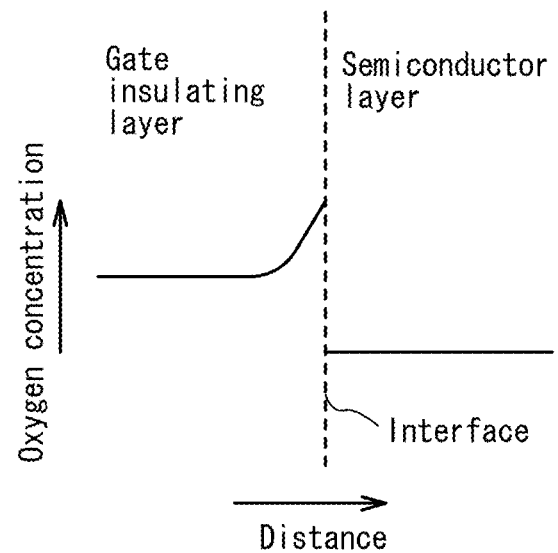
FIGS. 2A and 2B are schematic diagrams of oxygen concentration in the vicinity of the interface between a gate insulating layer which is nitrided and a semiconductor layer.
Figure 2B:
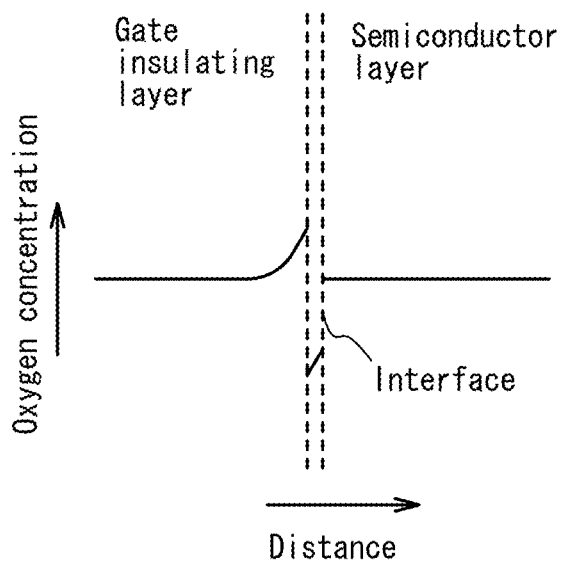
Figure 3:
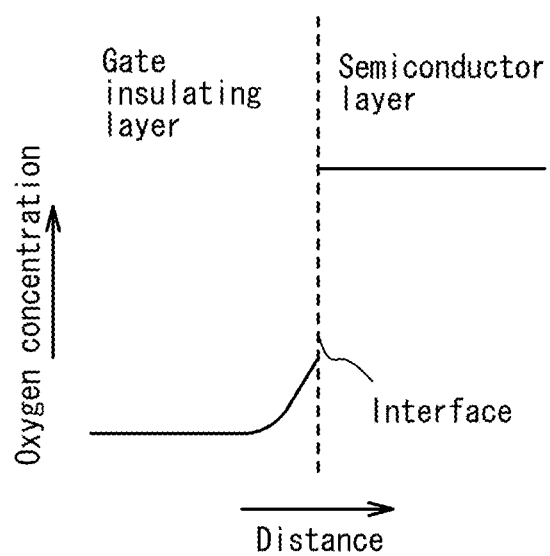
FIG. 3 is a schematic diagram of oxygen concentration in the vicinity of the interface between a gate insulating layer and a semiconductor layer (comparative example)

Embodiments will be described in detail with reference to the accompanying drawings. However, the present invention is not limited to the following description, and various changes and modifications for the modes and details thereof will be apparent to those skilled in the art unless such changes and modifications depart from the spirit and scope of the invention. Therefore, the present invention should not be interpreted as being limited to what is described in the embodiments described below. Identical portions or portions having similar functions are marked by same reference numerals throughout the drawings so as to eliminate repeated explanation.

EMBODIMENT 1

In this embodiment, a thin film transistor and a manufacturing method thereof are described with reference to FIGS. 5A to 5D, FIGS. 6A and 6B, FIGS. 7A to 7G, and FIGS. 8A to 8D.

Figure 5A:
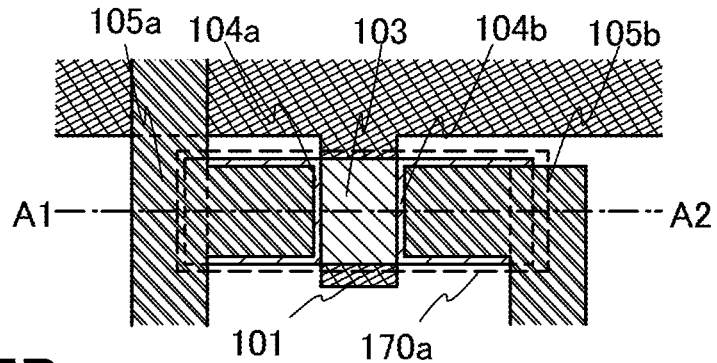
FIGS. 5A to 5D each illustrate a semiconductor device of an embodiment of the present invention.
Figure 5B:
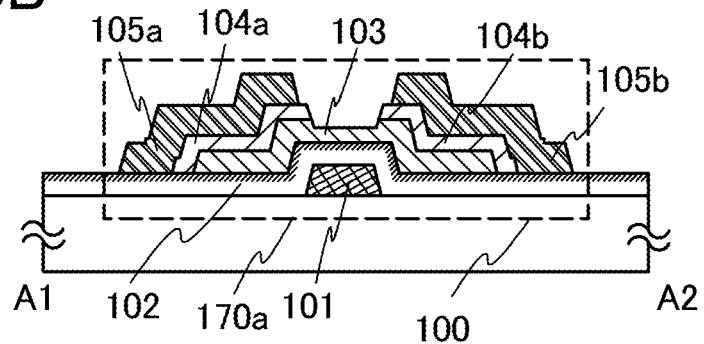
Figure 5C:
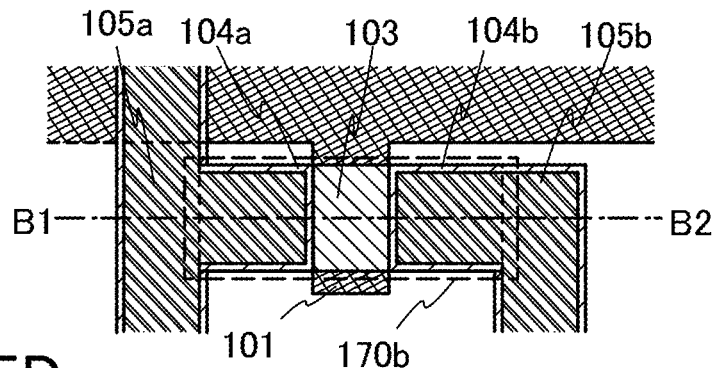
Figure 5D:
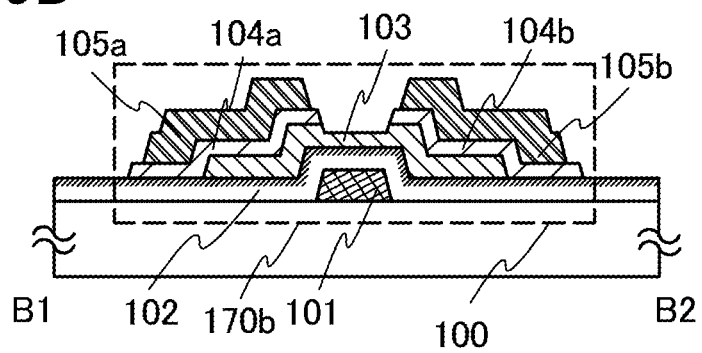
Figure 6A:
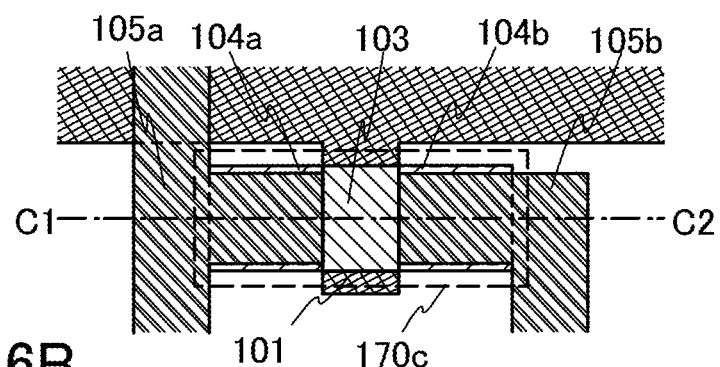
FIGS. 6A and 6B illustrate a semiconductor device of an embodiment of the present invention.
Figure 6B:
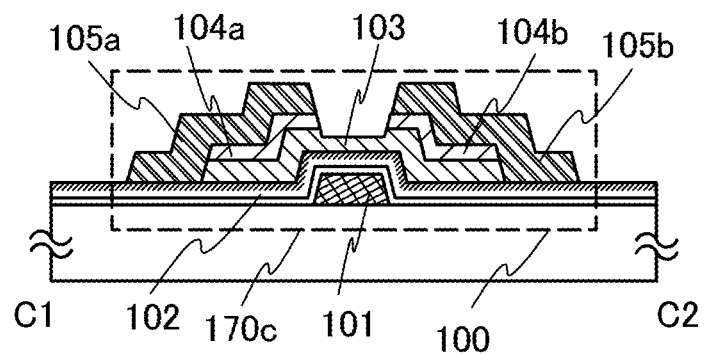

Thin film transistors 170a, 170b, and 170c of this embodiment, each of which has a bottom-gate structure, are described in FIGS. 5A to 5D and FIGS. 6A and 6B. FIG. 5A is a plane view and FIG. 5B is a cross-sectional view taken along a line A1-A2 of FIG. 5A. FIG. 5C is a plane view and FIG. 5D is a cross-sectional view taken along a line B1-B2 of FIG. 5C. FIG. 6A is a plane view and FIG. 6B is a cross-sectional view taken along a line C1-C2 of FIG. 6A.

In FIGS. 5A and 5B, a thin film transistor 170a including a gate electrode layer 101, a gate insulating layer 102, a semiconductor layer 103, source and drain regions 104a and 104b, and source and drain electrode layers 105a and 105b is provided over a substrate 100.

A surface of the gate insulating layer 102 is subjected to oxygen radical treatment. Accordingly, there is a peak of an oxygen concentration at an interface between the gate insulating layer 102 and the semiconductor layer 103, and the oxygen concentration of the gate insulating layer 102 has a concentration gradient. The oxygen concentration is increased toward the interface between the gate insulating layer 102 and the semiconductor layer 103.

In addition, as the semiconductor layer 103, an oxygen-excess oxide semiconductor film including In, Ga, and Zn is used, and the source and drain regions 104a and 104b which are formed using an oxygen-deficient oxide semiconductor layer are formed purposely between the source and drain electrode layers 105a and 105b and the semiconductor layer 103 which is an IGZO semiconductor layer, whereby an ohmic contact is obtained. Further, tungsten, molybdenum, titanium, nickel, or aluminum may be substituted for any one of In, Ga, and Zn included in the semiconductor layer 103 and the source and drain regions 104a and 104b.

As the source and drain regions 104a and 104b, an oxygen-deficient oxide semiconductor film having crystal grains including In, Ga, and Zn is used.

A carrier concentration of IGZO for a channel is set in a range where a thin film transistor is not normally on. Therefore, the IGZO film having the carrier concentration in the range according to an embodiment of the present invention is used as the channel of the semiconductor layer, whereby a thin film transistor with high reliability can be formed.

The source and drain regions may have a stacked-layer structure. In the case where the source and drain regions are formed by stacking, the carrier concentration thereof may be set so as to be increased toward the source and drain electrode layers side. When an impurity element is included in the source and drain regions, the source and drain regions having a high carrier concentration can be formed.

The thin film transistor 170a in FIGS. 5A and 5B is an example of a transistor whose source and drain regions 104a and 104b and whose source and drain electrode layers 105a and 105b are etched using different masks. The shape of the source and drain regions 104a and 104b differs from that of the source and drain electrode layers 105a and 105b.

The thin film transistor 170b in FIGS. 5C and 5D is an example of a transistor whose source and drain regions 104a and 104b and whose source and drain electrode layers 105a and 105b are etched using the same mask. Therefore, the source and drain regions 104a and 104b and the source and drain electrode layers 105a and 105b show the same shape.

Each of the thin film transistor 170a of FIGS. 5A and 5B and the thin film transistor 170b of FIGS. 5C and 5D is an example in which end portions of the source and drain electrode layers 105a and 105b and end portions of the source and drain regions 104a and 104b are not aligned with each other over the semiconductor layer 103, and part of the source and drain regions 104a and 104b is exposed.

On the other hand, the thin film transistor 170c of FIGS. 6A and 6B is an example of a transistor whose semiconductor layer 103 and whose source and drain regions 104a and 104b are etched using the same mask; therefore, end portions the semiconductor layer 103 and the source and drain regions 104a and 104b are aligned with each other. Note that the thin film transistor 170c of FIGS. 6A and 6B is an example in which end portions of the source and drain electrode layers 105a and 105b and end portions of the source and drain regions 104a and 104b are aligned over the semiconductor layer 103.

Figure 15:
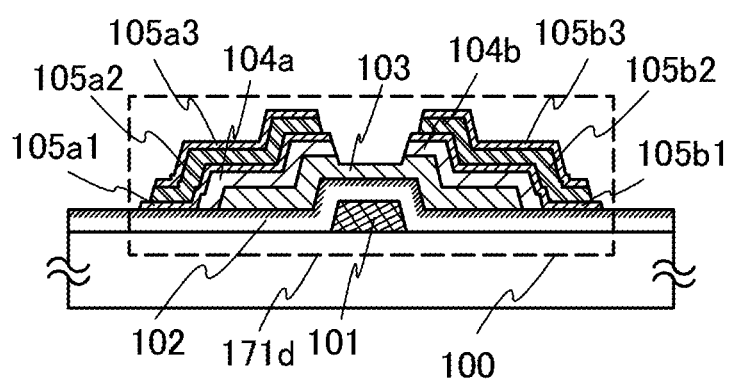
FIG. 15 illustrates a semiconductor device of an embodiment of the present invention.

In addition, a thin film transistor 171d whose source and drain electrode layers have a stacked-layer structure is illustrated in FIG. 15. The thin film transistor 171d includes a stacked layer of source or drain electrode layers 105a1, 105a2 and 105a3, and a stacked layer of source or drain electrode layers 105b1, 105b2, and 105b3. For example, a titanium film can be used for the source and drain electrode layers 105a1 and 105b1; an aluminum film can be used for the source and drain electrode layers 105a2 and 105b2; and a titanium film can be used for the source and drain electrode layers 105a3 and 105b3.

In the case of the thin film transistor 171d, the source and drain electrode layers 105a1 and 105b1 are used as etching stoppers and the source and drain electrode layers 105a2, 105a3, 105b2, and 105b3 are formed by wet etching. With the use of the same mask as that used in the aforementioned wet etching, the source and drain electrode layers 105a1 and 105b1, the source and drain regions 104a and 104b, and the semiconductor layer 103 are formed by dry etching.

Accordingly, end portions of the source or drain electrode layer 105a1 and the source or drain electrode layer 105b1 are aligned with end portions of the source or drain region 104a and the source or drain region 104b, respectively. End portions of the source or drain electrode layers 105a2 and 105a3 and the source or drain electrode layers 105b2 and 105b3 are positioned more inwardly than the end portions of the source and drain electrode layers 105a1 and 105b1, respectively.

As described above, in the case where etching selectivity of the conductive film used for the source and drain electrode layers with respect to the source and drain regions and the semiconductor layer is low in an etching process, a conductive film functioning as an etching stopper may be stacked, and etching may be performed plural times under different etching conditions.

Figure 4A:
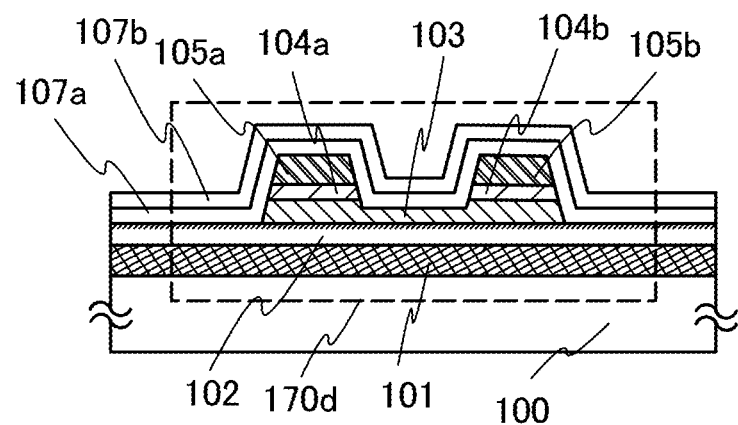
FIGS. 4A and 4B each illustrate a semiconductor device of an embodiment of the present invention.
Figure 4B:
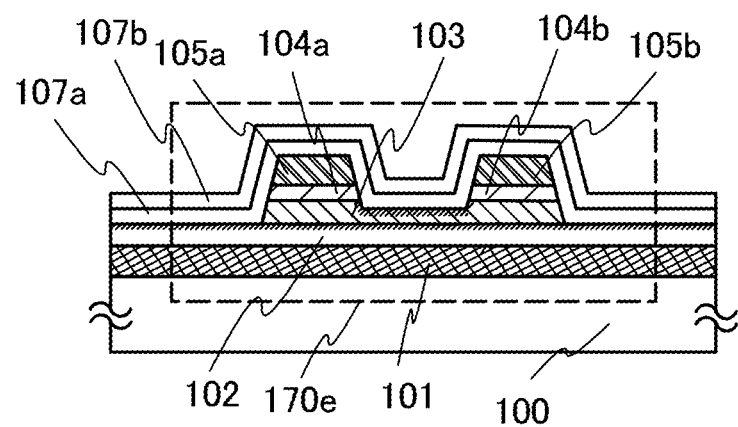

FIGS. 4A and 4B illustrate examples of thin film transistors 170d and 170e, in each of which the semiconductor layer 103, the source and drain regions 104a and 104b and the source and drain electrode layers 105a and 105b are formed over the gate electrode layer 101 so that the gate electrode layer 101 is bigger than the semiconductor layer 103, the source and drain regions 104a and 104b, and the source and drain electrode layers 105a and 105b. In addition, insulating films 107a and 107b are formed as protective films over each of the thin film transistors 170d and 170e.

A method for manufacturing the thin film transistor 170a of FIGS. 5A and 5B is explained with the use of FIGS. 7A to 7G.

Figure 7A:
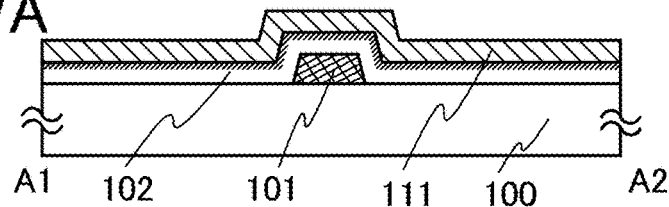
FIGS. 7A to 7G illustrate a method for manufacturing a semiconductor device of an embodiment of the present invention.

The gate electrode layer 101, the gate insulating layer 102, and a semiconductor film 111 are formed over the substrate 100 (see FIG. 7A). As the substrate 100, any of the following substrates can be used: non-alkaline glass substrates made of barium borosilicate glass, aluminoborosilicate glass, aluminosilicate glass, and the like by a fusion method or a float method; ceramic substrates; plastic substrates having heat resistance enough to withstand a process temperature of this manufacturing process; and the like. Alternatively, a metal substrate such as a stainless steel alloy substrate, provided with an insulating film over its surface, may also be used. As the substrate 50, a substrate having a size of 320 mm×400 mm, 370 mm×470 mm, 550 mm×650 mm, 600 mm×720 mm, 680 mm×880 mm, 730 mm×920 mm, 1000 mm×1200 mm, 1100 mm×1250 mm, 1150 mm×1300 mm, 1500 mm×1800 mm, 1900 mm×2200 mm, 2160 mm×2460 mm, 2400 mm×2800 mm, 2850 mm×3050 mm, or the like can be used.

Moreover, an insulating film may be formed as a base film over the substrate 100. The base film may be formed of a single layer or a stacked layer using a silicon oxide film, a silicon nitride film, a silicon oxynitride film, and/or a silicon nitride oxide film employing a sputtering method or the like.

The gate electrode layer 101 is formed using a metal material such as titanium, molybdenum, chromium, tantalum, tungsten, or aluminum, or an alloy material thereof. The gate electrode layer 101 can be formed in such a manner that a conductive film is formed over the substrate 100 by a sputtering method or a vacuum evaporation method; a mask is formed over the conductive film by a photolithography technique or an inkjet method; and the conductive film is etched using the mask. Alternatively, the gate electrode layer 101 can be formed by discharging a conductive nanopaste of silver, gold, copper, or the like by an inkjet method and baking it. Note that, as barrier metal which increases adhesion of the gate electrode layer 101 and prevents diffusion to the substrate and the base film, a nitride film of the above-mentioned metal material may be provided between the substrate 100 and the gate electrode layer 101. Further, the gate electrode layer 101 may have either a single-layer structure or a stacked-layer structure. For example, a stacked layer can be used, in which a molybdenum film and an aluminum film, a molybdenum film and an alloy film of aluminum and neodymium, a titanium film and an aluminum film, or a titanium film, an aluminum film, and a titanium film are stacked from the substrate 100 side.

Note that, since a semiconductor film and a wiring are to be formed over the gate electrode layer 101, it is desired that the gate electrode layer 101 be processed to have tapered end portions in order to prevent disconnection.

The gate insulating layer 102 and the semiconductor film 111 can be formed successively without being exposed to the air. With the successive formation, the respective interfaces of the stacked layers can be formed without being contaminated by atmospheric component or contamination impurities floating in the air.

In an active-matrix display device, electric characteristics of thin film transistors included in a circuit are important and performance of the display device is dependent on the electric characteristics of thin film transistors. Among the electric characteristics of thin film transistors, in particular, a threshold voltage (Vth) is important. When the threshold voltage value is high or is on the minus side even when the field effect mobility is high, it is difficult to control the circuit. In the case of a thin film transistor having a high threshold voltage whose absolute value is high, the thin film transistor at a low driving voltage cannot function as a switch and may possibly be a load. Further, when the threshold voltage value is on the minus side, current tends to flow between the source and drain electrodes even if the gate voltage is 0 V, that is, the transistor tends to be normally on.

In the case of an n-channel thin film transistor, it is preferable that a channel is formed and drain current begins to flow after the positive voltage is applied as a gate voltage. A transistor in which a channel is not formed unless the driving voltage is increased and a transistor in which a channel is formed and drain current flows even in the case of the negative voltage state are unsuitable for a thin film transistor used in a circuit.

Thus, it is preferable that a channel is formed with a positive threshold voltage of a gate voltage which is as close to 0 V as possible in a thin film transistor using an oxide semiconductor film including In, Ga, and Zn.

The threshold voltage value of the thin film transistor is considered to be greatly affected by an interface of the oxide semiconductor layer, that is, an interface between the oxide semiconductor layer and the gate insulating layer.

Thus, by formation of the interface in a clean condition, in addition to improving electric characteristics of the thin film transistor, the manufacturing process can be prevented from being complicated, so that a thin film transistor provided with improved mass productivity and high performance is realized.

In particular, in the case where moisture from the air exists at an interface between the oxide semiconductor layer and the gate insulating layer, problems such as degradation in electric characteristics of the thin film transistor, variation in threshold voltages, and the thin film transistor which tends to be normally on arise. By successive formation of the oxide semiconductor layer and the gate insulating layer, such hydrogen compounds can be prevented from existing at the interface.

In addition a surface of the gate insulating layer 102 is subjected to oxygen radical treatment, whereby the surface of the gate insulating layer 102 is reformed to an oxygen-excess region.

As the oxygen radical treatment on the surface of the gate insulating layer 102, plasma treatment such as reverse sputtering may be performed. The reverse sputtering is a method by which voltage is applied to a substrate side to generate plasma on the substrate side under an argon atmosphere, an oxygen atmosphere or a nitrogen atmosphere, without applying voltage to a target side, so that a surface is reformed. Furthermore, the gate insulating layer is subjected to nitriding treatment; plasma treatment such as reverse sputtering may be performed under a nitrogen atmosphere.

Accordingly, the surface of the gate insulating layer 102 is reformed by oxygen radical and the gate insulating layer 102 and the semiconductor film 111 are successively formed without being exposed to the air by a sputtering method under a reduced pressure, whereby a thin film transistor having high current drive capability in which a favorable interface is included and a leakage current is reduced can be realized.

In addition, the gate insulating layer 102 and the semiconductor film 111 that is an oxide semiconductor film including In, Ga, and Zn are preferably formed under an oxygen atmosphere (or an atmosphere containing oxygen at 90% or more and a rare gas (argon, helium, or the like) at 10% or less).

By the successive film formation by a sputtering method, productivity and reliability of an interface of the thin films can be increased. Further, by forming the gate insulating layer and the semiconductor layer under an oxygen atmosphere so that they include a large amount of oxygen, reduction in reliability due to deterioration and shift of the thin film transistor characteristics toward the normally-on side can be suppressed.

The gate insulating layer 102 can be formed by a sputtering method using a silicon oxide film, a silicon nitride film, a silicon oxynitride film, or a silicon nitride oxide film. The thin film transistor 170c illustrated in FIGS. 6A and 6B is an example in which the gate insulating layer 102 is formed by stacking.

The gate insulating layer 102 can be formed by stacking a silicon nitride film or a silicon nitride oxide film, and a silicon oxide film or a silicon oxynitride film in this order. Note that the gate insulating layer can be formed by stacking not two layers but three layers of a silicon nitride film or a silicon nitride oxide film, a silicon oxide film or a silicon oxynitride film, and a silicon nitride film or a silicon nitride oxide film in this order from the substrate side. Alternatively, the gate insulating layer can be formed of a single layer of a silicon oxide film, a silicon nitride film, a silicon oxynitride film, or a silicon nitride oxide film.

Alternatively, the gate insulating layer 102 may be formed in such a manner that a silicon nitride film is formed over the gate electrode layer 101 by a sputtering method and a silicon oxide film is stacked over the silicon nitride film by a sputtering method.

Here, a silicon oxynitride film means a film that includes more oxygen than nitrogen. Further, a silicon nitride oxide film means a film that includes more nitrogen than oxygen.

Alternatively, the gate insulating layer 102 may be formed using one kind of oxide, nitride, oxynitride, and nitride oxide of aluminum, yttrium, or hafnium; or a compound including at least two or more kinds thereof.

A halogen element such as chlorine or fluorine may be included in the gate insulating layer 102. The concentration of the halogen element in the gate insulating layer 102 may be from $1\times10^{15}$ atoms/cm$^3$ to $1\times10^{20}$ atoms/cm$^3$ inclusive at the concentration peak.

In this embodiment, in order to further reduce hydrogen in the gate insulating layer 102, the gate insulating layer 102 is formed by sputtering using a target of single crystal silicon, an argon gas, and an oxygen gas. The hydrogen in the gate insulating layer 102 is diffused and reacts with excessive oxygen in the semiconductor film 111 to become a $H_2O$ component, which is important to prevent the channel from becoming i-type. It is also important that moisture is prevented from adhering to the interface between the gate insulating layer 102 and the semiconductor film 111 by successive formation. Accordingly, it is preferable that vacuum evacuation is performed on the inside of a chamber with a cryopump or the like, and then sputtering is performed in ultra-high-vacuum region, that is a so-called UHV region, at an ultimate pressure of $1\times10^{-7}$ to $1\times10^{-10}$ Torr (approximately $1\times10^{-5}$ Pa to $1\times10^{-8}$ Pa, inclusive). Further, when the gate insulating layer 102 and the semiconductor film 111 are stacked successively so that the interface thereof is not exposed to the air, the surface of the gate insulating layer 102 is subjected to oxygen radical treatment and the surface of the gate insulating layer 102 becomes an oxygen-excess region, which is effective in the case where a supply source of oxygen for reforming the interface of the semiconductor film 111 is formed in a later step of heat treatment for improving reliability.

In addition, when the oxygen-excess region is provided by performing oxygen radical treatment on the gate insulating layer 102, the oxygen concentration of the surface of the semiconductor film 111 is high as compared with that of the inside of the gate insulating layer 102. Moreover, the oxygen concentration at the interface between the gate insulating layer 102 and the semiconductor film 111 is high in the case where oxygen radical treatment is performed, as compared with the case where oxygen radical treatment is not performed.

If the gate insulating layer 102 is subjected to oxygen radical treatment, the semiconductor film 111 is stacked, and then heat treatment is performed, the oxygen concentration of the semiconductor film 111 on the gate insulating layer 102 side becomes high.

The semiconductor film 111 is formed using an oxide semiconductor film including In, Ga, and Zn. For example, the semiconductor film 111 may be formed using an oxide semiconductor film including In, Ga, and Zn, whose thickness is 50 nm. As a specific example, the semiconductor film 111 can be formed using an oxide semiconductor target including In, Ga, and Zn with a size of 8-inch in diameter in the following conditions: the distance between the substrate and the target is 170 mm, the pressure is 0.4 Pa, and the direct current (DC) power source is 0.5 kW under an argon atmosphere or an oxygen atmosphere. Further, a pulsed direct current (DC) power source is preferable because dust can be reduced and a thickness distribution is uniform.

The semiconductor film 111 can be formed under a rare gas atmosphere or an oxygen atmosphere using the oxide semiconductor target including In, Ga, and Zn. Here, in order that as a large amount of oxygen as possible is included in the IGZO film as much as possible, sputtering is performed by a pulsed DC sputtering method under an atmosphere including only oxygen or an atmosphere including oxygen at 90% or more and argon at 10% or less with the use of an oxide semiconductor including In, Ga, and Zn as a target, whereby the IGZO film including excessive oxygen is formed.

In this manner, by successive formation of the gate insulating layer 102 including excessive oxygen and the semiconductor film 111 including excessive oxygen without being exposed to the air, a state at the interface can be stabilized since both the films are films including excessive oxygen and thus reliability of the TFT can be improved. If the substrate is exposed to the air before deposition of the IGZO film, moisture or the like is attached and the interface state is adversely affected, which may cause phenomena such as variation in threshold voltage, deterioration in electric properties, and a normally-on TFT. Moisture is a hydrogen compound. When the films are successively deposited without being exposed to the air, the hydrogen compound can be prevented from existing at the interface. Therefore, by successive deposition, variation in threshold voltage can be reduced, deterioration in electric properties can be prevented, or shift of the TFT characteristics to the normally-on side can be reduced, or desirably, the shift of the TFT characteristics can be prevented.

Figure 7B:
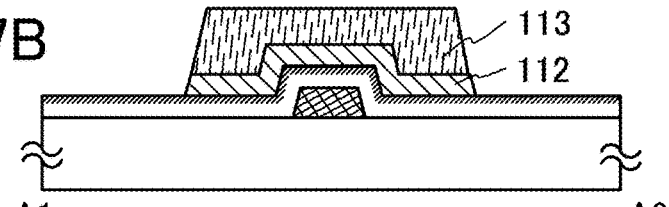

Next, with the use of a mask 113, the semiconductor film 111 is processed by etching to form a semiconductor layer 112 (see FIG. 7B). The semiconductor layer 112 can be formed by etching the semiconductor film 111 with the use of the mask 113 which is formed by a photolithography technique or a droplet discharge method.

When end portions of the semiconductor layer 112 are etched so as to have a tapered shape, disconnection of a wiring due to a step shape can be prevented.

Figure 7C:
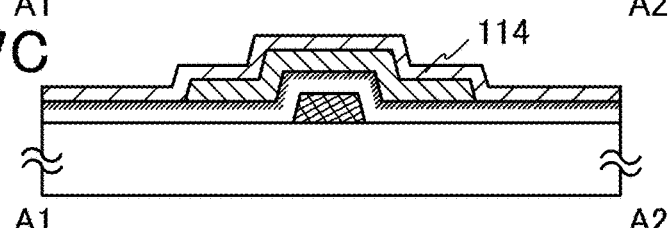
Figure 7D:
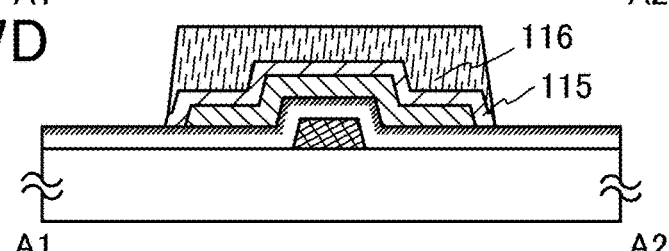

Next, a semiconductor film 114 that is an oxygen-deficient oxide semiconductor film including In, Ga, and Zn is formed over the gate insulating layer 102 and the semiconductor layer 112 (see FIG. 7C). A mask 116 is formed over the semiconductor film 114. The mask 116 is formed by a photolithography technique or an ink-jet method. The semiconductor film 114 is processed by etching with the use of the mask 116 to form a semiconductor film 115 (see FIG. 7D). The semiconductor film 115 may be formed so as to have a thickness of 2 nm to 100 nm (preferably, 20 nm to 50 nm). The semiconductor film 114 is formed under a rare gas (preferably, argon) atmosphere.

In addition, organic acid such as citric acid or oxalic acid can be used as an etchant for etching of the IGZO semiconductor films such as the semiconductor film 111 and the semiconductor film 115. For example, the semiconductor film 111 with a thickness of 50 nm can be processed by etching with the use of ITO07N (manufactured by Kanto Chemical Co., Inc.) for 150 seconds.

Figure 7E:
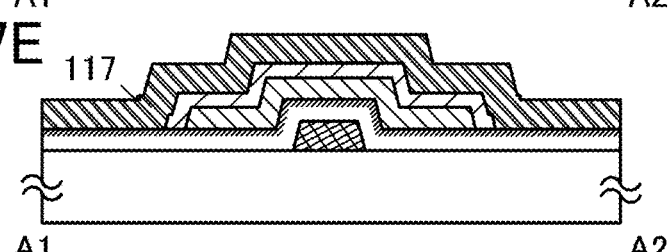

A conductive film 117 is formed over the semiconductor film 115 (see FIG. 7E).

The conductive film 117 is preferably formed of a single layer or a stacked layer using aluminum, copper, and/or an aluminum alloy to which an element for improving heat resistance property or an element for preventing a hillock such as silicon, titanium, neodymium, scandium, or molybdenum, is added. Alternatively, the conductive film 117 may have a stacked-layer structure where a film on the side in contact with the semiconductor film having n-type conductivity is formed of titanium, tantalum, molybdenum, tungsten, or nitride of any of these elements and an aluminum film or an aluminum alloy film is formed thereover. Further alternatively, top and bottom surfaces of aluminum or an aluminum alloy may be each covered with titanium, tantalum, molybdenum, tungsten, or nitride thereof to form a stacked-layer structure. Here, as the conductive film 117, a stacked-layer conductive film of a titanium film, an aluminum film, and a titanium film is used.

A stacked-layer conductive film of a titanium film, an aluminum film, and a titanium film has low resistance and a hillock is hardly generated in the aluminum film.

The conductive film 117 is formed by a sputtering method or a vacuum evaporation method. Alternatively, the conductive film 117 may be formed by discharging a conductive nanopaste of silver, gold, copper, or the like by a screen printing method, an ink-jet method, or the like and baking it.

Figure 7F:
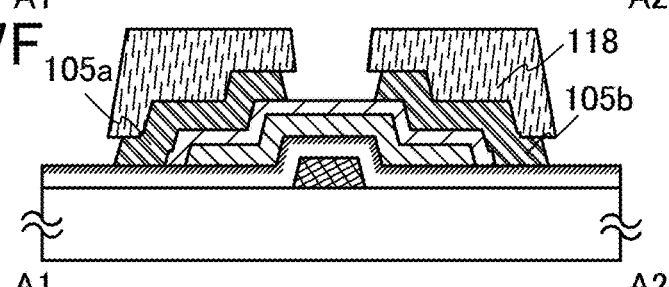
Figure 7G:
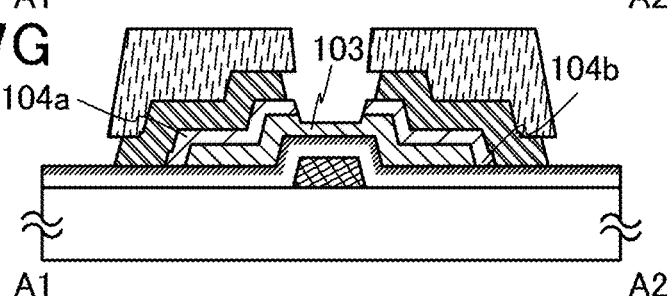

Next, a mask 118 is formed over the conductive film 117. The conductive film 117 is etched using the mask 118 and separated to form the source and drain electrode layers 105a and 105b (see FIG. 7F). When the conductive film 117 is etched by wet etching, the conductive film 117 is etched isotropically as illustrated in FIG. 7F of this embodiment. Thus, end portions of the mask 118 and end portions of the source and drain electrode layers 105a and 105b are not aligned, and the end portions of the source and drain electrode layers 105a and 105b are positioned more inwardly. Next, the semiconductor film 115 having n-type conductivity is etched using the mask 118 to form the source and drain regions 104a and 104b (see FIG. 7G). Although it depends on etching conditions, part of an exposed region of the semiconductor layer 112 is also etched in the etching step of the semiconductor film 115 to form the semiconductor layer 103. Thus, a channel region of the semiconductor layer 103 between the source and drain regions 104a and 104b is a thin region as illustrated in FIG. 7G. The thickness of the thin region of the semiconductor layer 103 that is an IGZO semiconductor layer is 2 nm to 200 nm inclusive, preferably 20 nm to 150 nm inclusive.

In addition, the semiconductor layer 103 may be subjected to oxygen radical treatment in a similar manner to the gate insulating layer 102. By performing oxygen radical treatment on the exposed part which is the channel formation region of the semiconductor layer 103, the surface of the semiconductor layer 103 can be change to an oxygen-excess region.

In FIG. 4B, the thin film transistor 170e is illustrated, in which a channel formation region of the semiconductor layer 103 is subjected to oxygen radical treatment. In the thin film transistor 170e, an exposed part of the semiconductor layer that is the channel formation region is reformed to an oxygen-excess region by oxygen radical treatment.

When the surface of the semiconductor layer is an oxygen-excess region, hydrogen can be prevented from mixing to the semiconductor layer. In addition, a back channel becomes an oxygen-deficient region, which prevents conduction between the source and drain; therefore, off current can be reduced. In this manner, the back channel portion of the semiconductor layer can also be an oxygen-excess region; therefore, in a similar manner to oxygen radical treatment on the gate insulating layer, oxygen radical treatment on the back channel portion of the semiconductor layer is effective.

The end portions of the source and drain electrode layers 105a and 105b are not aligned with the end portions of the source and drain regions 104a and 104b. The end portions of the source and drain regions 104a and 104b are formed on outer side of the end portions of the source and drain electrode layers 105a and 105b.

After that, the mask 118 is removed. Through the above process, the thin film transistor 170a can be formed.

Next, a manufacturing process of the thin film transistor 170b illustrated in FIGS. 5C and 5D is illustrated in FIGS. 8A to 8D.

Figure 8A:
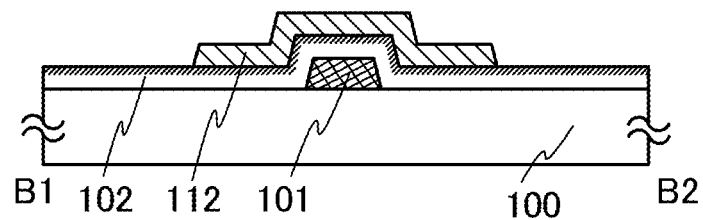
FIGS. 8A to 8D illustrate a method for manufacturing a semiconductor device of an embodiment of the present invention.
Figure 8B:
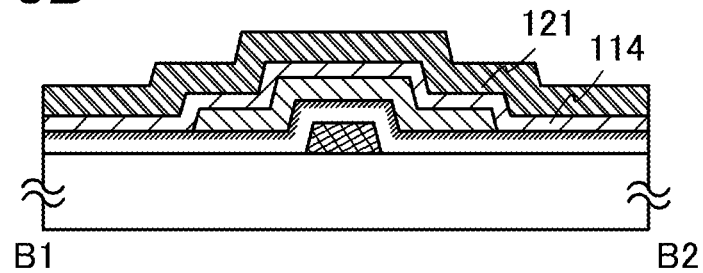
Figure 8C:
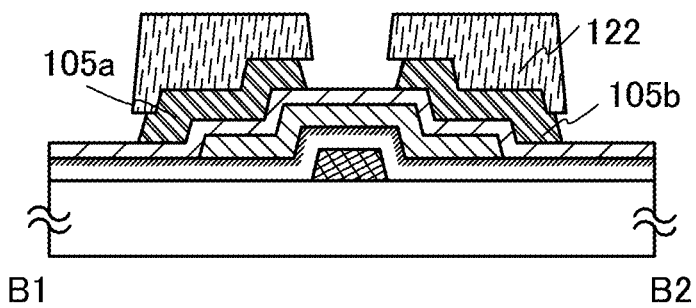

FIG. 8A illustrates a state in which the mask 113 in the step of FIG. 7B is removed. The semiconductor film 114 and a conductive film 121 are stacked in this order over the semiconductor layer 112 (see FIG. 8B). In this case, the semiconductor film 114 and the conductive film 121 can be formed successively by a sputtering method without being exposed to the air.

A mask 122 is formed over the semiconductor film 114 and the conductive film 121. Then, with the use of the mask 122, the conductive film 121 is processed by wet etching to form the source and drain electrode layers 105a and 105b (see FIG. 8C).

Figure 8D:
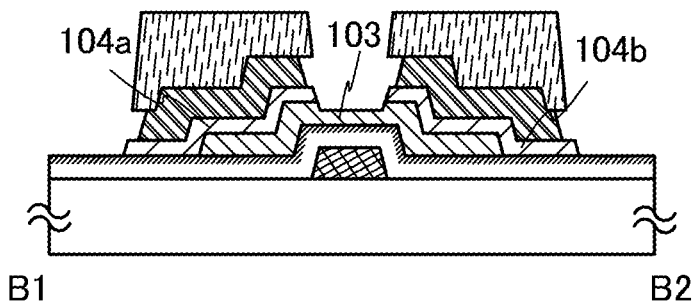

Next, the semiconductor film 114 is processed by dry etching to form the source and drain regions 104a and 104b (see FIG. 8D). In this step, part of the semiconductor layer 112 is also etched, thereby forming the semiconductor layer 103. As illustrated in FIGS. 8A to 8D, when the same mask is used in formation of the source and drain regions 104a and 104b and formation of the source and drain electrode layers 105a and 105b, the number of masks can be reduced; therefore, simplification of the process and cost reduction can be achieved.

An insulating film may be formed as a protective film over each of the thin film transistors 170a, 170b, and 170c in a similar manner to the thin film transistors 170d and 170e. The protective film can be formed in a similar manner to the gate insulating layer. Note that the protective film is provided to prevent entry of a contaminant impurity such as an organic substance, a metal substance, or moisture floating in the air and is preferably a dense film. For example, a stacked layer of an oxide film (a silicon oxide film, a silicon oxynitride film, an aluminum oxide film, or an aluminum oxynitride film) and a nitride film (a silicon nitride film, a silicon nitride oxide film, an aluminum nitride film, or an aluminum nitride oxide film) may be formed as the protective film over the each of the thin film transistors 170a, 170b, 170c, 170d, and 170e. A silicon oxide film may be formed using a silicon target under a nitrogen and argon atmosphere by a DC sputtering method. An aluminum nitride film and an aluminum oxynitride film may be formed using a target of aluminum nitride by an RF sputtering method. An aluminum oxide film may be formed using a target of aluminum oxide by an RF sputtering method. In addition, before formation of the protective film, vacuum baking may be performed.

In addition, after formation of the oxide semiconductor films such as the semiconductor layer 103 and the source and drain regions 104a and 104b, heating treatment is preferably performed thereon. Heating treatment may be performed in any step after the film formation; it can be performed right after formation of the semiconductor layer 103 and the source and drain regions 104a and 104b, after formation of the conductive film 117, after formation of the protective film, or the like. In addition, heating treatment may be combined with another heat treatment. A heating temperature may be set to 200° C. to 600° C. inclusive, preferably 300° C. to 500° C. inclusive. In the case where the semiconductor layer 103 and the source and drain regions 104a and 104b are successively formed as in FIGS. 6A and 6B, heating treatment may be performed after the semiconductor layer 103 and the source and drain regions 104a and 104b are stacked. The heating treatment may be performed plural times so that heat treatment of the semiconductor layer 103 and heat treatment of the source and drain regions 104a and 104b are performed in different steps.

The end portions of the source and drain electrode layers 105a and 105b are not aligned with the end portions of the source and drain regions 104a and 104b, whereby the distance between the end portions of the source and drain electrode layers 105a and 105b becomes longer. Therefore, generation of a leakage current and short circuit between the source and drain electrode layers 105a and 105b can be prevented. Accordingly, a thin film transistor with high reliability and high withstand voltage can be manufactured.

Alternatively, like the thin film transistor 170c of FIGS. 6A and 6B, a structure in which the end portions of the source and drain regions 104a and 104b and the end portions of the source and drain electrode layers 105a and 105b are aligned with each other may be formed. Etching for forming the source and drain electrode layers 105a and 105b and etching for forming the source and drain regions 104a and 104b are dry etching, whereby a structure of the thin film transistor 170c of FIGS. 6A and 6B can be obtained. Alternatively, a structure of the thin film transistor 170c of FIGS. 6A and 6B can be formed by forming the source and drain regions 104a and 104b by etching the semiconductor film 115 having n-type conductivity with use of the source and drain electrode layers 105a and 105b as a mask.

When a stacked-layer structure without source and drain regions (an oxygen-deficient oxide semiconductor layer including In, Ga, and Zn) is employed, in which a gate electrode layer, a gate insulating layer, a semiconductor layer (an oxygen-excess oxide semiconductor layer including In, Ga, and Zn) and source and drain electrode layers are stacked, a distance between the gate electrode layer and the source and drain electrode layers is small and therefore, parasitic capacitance generated therebetween is increased. In addition, this increase in the parasitic capacitance becomes more significant when the semiconductor layer is thin. In this embodiment, a thin film transistor having a stacked-layer structure with source and drain regions, in which a gate electrode layer, a gate insulating layer, a semiconductor layer, source and drain regions, and source and drain electrode layers are stacked, is used; therefore, parasitic capacitance can be suppressed even when the semiconductor layer is a thin film.

According to this embodiment, a thin film transistor with small photoelectric current, small parasitic capacitance, and a high on-off ratio can be obtained, so that a thin film transistor having excellent dynamic characteristics can be manufactured. Therefore, a semiconductor device including a thin film transistor with favorable electric properties and high reliability can be provided.

EMBODIMENT 2

In this embodiment, an example of a thin film transistor having a multi-gate structure will be described. Accordingly, except the gate structure, the thin film transistor can be formed in a manner similar to Embodiment 1, and repetitive description of the same portions as or portions having functions similar to those in Embodiment 1 and manufacturing steps will be omitted.

In this embodiment, a thin film transistor included in a semiconductor device will be described with reference to FIGS. 9A and 9B, FIGS. 10A and 10B, and FIGS. 11A and 11B.

Figure 9A:
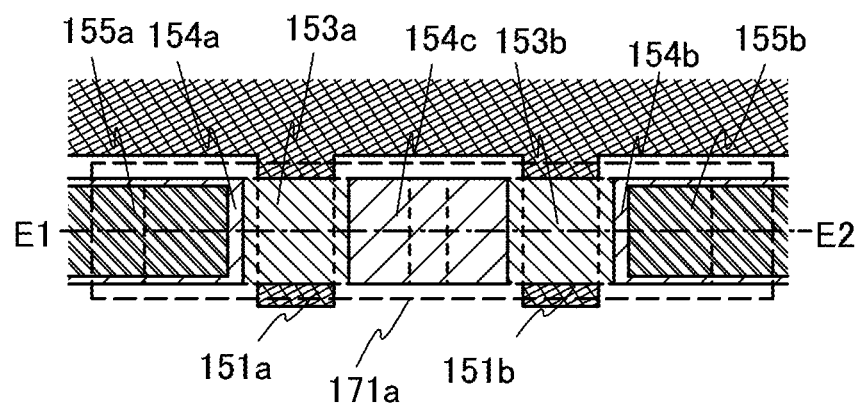
FIGS. 9A and 9B illustrate a semiconductor device of an embodiment of the present invention.
Figure 9B:
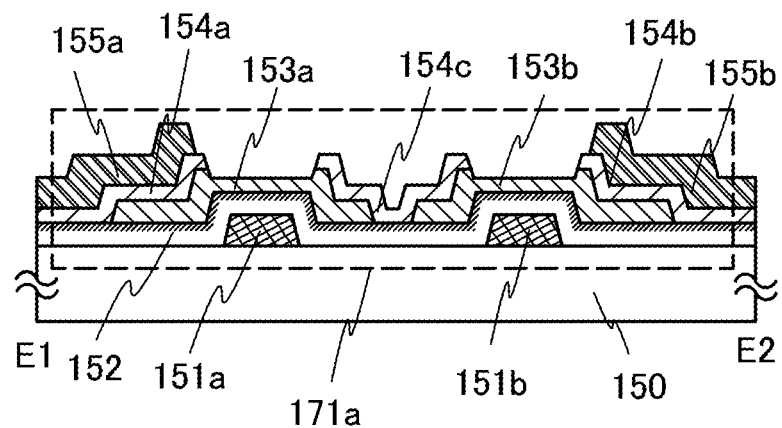

FIG. 9A is a plan view of a thin film transistor 171a and FIG. 9B corresponds to a cross-sectional view of the thin film transistor 171a taken along a line E1-E2 of FIG. 9A.

As illustrated in FIGS. 9A and 9B, the thin film transistor 171a having a multi-gate structure, which includes gate electrode layers 151a and 151b, a gate insulating layer 152, semiconductor layers 153a and 153b, source and drain regions 154a, 154b, and 154c, and source and drain electrode layers 155a and 155b, is provided over a substrate 150.

The semiconductor layers 153a and 153b are oxygen-excess oxide semiconductor layers including In, Ga, and Zn, and the source and drain regions 154a, 154b, and 154c are oxygen-deficient oxide semiconductor layers including In, Ga, and Zn. The source and drain regions 154a, 154b, and 154c have a higher carrier concentration than the semiconductor layers 153a and 153b.

The gate insulating layer 152 having an oxygen-excess region and the semiconductor layers 153a and 153b which are oxygen-excess oxide semiconductor layers are compatible with each other and can provide favorable interface characteristics.

After the gate insulating layer 152 is formed, a surface of the gate insulating layer 152 is subjected to oxygen radical treatment to form an oxygen-excess region. The gate insulating layer 152 and the semiconductor layers 153a and 153b are formed successively.

The source and drain regions 154a, 154b, and 154c which are oxygen-deficient oxide semiconductor layers include crystal grains with a size of 1 nm to 10 nm and have a higher carrier concentration than the semiconductor layers 153a and 153b.

The semiconductor layers 153a and 153b are electrically connected to each other with the source or drain region 154c interposed therebetween. In addition, the semiconductor layer 153a is electrically connected to the source or drain electrode layer 155a with the source or drain region 154a interposed therebetween and the semiconductor layer 153b is electrically connected to the source or drain electrode layer 155b with the source or drain region 154b interposed therebetween.

Figure 10A:
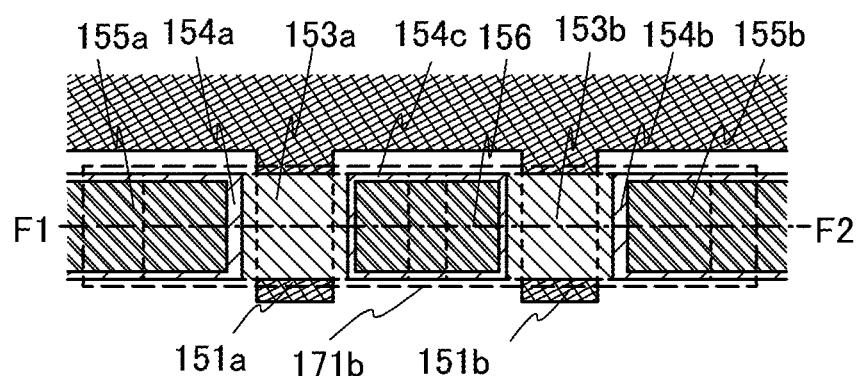
FIGS. 10A and 10B illustrate a semiconductor device of an embodiment of the present invention.
Figure 10B:
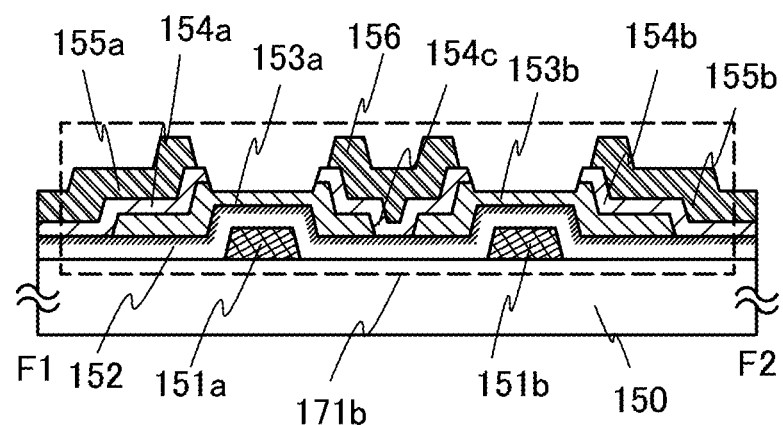

FIGS. 10A and 10B illustrate a thin film transistor 171b having a different multi-gate structure. FIG. 10A is a plan view of the thin film transistor 171b and FIG. 10B corresponds to a cross-sectional view of the thin film transistor 171b taken along a line F1-F2 of FIG. 10A. In the thin film transistor 171b of FIGS. 10A and 10B, a wiring layer 156 is formed over the source or drain region 154c in the same step as the source and drain electrode layers 155a and 155b, and the semiconductor layers 153a and 153b are electrically connected to each other with the source or drain region 154c and the wiring layer 156 interposed therebetween.

Figure 11A:
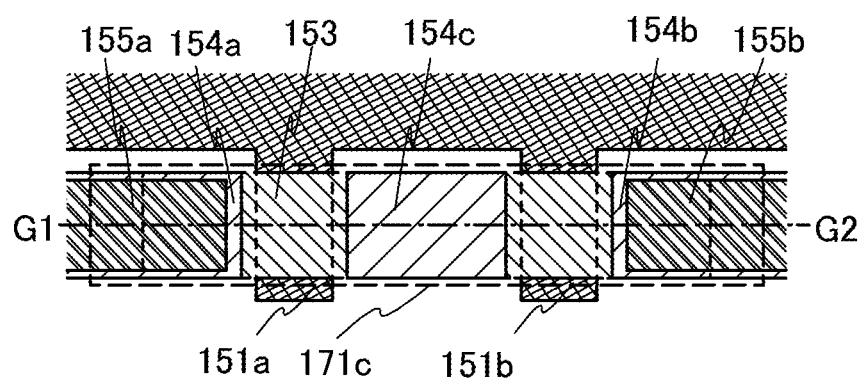
FIGS. 11A and 11B illustrate a semiconductor device of the present invention.
Figure 11B:
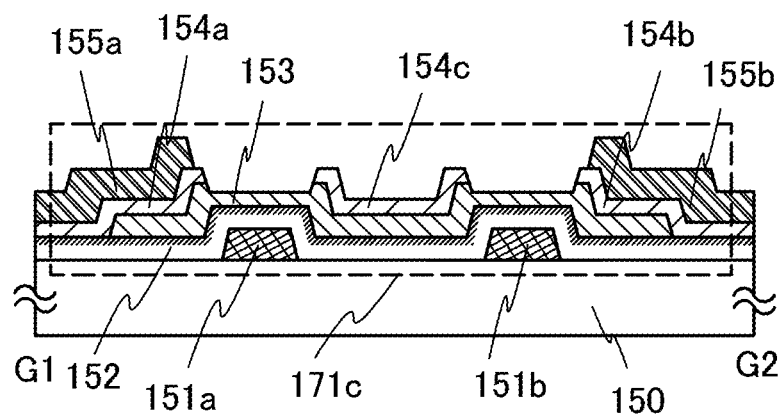

FIGS. 11A and 11B illustrate a thin film transistor 171c having a different multi-gate structure. FIG. 11A is a plan view of the thin film transistor 171c and FIG. 11B corresponds to a cross-sectional view of the thin film transistor 171c taken along a line G1-G2 of FIG. 11A. In the thin film transistor 171c of FIGS. 11A and 11B, a semiconductor layer 153 which is a continuous layer is formed instead of the semiconductor layers 153a and 153b. The semiconductor layer 153 is provided so as to extend over the gate electrode layers 151a and 151b with the gate insulating layer 152 interposed therebetween.

As described above, in a thin film transistor having a multi-gate structure, a semiconductor layer may be provided as a continuous layer over each gate electrode layer or a plurality of semiconductor layers which are electrically connected to each other with a source or drain region, a wiring layer, or the like interposed therebetween may be provided.

A thin film transistor having a multi-gate structure has small off-current, and a semiconductor device including such a thin film transistor can have excellent electrical characteristics and high reliability.

In this embodiment, a double-gate structure in which two gate electrode layers are provided is described as an example of a multi-gate structure; however, the present invention can also be applied to a triple-gate structure or the like in which a larger number of gate electrode layers are provided.

The thin film transistor described in this embodiment has a structure in which the gate electrode layer, the gate insulating layer, the semiconductor layer (an oxygen-excess oxide semiconductor layer), the source and drain regions (oxygen-deficient oxide semiconductor layers), and the source and drain electrode layers are stacked. By using oxygen-deficient oxide semiconductor layers including crystal grains and having a high carrier concentration as the source and drain regions, the parasitic capacitance can be reduced while the thickness of the semiconductor layer is kept small. Note that the parasitic capacitance is sufficiently suppressed even when the source and drain regions have a small thickness, because the thickness of the source and drain regions is sufficient with respect to that of the gate insulating layer.

According to this embodiment, a thin film transistor with small photoelectric current, small parasitic capacitance, and high on-off ratio can be obtained, so that a thin film transistor having excellent dynamic characteristics can be manufactured. Therefore, a semiconductor device which includes thin film transistors having excellent electrical characteristics and high reliability can be provided.

This embodiment can be combined with any of the other embodiments as appropriate.

EMBODIMENT 3

This embodiment describes an example of a thin film transistor that is an embodiment of the present invention, in which source and drain regions are formed by stacking. Therefore, the other parts can be made in a similar manner to Embodiment 1 or 2, and the same parts or parts having similar functions, or steps for making such parts are not repeatedly described.

Figure 12:
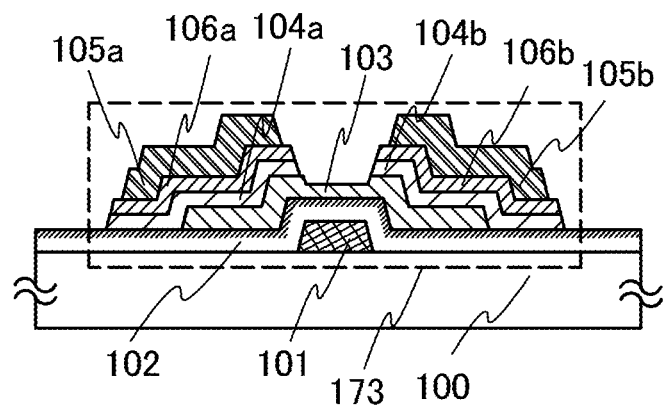
FIG. 12 describes a semiconductor device of the present invention.

In this embodiment, a thin film transistor 173 used for a semiconductor device is explained using FIG. 12.

As illustrated in FIG. 12, the thin film transistor 173 is provided over a substrate 100, in which a gate electrode layer 101, a semiconductor layer 103, source and drain regions 106a and 106b which are second source and drain regions, source and drain regions 104a and 104b which are first source and drain regions, and source and drain electrode layers 105a and 105b are formed.

In the thin film transistor 173 of this embodiment, the source or drain region 106a and the source or drain region 106b are provided as the second source and drain regions between the source or drain region 104a and the source or drain electrode layer 105a and between the source or drain region 104b and the source or drain electrode layer 105b, respectively.

The semiconductor layer 103 is an oxygen-excess oxide semiconductor layer including In, Ga, and Zn; the source and drain regions 104a, 104b, 106a, and 106b are oxygen-deficient oxide semiconductor layers including In, Ga, and Zn.

The source and drain regions 106a and 106b between the source and drain regions 104a and 104b, and the source and drain electrode layers 105a and 105b include an impurity element.

As the impurity element included in the source and drain regions 106a and 106b, for example, indium, gallium, zinc, magnesium, aluminum, titanium, iron, tin, calcium, scandium, yttrium, zirconium, hafnium, boron, thallium, germanium, lead, or the like can be used. Such an impurity element (for example, magnesium, aluminum, titanium, or the like)

is included in the source and drain regions, which has an effect of blocking oxygen and the like. The oxygen concentration of the semiconductor layer can be kept in an optimum range by heating treatment or the like after formation of the semiconductor layer. In this embodiment, oxygen-deficient oxide semiconductor layers including In, Ga, and Zn are used for the source and drain regions 106a and 106b.

When oxygen-deficient oxide semiconductor layers including titanium are provided as the source and drain regions 106a and 106b, aluminum films are formed as the source and drain electrode layers over the source and drain regions 106a and 106b directly, and then titanium films can be formed over the aluminum films.

The thin film transistor including a plurality of the source and drain regions of an embodiment of the present invention can operate at high speed. A semiconductor device including such a thin film transistor can have excellent electric characteristics and high reliability.

This embodiment can be combined with any of other embodiments as appropriate.

EMBODIMENT 4

In this embodiment, an example will be described below, in which part of the shape and manufacturing method of a thin film transistor are different from those in Embodiment 1. Accordingly, except the part of the shape and manufacturing method, the thin film transistor can be formed in a manner similar to Embodiment 1, and repetitive description of the same portions as or portions having functions similar to those in Embodiment 1 and manufacturing steps will be omitted.

Figure 13A:
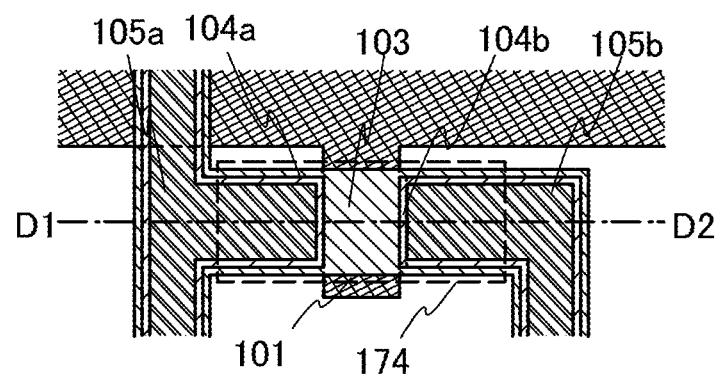
FIGS. 13A and 13B illustrate a semiconductor device of an embodiment of the present invention.

In this embodiment, a thin film transistor 174 included in a display device and a manufacturing process thereof will be described with reference to FIGS. 13A and 13B and FIGS. 14A to 14D. FIG. 13A is a plan view of the thin film transistor 174, and FIG. 13B and FIGS. 14A to 14D correspond to cross-sectional views of the thin film transistor and manufacturing process thereof taken along a line D1-D2 of FIG. 13A.

Figure 13B:
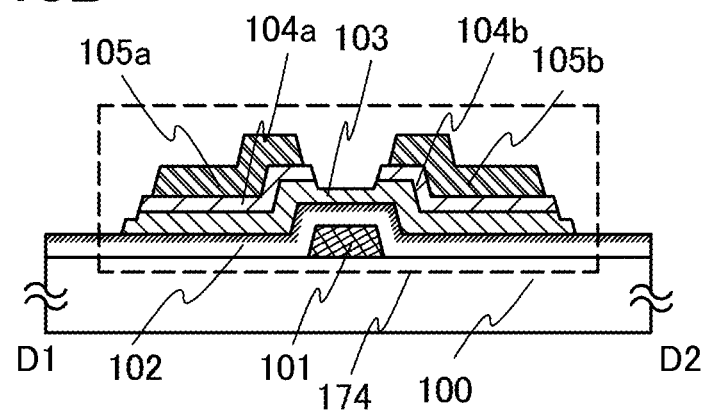

As illustrated in FIGS. 13A and 13B, the thin film transistor 174 including a gate electrode layer 101, a semiconductor layer 103, source and drain regions 104a and 104b, and source and drain electrode layers 105a and 105b is provided over a substrate 100.

The semiconductor layer 103 is an oxygen-excess oxide semiconductor layer containing In, Ga, and Zn, and the source and drain regions 104a and 104b are oxygen-deficient oxide semiconductor layers containing In, Ga, and Zn. The source and drain regions 104a and 104b have a higher carrier concentration than the semiconductor layer 103.

After the gate insulating layer 102 is formed, a surface of the gate insulating layer 102 is subjected to oxygen radical treatment to form an oxygen-excess region. The gate insulating layer 102 and the semiconductor layer 103 are formed successively.

The gate insulating layer 102 having an oxygen-excess region and the semiconductor layer 103 which is an oxygen-excess oxide semiconductor layer are compatible with each other and can provide favorable interface characteristics.

The source and drain regions 104a and 104b which are oxygen-deficient oxide semiconductor layers include crystal grains with a size of 1 nm to 10 nm and have a higher carrier concentration than the semiconductor layer 103.

The semiconductor layer 103 is electrically connected to the source or drain electrode layer 105a with the source or drain region 104a interposed therebetween and electrically connected to the source or drain electrode layer 105b with the source or drain region 104b interposed therebetween.

A manufacturing process of the thin film transistor 174 is described with reference to FIGS. 14A to 14D. The gate electrode layer 101 is formed over the substrate 100. Next, the gate insulating layer 102 is formed over the gate electrode layer 101 and a surface of the gate insulating layer 102 is then subjected to oxygen radical treatment. After that, a semiconductor film 131 which is an oxygen-excess oxide semiconductor film including In, Ga, and Zn, a semiconductor film 132 which is an oxygen-deficient oxide semiconductor film including In, Ga, and Zn, and a conductive film 133 are sequentially formed (see FIG. 14A).

The gate insulating layer 102, the semiconductor film 131 which is an oxygen-excess oxide semiconductor film including In, Ga, and Zn, the semiconductor film 132 which is an oxygen-deficient oxide semiconductor film including In, Ga, and Zn, and the conductive film 133 can be formed successively without being exposed to the air. By successive formation without exposure to air, each interface between the staked layers can be formed without being contaminated by atmospheric constituents or contaminating impurities floating in the atmosphere; thus, variation of thin film transistor characteristics can be reduced.

In this embodiment, an example in which light exposure is performed using a multi-tone mask to form a mask 135 is described. In order to form the mask 135, a resist is formed. As the resist, a positive-type resist or a negative-type resist can be used. In this example, a positive-type resist is used.

Next, with use of a multi-tone mask as a photomask, the resist is irradiated with light and exposed to light.

A multi-tone mask can achieve three levels of light exposure to obtain an exposed portion, a half-exposed portion, and an unexposed portion; one-time exposure and development process enables a resist mask with regions of plural thicknesses (typically, two kinds of thicknesses) to be formed. Thus, the use of a multi-tone mask allows the number of photomasks to be reduced.

Typical examples of multi-tone masks include a gray-tone mask and a half-tone mask.

A gray-tone mask includes a light-transmitting substrate and a light-blocking portion and a diffraction grating which are provided on the light-transmitting substrate. The light transmittance of the light-blocking portion is 0%. On the other hand, the diffraction grating has a light-transmitting portion in a slit form, a dot form, a mesh form, or the like with intervals which are less than or equal to the resolution limit of light used for the light exposure; thus, light transmittance can be controlled. Note that either periodic or non-periodic slits, dots, or mesh can be used for the diffraction grating.

As the light-transmitting substrate, a light-transmitting substrate such as a quartz substrate can be used. The light-blocking portion and the diffraction grating can be formed using a light-blocking material which absorbs light, such as chromium or chromium oxide.

When the gray-tone mask is irradiated with light for exposure, the light transmittance of the light-blocking portion is 0% and that of a region where neither the light-blocking portion nor the diffraction grating is provided is 100%. The light transmittance of the diffraction grating can be controlled in the range of from 10% to 70%. The light transmittance of the diffraction grating can be controlled by controlling the interval and pitch of the slits, dots, or mesh of the diffraction grating.

A half-tone mask includes a light-transmitting substrate and a semi-light-transmitting portion and a light-blocking portion which are provided on the light-transmitting substrate. The semi-light-transmitting portion can be formed using MoSiN, MoSi, MoSiO, MoSiON, CrSi, or the like. The light-blocking portion can be formed using a light-blocking material which absorbs light, such as chromium or chromium oxide.

When the half-tone mask is irradiated with light for exposure, the light transmittance of the light-blocking portion is 0% and the light transmittance of a region where neither the light-blocking portion nor the semi-light-transmitting portion is provided is 100%. The light transmittance of the semi-light-transmitting portion can be controlled in the range of from 10% to 70%. The light transmittance of the semi-light-transmitting portion can be controlled with the material of the semi-light-transmitting portion.

Figure 14A:
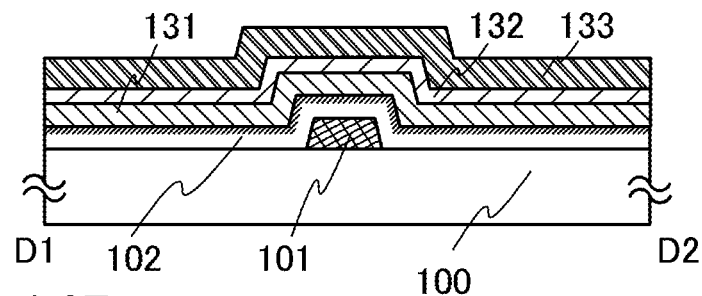
FIGS. 14A to 14D illustrate a method for manufacturing a semiconductor device of an embodiment of the present invention.
Figure 14B:
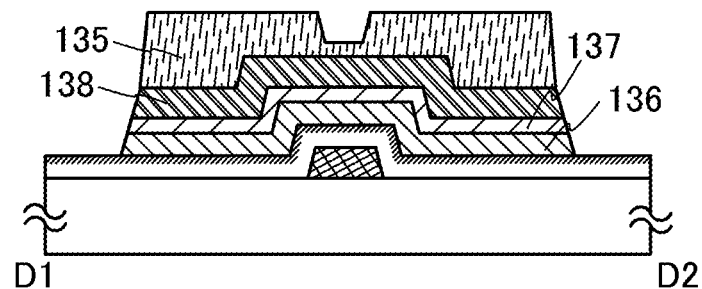
Figure 14C:
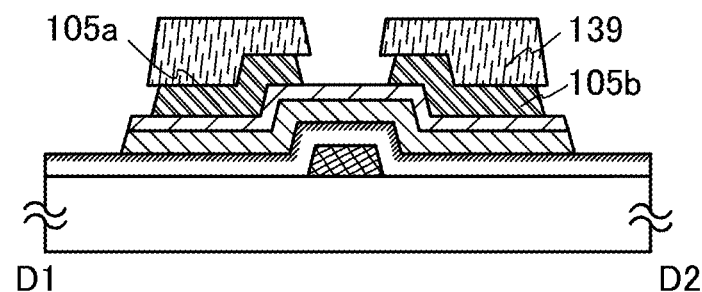
Figure 14D:
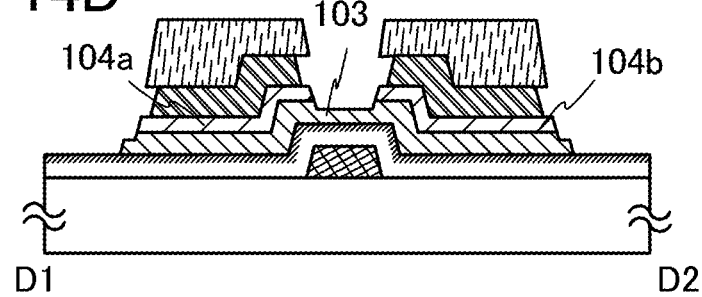

After light exposure with use of the multi-tone mask, development is performed. Accordingly, the mask 135 having regions with different film thicknesses can be formed as illustrated in FIG. 14B.

Next, with the mask 135, the semiconductor film 131, the semiconductor film 132 having n-type conductivity, and the conductive film 133 are isolated by etching. As a result, a semiconductor film 136, a semiconductor film 137 having n-type conductivity, and a conductive film 138 can be formed (see FIG. 14B).

Next, the mask 135 is subjected to ashing. As a result, the area and thickness of the mask are reduced. At this time, a region of the mask with a smaller thickness (a region overlapping part of the gate electrode layer 101) is removed, thereby forming masks 139 which are separated from each other (see FIG. 14C).

With use of the masks 139, the conductive film 138 is etched, whereby the source and drain electrode layers 105a and 105b are formed. By wet etching of the conductive film 138 as in this embodiment, the conductive film 138 is isotropically etched. Thus, end portions of the source and drain electrode layers 105a and 105b are not aligned with and are positioned more inwardly than end portions of the masks 139. Accordingly, end portions of the semiconductor film 137 having n-type conductivity and the semiconductor film 136 are positioned outside the end portions of the source and drain electrode layers 105a and 105b. Next, with use of the masks 139, the semiconductor film 137 having n-type conductivity and the semiconductor film 136 are etched, whereby the source and drain regions 104a and 104b and the semiconductor layer 103 are formed (see FIG. 14D). Note that the semiconductor layer 103 is etched only partly and has a groove.

The source and drain regions 104a and 104b and the groove of the semiconductor layer 103 can be formed in the same step; thus, the semiconductor layer 103 has a similar shape in which end portions thereof are exposed by being partly etched. Then, the masks 139 are removed.

Through the above steps, the thin film transistor 174 illustrated in FIGS. 13A and 13B can be manufactured.

The use of a resist mask having regions of plural thicknesses (typically, two kinds of thicknesses) formed with use of a multi-tone mask as in this embodiment enables the number of resist masks to be reduced; therefore, the process can be simplified and cost can be reduced.

This embodiment can be combined with any of the other embodiments as appropriate.

EMBODIMENT 5

This embodiment describes an example in which at least part of a driver circuit and a thin film transistor to be disposed in a pixel portion are formed over one substrate in a display device that is one example of a semiconductor device of the present invention.

The thin film transistor to be disposed in the pixel portion is formed according to any one of Embodiments 1 to 4. Further, the thin film transistor described in any one of Embodiments 1 to 4 is an n-channel TFT. Thus, a part of a driver circuit that can be formed using n-channel TFTs among driver circuits is formed over the same substrate as that for the thin film transistor of the pixel portion.

Figure 16A:
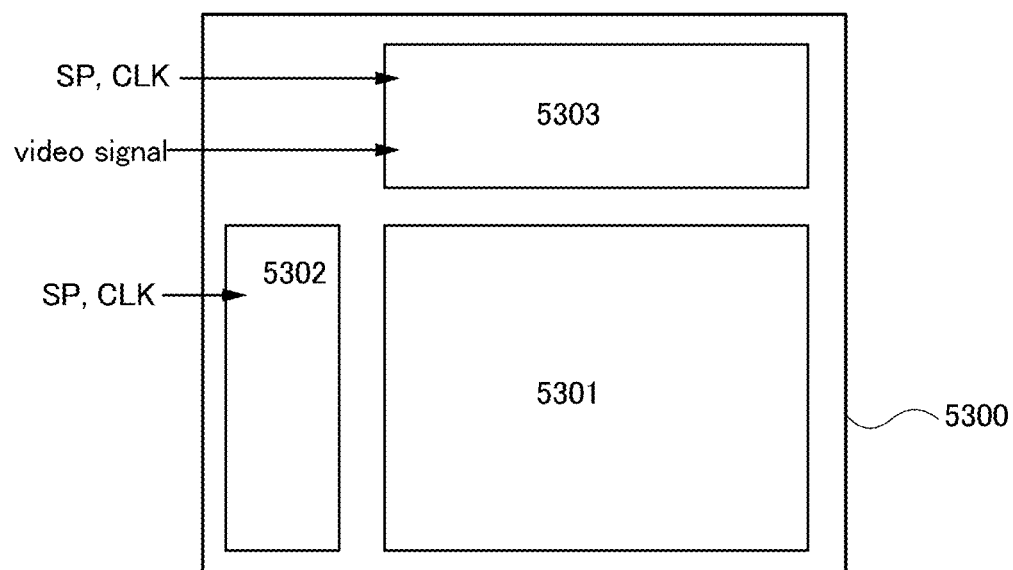
FIGS. 16A and 16B are block diagrams each illustrating a semiconductor device.

FIG. 16A illustrates an example of a block diagram of an active matrix liquid crystal display device. The display device illustrated in FIG. 16A includes, over a substrate 5300, a pixel portion 5301 including a plurality of pixels each provided with a display element; a scanning line driver circuit 5302 that selects a pixel; and a signal line driver circuit 5303 that controls a video signal input to the selected pixel.

The pixel portion 5301 is connected to the signal line driver circuit 5303 by a plurality of signal lines S1 to Sm (not illustrated) that extend in a column direction from the signal line driver circuit 5303, and to the scanning line driver circuit 5302 by a plurality of scanning lines G1 to Gn (not illustrated) that extend in a row direction from the scanning line driver circuit 5302. The pixel portion 5301 includes a plurality of pixels (not illustrated) arranged in matrix so as to correspond to the signal lines S1 to Sm and the scanning lines G1 to Gn. Each pixel is connected to a signal line Sj (one of the signal lines S1 to Sm) and a scanning line Gj (one of the scanning lines G1 to Gn).

In addition, the thin film transistor described in any one of Embodiments 1 to 4 is an n-channel TFT, and a signal line driver circuit including the n-channel TFT is described with reference to FIG. 17.

Figure 17:
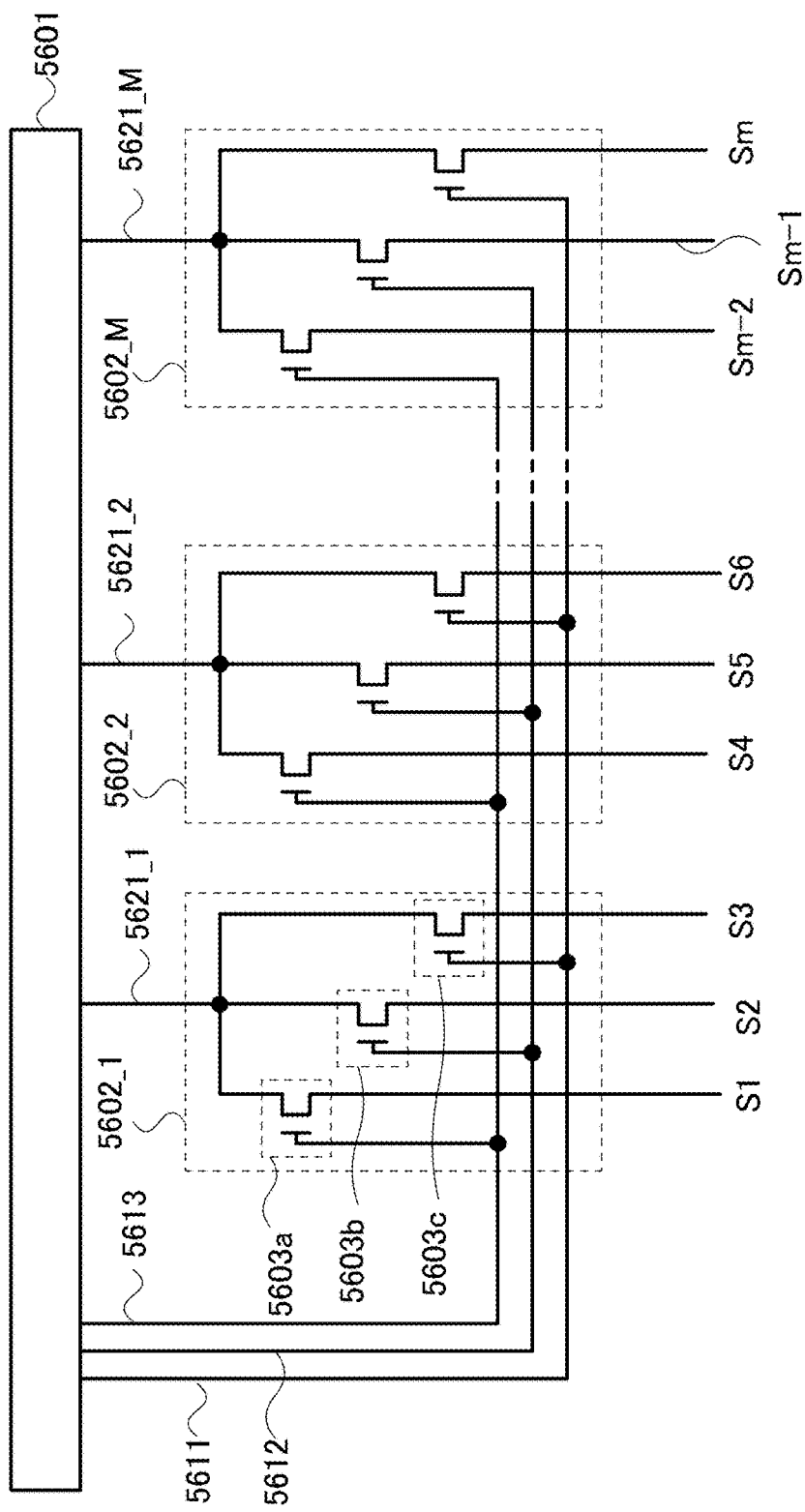
FIG. 17 illustrates a configuration of a signal line driver circuit.

The signal line driver circuit illustrated in FIG. 17 includes a driver IC 5601, switch groups 5602_1 to 5602_M, a first wiring 5611, a second wiring 5612, a third wiring 5613, and wirings 5621_1 to 5621_M. Each of the switch groups 5602_1 to 5602_M includes a first thin film transistor 5603a, a second thin film transistor 5603b, and a third thin film transistor 5603c.

The driver IC 5601 is connected to the first wiring 5611, the second wiring 5612, the third wiring 5613, and the wirings 5621_1 to 5621_M. Each of the switch groups 5602_1 to 5602_M is connected to the first wiring 5611, the second wiring 5612, and the third wiring 5613, and the switch groups 5602_1 to 5602_M are connected to the wirings 5621_1 to 5621_M, respectively. Each of the wirings 5621_1 to 5621_M is connected to three signal lines via the first thin film transistor 5603a, the second thin film transistor 5603b, and the third thin film transistor 5603c. For example, a wiring 5621_J of the J-th column (one of the wirings 5621_1 to 5621_M) is connected to a signal line Sj−1, a signal line Sj, and a signal line Sj+1 via the first thin film transistor 5603a, the second thin film transistor 5603b, and the third thin film transistor 5603c included in the switch group 5602_J.

A signal is input to each of the first wiring 5611, the second wiring 5612, and the third wiring 5613.

Note that the driver IC 5601 is preferably formed over a single crystal substrate. The switch groups 5602_1 to 5602_M are preferably formed over the same substrate as that for the pixel portion. Therefore, the driver IC 5601 and the switch groups 5602_1 to 5602_M are preferably connected through an FPC or the like.

Figure 18:
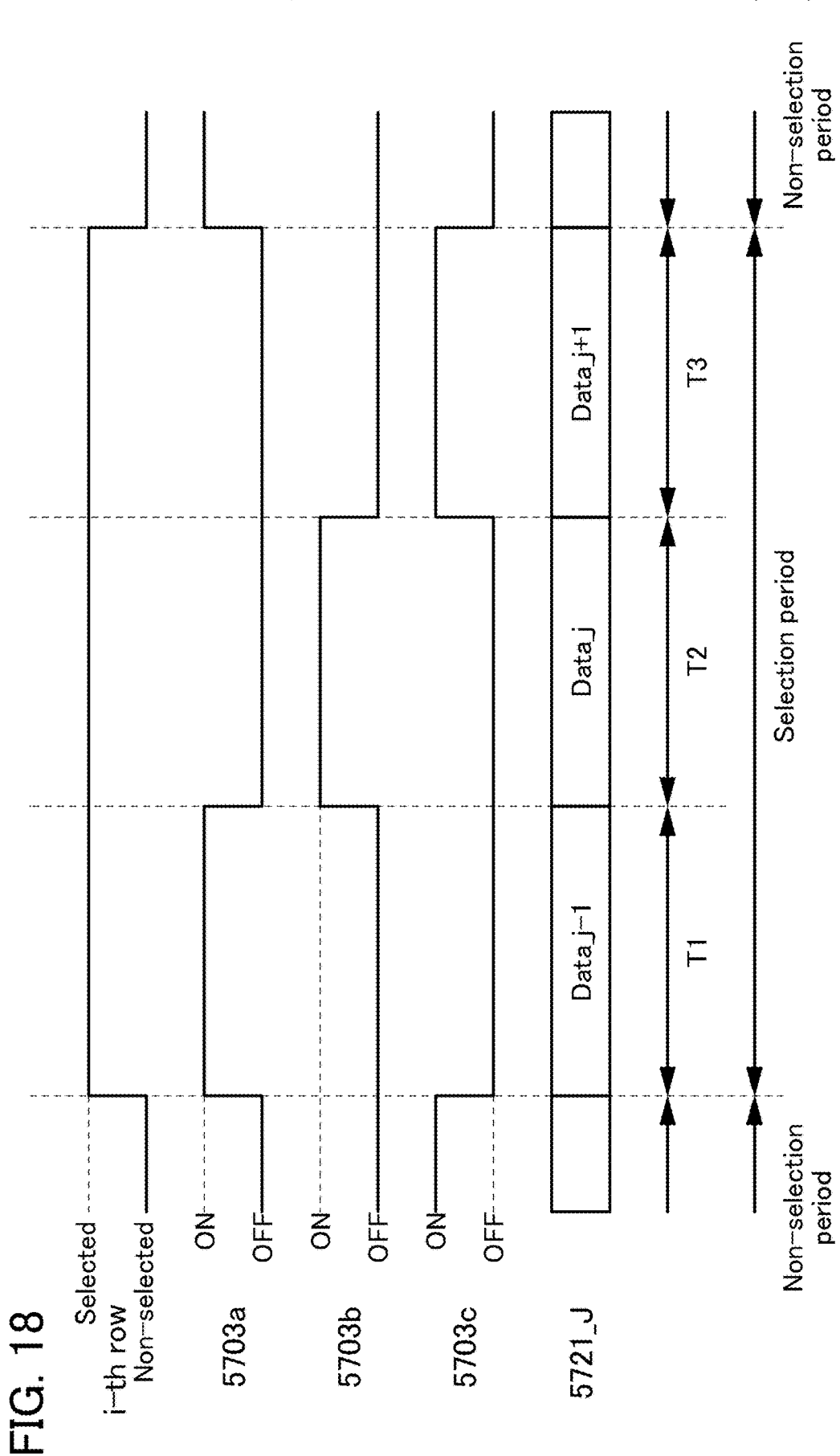
FIG. 18 is a timing chart illustrating operation of a signal line driver circuit.

Next, operation of the signal line driver circuit illustrated in FIG. 17 is described with reference to a timing chart in FIG. 18. The timing chart in FIG. 18 shows a case where a scanning line Gi of the i-th row is selected. A selection period of the scanning line Gi of the i-th row is divided into a first sub-selection period T1, a second sub-selection period T2, and a third sub-selection period T3. In addition, the signal line driver circuit in FIG. 17 operates as shown in FIG. 18 even when a scanning line of another row is selected.

Note that the timing chart in FIG. 18 shows a case where the wiring 5621_J in the J-th column is connected to the signal line Sj−1, the signal line Sj, and the signal line Sj+1 via the first thin film transistor 5603a, the second thin film transistor 5603b, and the third thin film transistor 5603c.

The timing chart in FIG. 18 shows timing at which the scanning line Gi of the i-th row is selected, timing 5703a of on/off of the first thin film transistor 5603a, timing 5703b of on/off of the second thin film transistor 5603b, timing 5703c of on/off of the third thin film transistor 5603c, and a signal 5721_J input to the wiring 5621_J of the J-th column.

In the first sub-selection period T1, the second sub-selection period T2, and the third sub-selection period T3, different video signals are input to the wirings 5621_1 to 5621_M. For example, a video signal input to the wiring 5621_J in the first sub-selection period T1 is input to the signal line Sj−1, a video signal input to the wiring 5621_J in the second sub-selection period T2 is input to the signal line Sj, and a video signal input to the wiring 5621_J in the third sub-selection period T3 is input to the signal line Sj+1. In addition, in the first sub-selection period T1, the second sub-selection period T2, and the third sub-selection period T3, the video signals input to the wiring 5621_J are denoted by Data_j−1, Data_j, and Data_j+1, respectively.

As shown in FIG. 18, in the first sub-selection period T1, the first thin film transistor 5603a is turned on, and the second thin film transistor 5603b and the third thin film transistor 5603c are turned off. At this time, Data_j−1 input to the wiring 5621_J is input to the signal line Sj−1 via the first thin film transistor 5603a. In the second sub-selection period T2, the second thin film transistor 5603b is turned on, and the first thin film transistor 5603a and the third thin film transistor 5603c are turned off. At this time, Data_j input to the wiring 5621_J is input to the signal line Sj via the second thin film transistor 5603b. In the third sub-selection period T3, the third thin film transistor 5603c is turned on, and the first thin film transistor 5603a and the second thin film transistor 5603b are turned off. At this time, Data_j+1 input to the wiring 5621_J is input to the signal line Sj+1 via the third thin film transistor 5603c.

As described above, in the signal line driver circuit in FIG. 17, by dividing one gate selection period into three, video signals can be input to three signal lines from one wiring 5621 in one gate selection period. Therefore, in the signal line driver circuit in FIG. 17, the number of connections of the substrate provided with the driver IC 5601 and the substrate provided with the pixel portion can be approximately ⅓ of the number of signal lines. The number of connections is reduced to approximately ⅓ of the number of the signal lines, so that reliability, yield, etc., of the signal line driver circuit in FIG. 17 can be improved.

Note that there are no particular limitations on the arrangement, the number, a driving method, and the like of the thin film transistors, as long as one gate selection period is divided into a plurality of sub-selection periods and a video signal is input to a plurality of signal lines from one wiring in each of the plurality of sub-selection periods as illustrated in FIG. 17.

For example, when a video signal is input to each of three or more signal lines from one wiring in each of three or more sub-selection periods, it is only necessary to add a thin film transistor and a wiring for controlling the thin film transistor. Note that when one gate selection period is divided into four or more sub-selection periods, one sub-selection period becomes shorter. Therefore, one gate selection period is preferably divided into two or three sub-selection periods.

Figure 19:
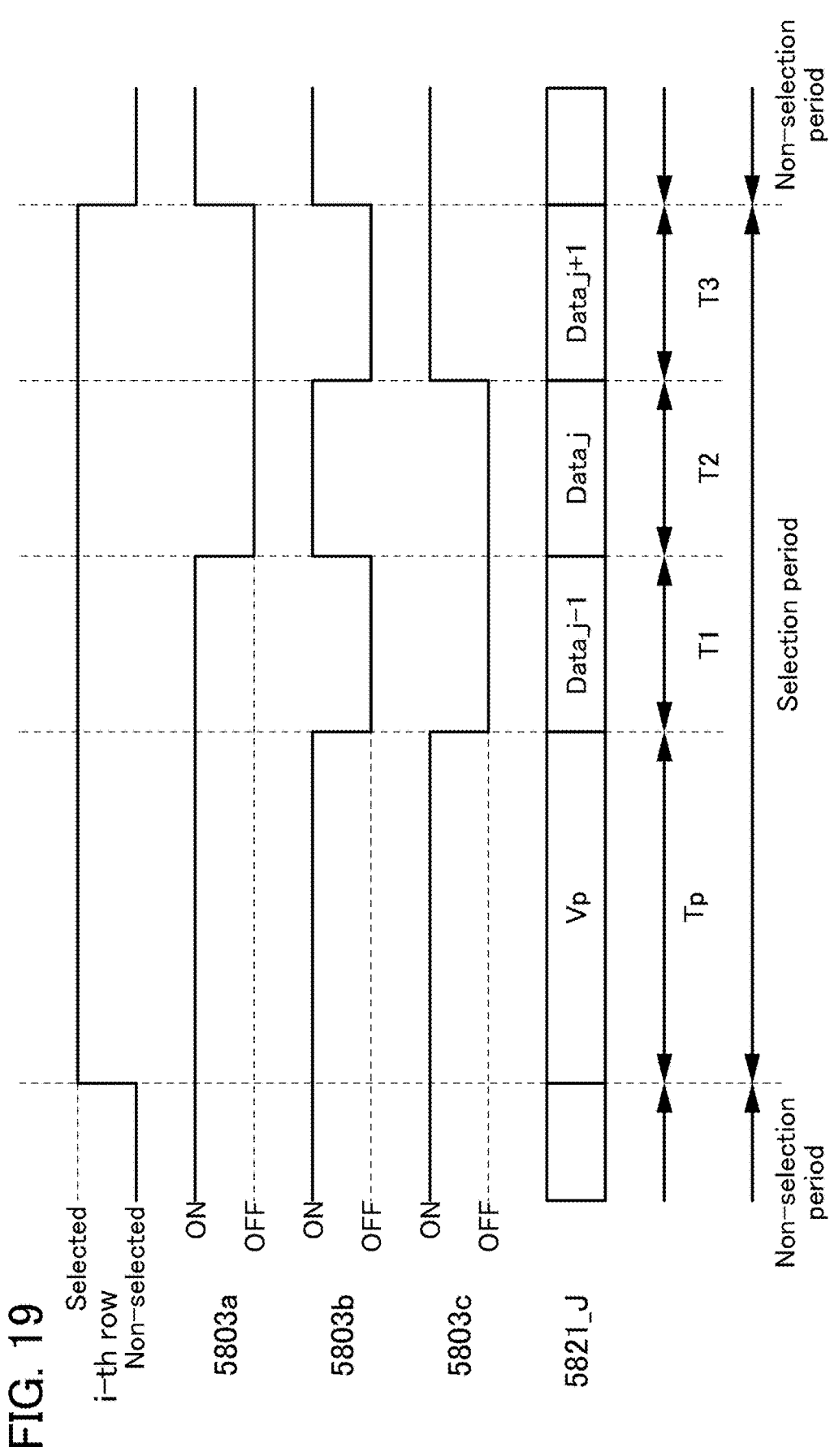
FIG. 19 is a timing chart illustrating operation of a signal line driver circuit.

As another example, one selection period may be divided into a precharge period Tp, the first sub-selection period T1, the second sub-selection period T2, and the third sub-selection period T3 as illustrated in a timing chart in FIG. 19. The timing chart in FIG. 19 illustrates timing at which the scanning line Gi of the i-th row is selected, timing 5803a of on/off of the first thin film transistor 5603a, timing 5803b of on/off of the second thin film transistor 5603b, timing 5803c of on/off of the third thin film transistor 5603c, and a signal 5821_J input to the wiring 5621_J of the J-th column. As illustrated in FIG. 19, the first thin film transistor 5603a, the second thin film transistor 5603b, and the third thin film transistor 5603c are turned on in the precharge period Tp. At this time, precharge voltage Vp input to the wiring 5621_J is input to the signal line Sj−1, the signal line Sj, and the signal line Sj+1 via the first thin film transistor 5603a, the second thin film transistor 5603b, and the third thin film transistor 5603c. In the first sub-selection period T1, the first thin film transistor 5603a is turned on, and the second thin film transistor 5603b and the third thin film transistor 5603c are turned off. At this time, Data_j−1 input to the wiring 5621_J is input to the signal line Sj−1 via the first thin film transistor 5603a. In the second sub-selection period T2, the second thin film transistor 5603b is turned on, and the first thin film transistor 5603a and the third thin film transistor 5603c are turned off. At this time, Data_j input to the wiring 5621_J is input to the signal line Sj via the second thin film transistor 5603b. In the third sub-selection period T3, the third thin film transistor 5603c is turned on, and the first thin film transistor 5603a and the second thin film transistor 5603b are turned off. At this time, Data_j+1 input to the wiring 5621_J is input to the signal line Sj+1 via the third thin film transistor 5603c.

As described above, in the signal line driver circuit in FIG. 17 to which the timing chart in FIG. 19 is applied, the video signal can be written to the pixel at high speed because the signal line can be precharged by providing a precharge selection period before a sub-selection period. Note that portions in FIG. 19 which are similar to those of FIG. 18 are denoted by common reference numerals and detailed description of the portions which are the same and portions which have similar functions is omitted.

Further, a structure of a scanning line driver circuit is described. The scanning line driver circuit includes a shift register and a buffer. In addition, the scanning line driver circuit may include a level shifter in some cases. In the scanning line driver circuit, when a clock signal (CLK) and a start pulse signal (SP) are input to the shift register, a selection signal is produced. The generated selection signal is buffered and amplified by the buffer, and the resulting signal is supplied to a corresponding scanning line. Gate electrodes of transistors in pixels of one line are connected to the scanning line. Further, since the transistors in the pixels of one line have to be turned on at the same time, a buffer which can feed a large current is used.

One mode of a shift register which is used for a part of a scanning line driver circuit is described with reference to FIG. 20 and FIG. 21.

Figure 20:
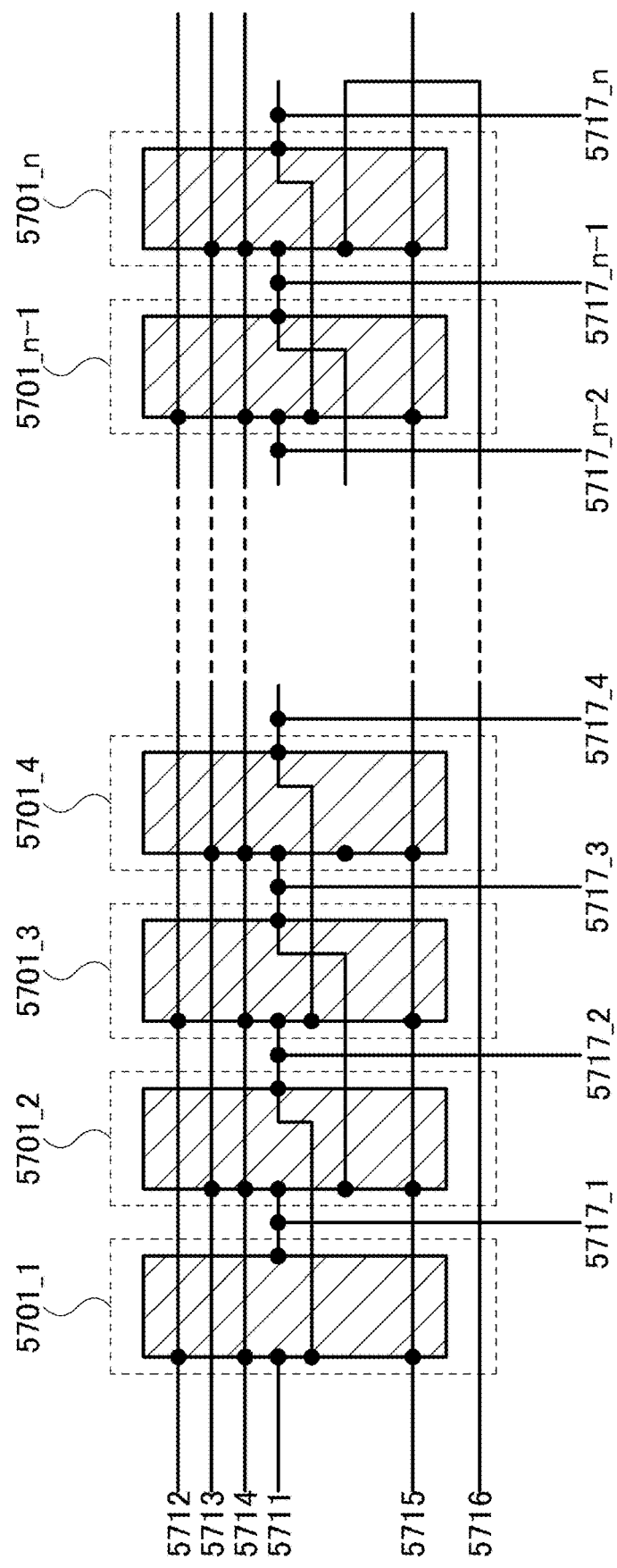
FIG. 20 illustrates a configuration of a shift register.

FIG. 20 illustrates a circuit configuration of the shift register. The shift register illustrated in FIG. 20 includes a plurality of flip-flops 5701_i (any of flip-flops 5701_1 to 5701_n). The shift register is operated with input of a first clock signal, a second clock signal, a start pulse signal, and a reset signal.

Connection relations of the shift register in FIG. 20 are described. In the i-th stage flip-flop 5701_i (one of the flip-flops 5701_1 to 5701_n) in the shift register of FIG. 20, a first wiring 5501 illustrated in FIG. 21 is connected to a seventh wiring 5717_i−1; a second wiring 5502 illustrated in FIG. 21 is connected to a seventh wiring 5717_i+1; a third wiring 5503 illustrated in FIG. 21 is connected to a seventh wiring 5717_i; and a sixth wiring 5506 illustrated in FIG. 21 is connected to a fifth wiring 5715.

Figure 21:
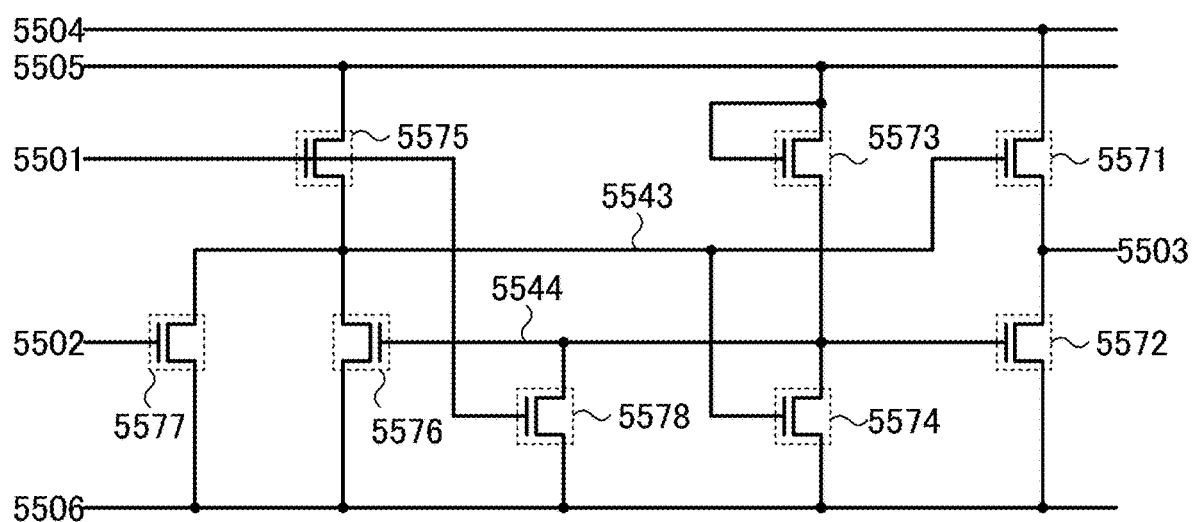
FIG. 21 illustrates a connection of a flip-flop illustrated in FIG. 20.

Further, a fourth wiring 5504 illustrated in FIG. 21 is connected to a second wiring 5712 in flip-flops of odd-numbered stages, and is connected to a third wiring 5713 in flip-flops of even-numbered stages. A fifth wiring 5505 illustrated in FIG. 21 is connected to a fourth wiring 5714.

Note that the first wiring 5501 of the first stage flip-flop 5701_1 illustrated in FIG. 21 is connected to a first wiring 5711. Moreover, the second wiring 5502 illustrated in FIG. 21 of the n-th stage flip-flop 5701_n is connected to a sixth wiring 5716.

Note that the first wiring 5711, the second wiring 5712, the third wiring 5713, and the sixth wiring 5716 may be referred to as a first signal line, a second signal line, a third signal line, and a fourth signal line, respectively. The fourth wiring 5714 and the fifth wiring 5715 may be referred to as a first power source line and a second power source line, respectively.

Next, FIG. 21 illustrates details of the flip-flop illustrated in FIG. 20. A flip-flop illustrated in FIG. 21 includes a first thin film transistor 5571, a second thin film transistor 5572, a third thin film transistor 5573, a fourth thin film transistor 5574, a fifth thin film transistor 5575, a sixth thin film transistor 5576, a seventh thin film transistor 5577, and an eighth thin film transistor 5578. Each of the first thin film transistor 5571, the second thin film transistor 5572, the third thin film transistor 5573, the fourth thin film transistor 5574, the fifth thin film transistor 5575, the sixth thin film transistor 5576, the seventh thin film transistor 5577, and the eighth thin film transistor 5578 is an n-channel transistor and is turned on when the gate-source voltage (Vgs) exceeds the threshold voltage (Vth).

Next, a connection structure of the flip-flop illustrated in FIG. 20 is described below.

A first electrode (one of a source electrode and a drain electrode) of the first thin film transistor 5571 is connected to the fourth wiring 5504. A second electrode (the other of the source electrode and the drain electrode) of the first thin film transistor 5571 is connected to the third wiring 5503.

A first electrode of the second thin film transistor 5572 is connected to the sixth wiring 5506. A second electrode of the second thin film transistor 5572 is connected to the third wiring 5503.

A first electrode of the third thin film transistor 5573 is connected to the fifth wiring 5505. A second electrode of the third thin film transistor 5573 is connected to a gate electrode of the second thin film transistor 5572. A gate electrode of the third thin film transistor 5573 is connected to the fifth wiring 5505.

A first electrode of the fourth thin film transistor 5574 is connected to the sixth wiring 5506. A second electrode of the fourth thin film transistor 5574 is connected to the gate electrode of the second thin film transistor 5572. A gate electrode of the fourth thin film transistor 5574 is connected to a gate electrode of the first thin film transistor 5571.

A first electrode of the fifth thin film transistor 5575 is connected to the fifth wiring 5505. A second electrode of the fifth thin film transistor 5575 is connected to the gate electrode of the first thin film transistor 5571. A gate electrode of the fifth thin film transistor 5575 is connected to the first wiring 5501.

A first electrode of the sixth thin film transistor 5576 is connected to the sixth wiring 5506. A second electrode of the sixth thin film transistor 5576 is connected to the gate electrode of the first thin film transistor 5571. A gate electrode of the sixth thin film transistor 5576 is connected to the gate electrode of the second thin film transistor 5572.

A first electrode of the seventh thin film transistor 5577 is connected to the sixth wiring 5506. A second electrode of the seventh thin film transistor 5577 is connected to the gate electrode of the first thin film transistor 5571. A gate electrode of the seventh thin film transistor 5577 is connected to the second wiring 5502. A first electrode of the eighth thin film transistor 5578 is connected to the sixth wiring 5506. A second electrode of the eighth thin film transistor 5578 is connected to the gate electrode of the second thin film transistor 5572. A gate electrode of the eighth thin film transistor 5578 is connected to the first wiring 5501.

Note that a point at which the gate electrode of the first thin film transistor 5571, the gate electrode of the fourth thin film transistor 5574, the second electrode of the fifth thin film transistor 5575, the second electrode of the sixth thin film transistor 5576, and the second electrode of the seventh thin film transistor 5577 are connected is referred to as a node 5543. A point at which the gate electrode of the second thin film transistor 5572, the second electrode of the third thin film transistor 5573, the second electrode of the fourth thin film transistor 5574, the gate electrode of the sixth thin film transistor 5576, and the second electrode of the eighth thin film transistor 5578 are connected is referred to as a node 5544.

Note that the first wiring 5501, the second wiring 5502, the third wiring 5503, and the fourth wiring 5504 may be referred to as a first signal line, a second signal line, a third signal line, and a fourth signal line, respectively. The fifth wiring 5505 and the sixth wiring 5506 may be referred to as a first power source line and a second power source line, respectively.

In addition, the signal line driver circuit and the scanning line driver circuit can be formed using only the n-channel TFTs described in any one of Embodiments 1 to 4. The n-channel TFT described in any one of Embodiments 1 to 4 has high mobility in the transistor characteristics, and thus a driving frequency of a driver circuit can be increased. In addition, in the n-channel TFT illustrated in any of Embodiments 1 to 4, since parasitic capacitance is reduced by the source and drain regions that are oxygen-deficient oxide semiconductor layers including indium, gallium, and zinc, the frequency characteristics (f characteristics) are high. For example, a scanning line driver circuit using the n-channel TFT described in any one of Embodiments 1 to 4 can operate at high speed, and thus a frame frequency can be increased and insertion of black images and the like can be realized.

In addition, when the channel width of the transistor in the scanning line driver circuit is increased or a plurality of scanning line driver circuits are provided, for example, a higher frame frequency can be realized. When a plurality of scanning line driver circuits are provided, a scanning line driver circuit for driving even-numbered scanning lines is provided on one side and a scanning line driver circuit for driving odd-numbered scanning lines is provided on the opposite side; thus, increase in frame frequency can be realized.

Figure 16B:
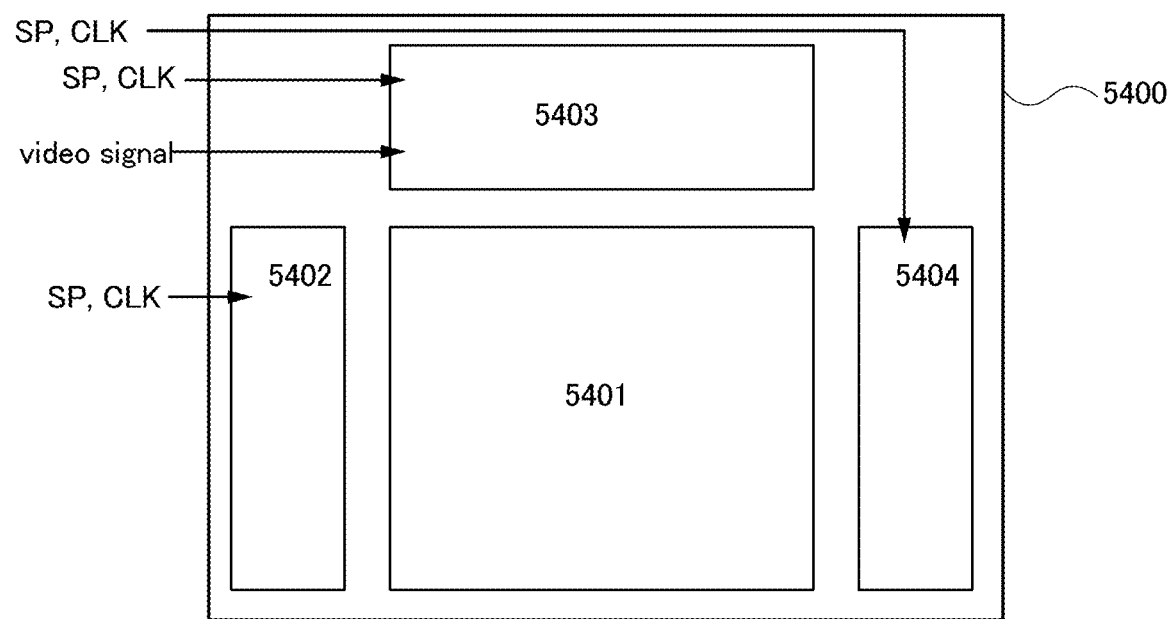

Further, when an active matrix light-emitting display device is manufactured, a plurality of transistors are arranged in at least one pixel, and thus a plurality of scanning line driver circuits are preferably arranged. FIG. 16B is a block diagram illustrating an example of an active matrix light-emitting display device.

The display device illustrated in FIG. 16B includes, over a substrate 5400, a pixel portion 5401 having a plurality of pixels each provided with a display element, a first scanning line driver circuit 5402 and a second scanning line driver circuit 5404 that select a pixel, and a signal line driver circuit 5403 that controls input of a video signal to the selected pixel.

When the video signal input to a pixel of the display device illustrated in FIG. 16B is a digital signal, a pixel is in a light-emitting state or a non-light-emitting state by switching of on/off of a transistor. Thus, grayscale can be displayed using an area ratio grayscale method or a time ratio grayscale method. An area ratio grayscale method refers to a driving method by which one pixel is divided into a plurality of sub-pixels and each sub-pixel is driven independently based on a video signal so that grayscale is displayed. Further, a time ratio grayscale method refers to a driving method by which a period during which a pixel is in a light-emitting state is controlled so that grayscale is displayed.

Since the response speed of light-emitting elements is higher than that of liquid crystal elements or the like, the light-emitting elements are more suitable for a time ratio grayscale method than liquid-crystal elements. Specifically, in the case of displaying with a time gray scale method, one frame period is divided into a plurality of sub-frame periods. Then, in accordance with video signals, the light-emitting element in the pixel is set in a light-emitting state or a non-light-emitting state in each sub-frame period. By dividing one frame into a plurality of sub-frames, the total length of time, in which pixels actually emit light in one frame period, can be controlled with video signals so that gray scales are displayed.

In the light-emitting device illustrated in FIG. 16B, in the case where two TFTs, a switching TFT and a current control TFT, are arranged in one pixel, the first scanning line driver circuit 5402 generates a signal which is input to a first scanning line functioning as a gate wiring of the switching TFT, and the second scanning line driver circuit 5404 generates a signal which is input to a second scanning line functioning as a gate wiring of the current control TFT; however, one scanning line driver circuit may generate both the signal which is input to the first scanning line and the signal which is input to the second scanning line. In addition, for example, there is a possibility that a plurality of the first scanning lines used for controlling the operation of the switching element are provided in each pixel, depending on the number of transistors included in the switching element. In that case, one scanning line driver circuit may generate all signals that are input to the plurality of first scanning lines, or a plurality of scanning line driver circuits may generate signals that are input to the plurality of first scanning lines.

In addition, also in the light-emitting device, a part of a driver circuit that can include n-channel TFTs among driver circuits can be formed over the same substrate as that for the thin film transistors of the pixel portion. Alternatively, the signal line driver circuit and the scanning line driver circuit can be formed using only the n-channel TFTs described in any one of Embodiment 1 to 4.

Moreover, the above-described driver circuit can be used for electronic paper that drives electronic ink using an element electrically connected to a switching element, without being limited to applications to a liquid crystal display device or a light-emitting device. The electronic paper is also referred to as an electrophoretic display device (electrophoretic display) and has advantages in that it has the same level of readability as plain paper, it has lower power consumption than other display devices, and it can be made thin and lightweight.

Electrophoretic displays can have various modes. Electrophoretic displays contain a plurality of microcapsules dispersed in a solvent or a solute, each microcapsule containing a first particle which is positively charged and a second particle which is negatively charged. By applying an electric field to the microcapsules, the particles in the microcapsules are moved in opposite directions to each other and only the color of the particles concentrated on one side is exhibited. Note that the first particle and the second particle each contain pigment and do not move without an electric field. Moreover, the colors of the first particle and the second particle are different from each other (including colorless or achroma).

In this way, an electrophoretic display is a display that utilizes a so-called dielectrophoretic effect by which a substance that has a high dielectric constant moves to a high-electric field region. An electrophoretic display does not need a polarizer and a counter substrate, which are required in a liquid crystal display device, and both the thickness and weight of the electrophoretic display device can be a half of those of a liquid crystal display device.

A solution obtained by dispersing the aforementioned microcapsules throughout a solvent is referred to as electronic ink. This electronic ink can be printed on a surface of glass, plastic, cloth, paper, or the like. Furthermore, by use of a color filter or particles that have a pigment, color display is possible, as well.

In addition, a display device can be completed by appropriately providing a plurality of the microcapsules over a substrate to be interposed between two electrodes, and can perform display by application of electric field to the microcapsules. For example, the active matrix substrate obtained by the thin film transistor described in any one of Embodiments 1 to 4 can be used.

Note that the first particle and the second particle in the microcapsule may each be formed of a single material selected from a conductive material, an insulating material, a semiconductor material, a magnetic material, a liquid crystal material, a ferroelectric material, an electroluminescent material, an electrochromic material, or a magnetophoretic material or formed of a composite material of any of these.

Through this process, a highly reliable light emitting display device (display panel) as a semiconductor device can be manufactured.

This embodiment can be combined with the structure disclosed in other embodiments, as appropriate.

EMBODIMENT 6

In this embodiment, a manufacturing example of an inverted staggered thin film transistor will be described, in which at least a gate insulating layer and an oxygen-excess oxide semiconductor layer are formed to be stacked successively without being exposed to the air. In this embodiment, steps up to successive formation are described, and steps after the successive formation may be carried out in accordance with any of Embodiments 1 to 4 to manufacture a thin film transistor.

In this specification, successive formation is carried out as follows: a substrate to be processed is placed in an atmosphere which is controlled to be vacuum or an inert gas atmosphere (a nitrogen atmosphere or a rare gas atmosphere) at all times without being exposed to a contaminant atmosphere such as air during a process from a first film formation step using a sputtering method to a second film formation step using a sputtering method. By the successive formation, a film can be formed while moisture or the like is prevented from attaching again to the substrate to be processed which is cleaned.

Performing the process from the first film formation step to the second film formation step in the same chamber is within the scope of the successive formation in this specification.

In addition, the following case is also within the scope of the successive formation in this specification: in the case of performing the process from the first film formation step to the second film formation step in plural chambers, the substrate is transferred after the first film formation step to another chamber without being exposed to the air and is then subjected to the second film formation.

Note that between the first film formation step and the second film formation step, a substrate transfer step, an alignment step, a slow-cooling step, a step of heating or cooling the substrate to a temperature which is necessary for the second film formation step, or the like may be provided. Such a process is also within the scope of the successive formation in this specification.

A step in which liquid is used, such as a cleaning step, wet etching, or resist formation, may be provided between the first film formation step and the second film formation step. This case is not within the scope of the successive formation in this specification.

Figure 22:
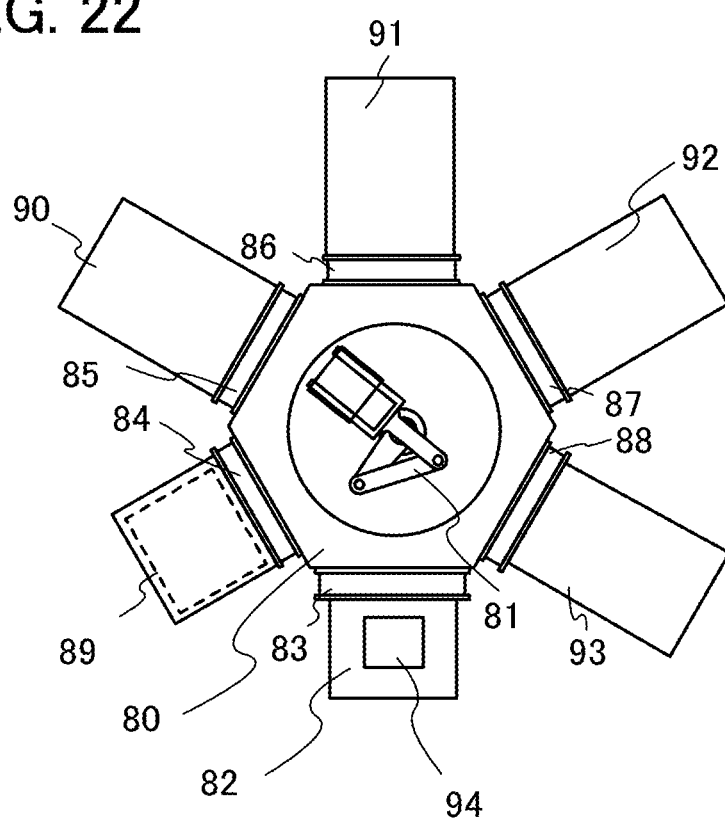
FIG. 22 is a top schematic view of a multi-chamber manufacturing apparatus.

When films are successively formed without being exposed to the air, a multi-chamber manufacturing apparatus as illustrated in FIG. 22 is preferably used.

At the center of the manufacturing apparatus, a transfer chamber 80 equipped with a transfer mechanism (typically, a transfer robot 81) for transferring a substrate is provided. A cassette chamber 82 in which a cassette case storing a plurality of substrates carried into and out of the transfer chamber 80 is set is connected to the transfer chamber 80.

In addition, a plurality of treatment chambers are connected to the transfer chamber 80 via gate valves 83 to 88. In this embodiment, an example in which five treatment chambers are connected to the transfer chamber 80 having a hexagonal top shape is illustrated. Note that, by changing the top shape of the transfer chamber 80, the number of treatment chambers which can be connected to the transfer chamber can be changed. For example, three treatment chambers can be connected to a transfer chamber having a tetragonal top shape, or seven treatment chambers can be connected to a transfer chamber having an octagonal top shape.

At least one treatment chamber among the five treatment chambers is a sputtering chamber in which sputtering is performed. The sputtering chamber is provided with, at least inside the chamber, a sputtering target, a mechanism for applying electric power or a gas introduction means for sputtering the target, a substrate holder for holding a substrate at a predetermined position, and the like. Further, the sputtering chamber is provided with a pressure control means with which the pressure in the chamber is controlled, so that the pressure is reduced in the sputtering chamber.

Examples of a sputtering method include an RF sputtering method in which a high-frequency power source is used for a sputtering power source, a DC sputtering method, and a pulsed DC sputtering method in which a bias is applied in a pulsed manner. An RF sputtering method is mainly used in the case of forming an insulating film, and a DC sputtering method is mainly used in the case of forming a metal film.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, there are a sputtering apparatus provided with a magnet system inside the chamber and used for a magnetron sputtering method, and a sputtering apparatus used for an ECR sputtering method in which plasma generated with the use of microwaves is used without using glow discharge.

In the sputtering chamber of this embodiment, any of various sputtering methods described above is used as appropriate.

In addition, as a film formation method, there are also a reactive sputtering method in which a target substance and a sputtering gas component chemically reacts with each other during film formation to form a thin film of a compound thereof, and a bias sputtering method in which voltage is also applied to a substrate during film formation.

In addition, among the five treatment chambers, one of the treatment chambers other than the sputtering chamber is a heating chamber in which a substrate is preheated or the like before sputtering, a cooling chamber in which a substrate is cooled after sputtering, or a chamber in which plasma treatment is performed.

Next, an example of an operation of the manufacturing apparatus is described.

A substrate cassette storing a substrate 94 whose deposition target surface faces downward is set in the cassette chamber 82, and the cassette chamber 82 is placed in a reduced pressure state by a vacuum exhaust means provided in the cassette chamber 82. In each of the treatment chambers and the transfer chamber 80, the pressure is reduced in advance by a vacuum exhaust means provided in each chamber. Accordingly, during transfer of the substrate between the treatment chambers, the substrate is not exposed to the air and can be kept clean.

Note that the substrate 94 which is placed so that its deposition target surface faces downward is provided in advance with at least a gate electrode. A base insulating film may be provided between the gate electrode and the substrate. For example, the base insulating film may be, but not particularly limited to, a silicon nitride film or a silicon nitride oxide film formed by a sputtering method, or the like. When a substrate formed of glass containing alkali metal is used as the substrate 94, the base insulating film has an effect of preventing mobile ions of sodium or the like from entering a semiconductor region thereover from the substrate so that variation in electrical characteristics of a TFT can be suppressed.

In this embodiment, a substrate provided with a silicon nitride film which is formed as a first layer of a gate insulating layer by a plasma CVD method to cover a gate electrode is used. A silicon nitride film formed by a plasma CVD method is dense and can suppress generation of a pinhole or the like when used as the first layer of the gate insulating layer. Although an example in which the gate insulating layer has a stacked-layer structure is described in this embodiment, the present invention is not particularly limited thereto, and a single-layer structure or a stacked-layer structure of three or more layers may also be employed.

Then, the gate valve 83 is opened and the substrate 94 which is the first substrate is picked up from the cassette by the transfer robot 81. After that, the gate valve 84 is opened, the substrate 94 is transferred to a first treatment chamber 89, and then, the gate valve 84 is closed. In the first treatment chamber 89, by heating the substrate 94 with a heater or a lamp, moisture or the like attached to the substrate 94 is removed. In particular, when the gate insulating layer contains moisture, there is a risk that electrical characteristics of a TFT are changed; therefore, heating before film formation by sputtering is effective. In the case where moisture has been sufficiently removed at the time when the substrate is set in the cassette chamber 82, this heating treatment is not necessary.

In addition, the first treatment chamber 89 may be provided with a plasma treatment means, and a surface of the first layer of the gate insulating layer may be subjected to plasma treatment. Furthermore, the cassette chamber 82 may be provided with a heating means, and heating for removing moisture may be performed in the cassette chamber 82.

Then, the gate valve 84 is opened and the substrate is transferred to the transfer chamber 80 by the transfer robot 81. After that, the gate valve 85 is opened and the substrate is transferred to a second treatment chamber 90, and the gate valve 85 is closed.

In this embodiment, the second treatment chamber 90 is a sputtering chamber in which sputtering is performed using an RF magnetron sputtering method.

In the second treatment chamber 90, a silicon nitride (SiNx) film is formed as the first layer of the gate insulating layer.

After the SiNx film is formed, without exposure to air, the gate valve 85 is opened and the substrate is transferred to the transfer chamber 80 by the transfer robot 81. Then, the gate valve 86 is opened, the substrate is transferred to a third treatment chamber 91, and the gate valve 86 is closed.

In this embodiment, the third treatment chamber 91 is a sputtering chamber in which sputtering is performed using an RF magnetron sputtering method.

In the third treatment chamber 91, a silicon oxide (SiOx) film is formed as a second layer of the gate insulating layer. As the gate insulating layer, other than a silicon oxide film, an aluminum oxide ($Al_2O_3$) film, a magnesium oxide (MgOx) film, an aluminum nitride (AlNx) film, an yttrium oxide (YOx) film, or the like can be used.

In order to reduce hydrogen in the gate insulating layer, the gate insulating layer is formed by sputtering using a single crystal silicon target and using an argon gas and an oxygen gas. It is very important to prevent hydrogen in the gate insulating layer from diffusing and reacting with excess oxygen in an IGZO film to produce an $H_2O$ component. It is also important to form the gate insulating layer and the IGZO film by successive formation to prevent moisture from being attached to the interface. Thus, it is preferable that the chamber be evacuated to vacuum with a cryopump or the like and sputtering be performed in ultra-high vacuum range, i.e., UHV range, with an ultimate pressure of $1\times10^{-7}$ Torr to $1\times10^{-10}$ Torr (about $1\times10^{-5}$ Pa to $1\times10^{-8}$ Pa). In addition, when the gate insulating layer and the IGZO film are successively stacked such that the interface is not exposed to the air, oxygen radical treatment to which is performed on a surface of the gate insulating layer to change the surface into an oxygen-excess region is effective in forming a source of oxygen for interface reformation of the IGZO film during heat treatment for reliability improvement in a later step.

In addition, when an oxygen-excess region is provided by subjecting the gate insulating layer to oxygen radical treatment, the oxygen concentration at a surface on the IGZO side is higher than that in the gate insulating layer. When oxygen radical treatment is performed, the oxygen concentration at the interface between the gate insulating layer and the IGZO film is higher than when oxygen radical treatment is not performed.

When the gate insulating layer is subjected to oxygen radical treatment, the IGZO film is stacked, and heat treatment is performed, the oxygen concentration in the IGZO film on the gate insulating layer side is also increased.

A small amount of a halogen element such as fluorine or chlorine may be added to the gate insulating layer so as to immobilize mobile ions of sodium or the like. As a method for adding a small amount of a halogen element, sputtering is performed by introducing a gas containing a halogen element into the chamber. In the case where a gas containing a halogen element is introduced, the exhaust means of the chamber needs to be provided with an abatement system. The peak of the concentration of a halogen element to be contained in the gate insulating layer, when measured by secondary ion mass spectrometry (SIMS), is preferably in the range of from $1\times10^{15}$ $cm^{-3}$ to $1\times10^{20}$ $cm^{-3}$ inclusive.

After the SiOx film is formed, without exposure to air, the gate valve 86 is opened and the substrate is transferred to the transfer chamber 80 by the transfer robot 81. Then, the gate valve 87 is opened, the substrate is transferred to a fourth treatment chamber 92, and the gate valve 87 is closed.

In this embodiment, the fourth treatment chamber 92 is a sputtering chamber in which sputtering is performed using a DC magnetron sputtering method. In the fourth treatment chamber 92, a surface of the gate insulating layer is subjected to oxygen radical treatment, an oxygen-excess oxide semiconductor layer (the IGZO film) is formed as a semiconductor layer, and oxygen-deficient oxide semiconductor layers are formed as source and drain regions.

As the oxygen radical treatment of the surface of the gate insulating layer, plasma treatment such as reverse sputtering may be performed. The reverse sputtering is a method by which voltage is applied to a substrate side without being applied to a target side in an oxygen atmosphere or an oxygen and argon atmosphere and plasma is generated so that a substrate surface is reformed. Furthermore, the gate insulating layer may be subjected to nitriding treatment; plasma treatment such as reverse sputtering may be performed in a nitrogen atmosphere.

The IGZO film can be formed using an oxide semiconductor target containing In, Ga, and Zn, in a rare gas atmosphere or an oxygen atmosphere. Here, an oxide semiconductor containing In, Ga, and Zn is used as a target and sputtering is performed by a pulsed DC sputtering method in an atmosphere containing only oxygen or an atmosphere containing oxygen of 90% or higher and Ar of 10% or lower so that as much oxygen as possible is contained in the IGZO film, whereby an oxygen-excess IGZO film is formed.

As described above, the oxygen-excess SiOx film and the oxygen-excess IGZO film are formed successively without being exposed to the air, whereby an interface state between the oxygen-excess films can be stabilized, and the reliability of a TFT can be improved. If the substrate is exposed to the air before formation of the IGZO film, moisture or the like is attached and the interface state is adversely affected, which may cause defects such as variation in threshold voltages, deterioration in electrical characteristics, and a normally-on TFT. Moisture is a hydrogen compound. When the films are successively formed without being exposed to the air, the hydrogen compound can be prevented from existing at the interface. Therefore, by successive formation, variation in threshold voltages can be reduced, deterioration in electrical characteristics can be prevented, or shift of the TFT characteristics to the normally-on side can be suppressed, or desirably, the shift of the TFT characteristics can be prevented.

Alternatively, in the third treatment chamber 91 which is a sputtering chamber, both an artificial quartz target and an oxide semiconductor target containing In, Ga, and Zn are placed, and the films are successively formed by using shutters; accordingly, the films can be stacked in the same chamber. The shutters are provided between the targets and the substrate; one of the shutters for a target which is used for film formation is opened, and the other one of the shutters for a target which is not used for film formation is closed. Advantages of a process in which the films are stacked in the same chamber are the following points: reduction of the number of chambers which are used, and prevention of the attachment of particles or the like to the substrate during transfer of the substrate between different chambers.

Unless in a process where a gray-tone mask is used, the substrate at this stage is carried out of the manufacturing apparatus via the cassette chamber and the oxygen-excess IGZO film is processed by etching using a photolithography technique. In a process where a gray-tone mask is used, successive formation described below is subsequently performed.

Subsequently, in the fourth treatment chamber 92, sputtering is performed by a pulsed DC sputtering method in an atmosphere containing only a rare gas to form an oxygen-deficient IGZO film on and in contact with the oxygen-excess IGZO film.

This oxygen-deficient IGZO film has a lower oxygen concentration than the oxygen-excess IGZO film. The oxygen-deficient IGZO film functions as a source region or a drain region.

Then, without exposure to air, the gate valve 87 is opened, and the substrate is transferred to the transfer chamber 80 by the transfer robot 81. The gate valve 88 is opened, the substrate is transferred to a fifth treatment chamber 93, and the gate valve 88 is closed.

In this embodiment, the fifth treatment chamber 93 is a sputtering chamber in which sputtering is performed using a DC magnetron sputtering method. In the fifth treatment chamber 93, a metal multi-layer film (conductive film) to be a source or drain electrode layer is formed. In the fifth treatment chamber 93 which is a sputtering chamber, both a titanium target and an aluminum target are placed. Films are formed to be stacked in the same chamber by successive formation using shutters. Here, an aluminum film is stacked over a titanium film, and a titanium film is further stacked over the aluminum film.

In this manner, in the case of using a gray-tone mask, the oxygen-excess SiOx film, the oxygen-excess IGZO film, the oxygen-deficient IGZO film, and the metal multi-layer film can be formed successively without being exposed to the air. In particular, an interface state of the oxygen-excess IGZO film can be stabilized, and the reliability of a TFT can be improved. If the substrate is exposed to the air before or after formation of the IGZO film, moisture or the like is attached and the interface state is adversely affected, which may cause defects such as variation in threshold voltages, deterioration in electrical characteristics, and a normally-on TFT. Moisture is a hydrogen compound. When the films are successively formed without being exposed to the air, the hydrogen compound can be prevented from existing at the interface of the IGZO film. Therefore, by successive formation of the four films, variation in threshold voltages can be reduced, deterioration in electrical characteristics can be prevented, or shift of the TFT characteristics to the normally-on side can be suppressed, or desirably, the shift of the TFT characteristics can be prevented.

Further, the oxygen-deficient IGZO film and the metal multi-layer film to be source and drain electrode layers are successively formed without being exposed to the air, whereby a favorable interface state between the oxygen-deficient IGZO film and the metal multi-layer film can be obtained and contact resistance can be reduced.

Alternatively, in the third treatment chamber 91 which is a sputtering chamber, both an artificial quartz target and an oxide semiconductor target containing In, Ga, and Zn are placed, and three films are successively formed by using shutters and sequentially introducing different gases; accordingly, the films can be stacked in the same chamber. Advantages of a process in which the films are stacked in the same chamber are the following points: reduction of the number of chambers which are used, and prevention of the attachment of particles or the like to the substrate during transfer of the substrate between different chambers.

After the above-described steps are repeated to perform a film formation process on the plurality of substrates in the cassette case, the cassette chamber that is in vacuum is opened to air, and the substrates and the cassette are taken out.

Further, heat treatment, specifically, heat treatment at 200° C. to 600° C., preferably, heat treatment at 300° C. to 500° C., can be performed in the first treatment chamber 89 after formation of the oxygen-excess IGZO film and the oxygen-deficient IGZO film. By this heat treatment, electrical characteristics of an inverted staggered thin film transistor can be improved. Timing of the heat treatment is not limited to a particular timing as long as the heat treatment is performed after formation of the oxygen-excess IGZO film and the oxygen-deficient IGZO film and can be performed immediately after formation of the oxygen-excess IGZO film and the oxygen-deficient IGZO film or immediately after formation of the metal multi-layer film, for example.

Then, each of the stacked films is processed by etching using a gray-tone mask. The films may be etched using dry etching or wet etching, or etched selectively by plural times of etching.

Vacuum baking may be performed after formation of a semiconductor layer, source and drain regions, and source and drain electrode layers by etching and before formation of a protective film.

In addition, oxygen radical treatment may be performed after the semiconductor layer, the source region, the drain region, and the source and drain electrode layers are formed by etching, and before the protective film is formed. When exposed part which is the channel formation region of the semiconductor layer is subjected to oxygen radical treatment, a surface of the semiconductor layer can be an oxygen-excess region.

When the surface of the semiconductor layer is an oxygen-excess region, hydrogen can be prevented from mixing to the semiconductor layer. In addition, a back channel becomes an oxygen-deficient region, which prevents conduction between the source and drain; therefore, off current can be reduced. In this manner, the back channel portion of the semiconductor layer can also be an oxygen-excess region; therefore, in a similar manner to oxygen radical treatment on the gate insulating layer, oxygen radical treatment on the back channel portion of the semiconductor layer is effective.

Steps after the etching are carried out in accordance with any one of Embodiments 1 to 4, whereby an inverted staggered thin film transistor can be manufactured.

In this embodiment, a multi-chamber manufacturing apparatus is described as an example, but successive formation may be performed without exposure to air by using an in-line manufacturing apparatus in which sputtering chambers are connected in series.

The apparatus illustrated in FIG. 22 has a so-called face-down treatment chamber in which the deposition target surface of the substrate faces downward, but may also have a vertical placement treatment chamber in which a substrate is placed vertically. The vertical placement treatment chamber has an advantage that a footprint is smaller than that of a face-down treatment chamber and can be effectively used in the case where a large-area substrate which may bend due to its own weight is used.

EMBODIMENT 7

A thin film transistor of an embodiment of the present invention is manufactured, and a semiconductor device having a display function (also referred to as a display device) can be manufactured using the thin film transistor in a pixel portion and further in a driver circuit. Further, part or whole of a driver circuit can be formed over the same substrate as a pixel portion, using a thin film transistor of an embodiment of the present invention, whereby a system-on-panel can be obtained.

The display device includes a display element. As the display element, a liquid crystal element (also referred to as a liquid crystal display element) or a light-emitting element (also referred to as a light-emitting display element) can be used.

Light-emitting elements include, in its category, an element whose luminance is controlled by current or voltage, and specifically include an inorganic electroluminescent (EL) element, an organic EL element, and the like. Further, a display medium whose contrast is changed by an electric effect, such as an electronic ink, can be used.

In addition, the display device includes a panel in which the display element is sealed, and a module in which an IC including a controller or the like is mounted on the panel. Furthermore, in an embodiment of the present invention, an element substrate, which corresponds to one embodiment before the display element is completed in a manufacturing process of the display device, is provided with a means for supplying current to the display element in each of a plurality of pixels. Specifically, the element substrate may be in a state of being provided with only a pixel electrode of the display element, a state after a conductive film to be a pixel electrode is formed and before the conductive film is etched to form the pixel electrode, or any of other states.

Note that a display device in this specification means an image display device, a display device, or a light source (including a lighting device). Further, the display device includes any of the following modules in its category: a module to which a connector such as a flexible printed circuit (FPC), tape automated bonding (TAB) tape, or a tape carrier package (TCP) is attached; a module having TAB tape or a TCP which is provided with a printed wiring board at the end thereof; and a module having an integrated circuit (IC) which is directly mounted on a display element by a chip-on-glass (COG) method.

In this embodiment, an example of a liquid crystal display device will be described as an embodiment of a semiconductor device.

Figure 23A:
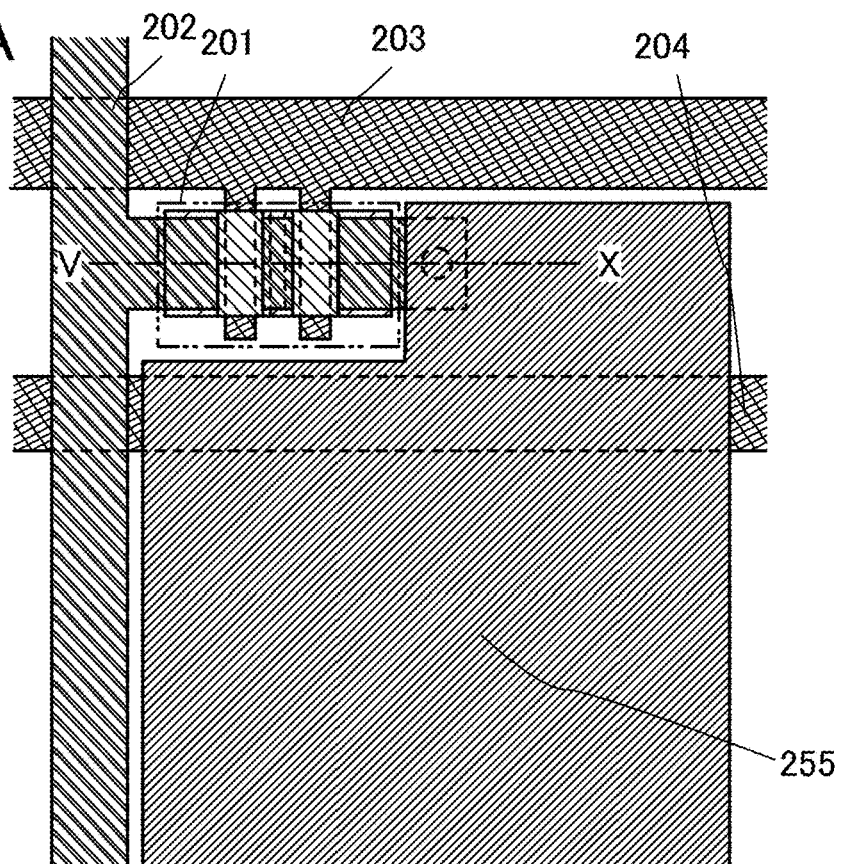
FIGS. 23A and 23B illustrate a semiconductor device of an embodiment of the present invention.
Figure 23B:
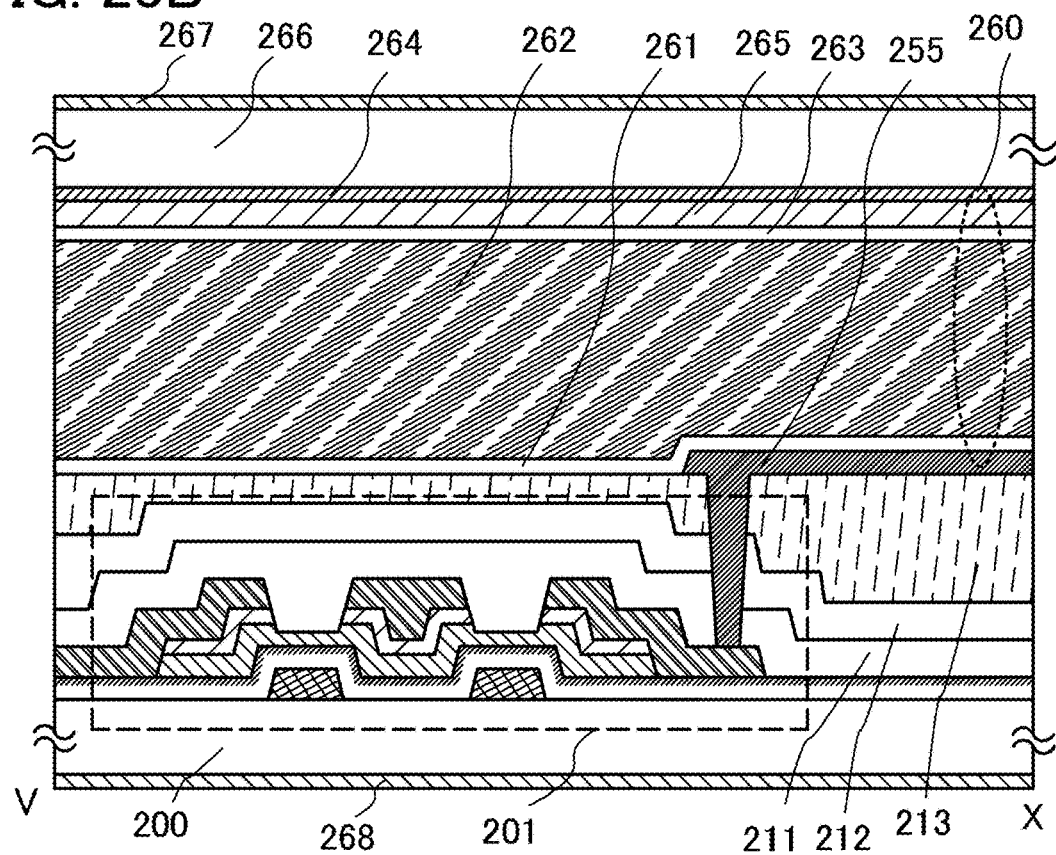

FIGS. 23A and 23B illustrate an active matrix liquid crystal display device to which the present invention is applied. FIG. 23A is a plan view of the liquid crystal display device. FIG. 23B is a cross-sectional view taken along a line V-X of FIG. 23A. A thin film transistor 201 used in a semiconductor device can be manufactured in a manner similar to the thin film transistor described in Embodiment 2 and is a highly reliable thin film transistor including an oxygen-excess oxide semiconductor layer and an oxygen-deficient oxide semiconductor layer over a gate insulating layer which has been subjected to oxygen radical treatment. The thin film transistor described in Embodiment 1, 3, or 4 can also be used as the thin film transistor 201 of this embodiment.

The liquid crystal display device of this embodiment illustrated in FIG. 23A includes a source wiring layer 202, the thin film transistor 201 which is an inverted staggered thin film transistor with a multi-gate structure, a gate wiring layer 203, and a capacitor wiring layer 204.

Further, in FIG. 23B, in the liquid crystal display device of this embodiment, a substrate 200 provided with the thin film transistor 201 with a multi-gate structure, an insulating layer 211, an insulating layer 212, an insulating layer 213, an electrode layer 255 used for a display element, an insulating layer 261 serving as an alignment film, and a polarizing plate 268 and a substrate 266 provided with an insulating layer 263 serving as an alignment film, an electrode layer 265 used for a display element, a coloring layer 264 serving as a color filter, and a polarizing plate 267 face to each other with a liquid crystal layer 262 interposed therebetween; thus, a liquid crystal display element 260 is formed.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase is generated within an only narrow range of temperature, liquid crystal composition containing a chiral agent at 5 wt % or more so as to improve the temperature range is used for the liquid crystal layer 262. The liquid crystal composition which includes liquid crystal exhibiting a blue phase and a chiral agent have such characteristics that the response time is 10 μs to 100 μs, which is short, the alignment process is unnecessary because the liquid crystal composition has optical isotropy, and viewing angle dependency is small.

Although FIGS. 23A and 23B illustrate an example of a transmissive liquid crystal display device, the present invention can also be applied to a reflective liquid crystal display device and a transflective liquid crystal display device.

Although FIGS. 23A and 23B illustrate an example of a liquid crystal display device in which the polarizing plate 267 is provided on the outer side of the substrate 266 (on the viewer side) and the coloring layer 264 and the electrode layer 265 used for a display element are provided on the inner side of the substrate 266 in that order, the polarizing plate 267 may be provided on the inner side of the substrate 266. The stacked structure of the polarizing plate and the coloring layer is not limited to that illustrated in FIG. 23B and may be set as appropriate depending on materials of the polarizing plate and the coloring layer or conditions of manufacturing steps. Further, a light-blocking film serving as a black matrix may be provided.

In this embodiment, in order to reduce surface unevenness of the thin film transistor and to improve reliability of the thin film transistor, the thin film transistor obtained in Embodiment 1 is covered with insulating layers (the insulating layer 211, the insulating layer 212, and the insulating layer 213) functioning as a protective film or a planarizing insulating film. Note that the protective film is provided to prevent entry of contaminant impurities such as an organic substance, a metal, or moisture floating in air and is preferably a dense film. The protective film may be formed by a sputtering method with a single layer or a stacked layer of a silicon oxide film, a silicon nitride film, a silicon oxynitride film, a silicon nitride oxide film, an aluminum oxide film, an aluminum nitride film, an aluminum oxynitride film, and/or an aluminum nitride oxide film. Although an example in which the protective film is formed by a sputtering method is described in this embodiment, the present invention is not particularly limited thereto, and the protective film may be formed by a variety of methods.

As a first layer of the protective film, the insulating layer 211 is formed. The insulating layer 211 has an effect of preventing hillock of an aluminum film. Here, as the insulating layer 211, a silicon oxide film is formed by a sputtering method.

As a second layer of the protective film, the insulating layer 212 is formed. Here, as the insulating layer 212, a silicon nitride film is formed by a sputtering method. The use of the silicon nitride film as one layer of the protective film can prevent mobile ions of sodium or the like from entering a semiconductor region so that variation in electrical characteristics of the TFT can be suppressed.

After the protective film is formed, the IGZO semiconductor layer may be subjected to annealing (300° C. to 400° C.).

In addition, the insulating layer 213 is formed as the planarizing insulating film. As the insulating layer 213, an organic material having heat resistance such as polyimide, acrylic, benzocyclobutene, polyamide, or epoxy can be used. Other than such organic materials, it is also possible to use a low-dielectric constant material (a low-k material), a siloxane-based resin, phosphosilicate glass (PSG), borophosphosilicate glass (BPSG), or the like. A siloxane-based resin may include as a substituent at least one of fluorine, an alkyl group, and an aryl group, as well as hydrogen. Note that the insulating layer 213 may be formed by stacking a plurality of insulating films formed of these materials.

Note that a siloxane-based resin is a resin formed from a siloxane material as a starting material and having the bond of Si—O—Si. The siloxane-based resin may include as a substituent at least one of fluorine, an alkyl group, and aromatic hydrocarbon, as well as hydrogen.

A method for forming the insulating layer 213 is not particularly limited, and the following method can be employed depending on the material: a sputtering method, an SOG method, a spin coating method, a dipping method, a spray coating method, a droplet discharge method (e.g., an ink-jet method, screen printing, offset printing, or the like), a doctor knife, a roll coater, a curtain coater, a knife coater, or the like. In the case of forming the insulating layer 213 using a material solution, annealing (300° C. to 400° C.) of the IGZO semiconductor layer may be performed at the same time as a baking step. The baking step of the insulating layer 213 also serves as annealing of the IGZO semiconductor layer, whereby a semiconductor device can be manufactured efficiently.

The electrode layers 255 and 265 each serving as a pixel electrode layer can be formed using a light-transmitting conductive material such as indium oxide including tungsten oxide, indium zinc oxide including tungsten oxide, indium oxide including titanium oxide, indium tin oxide including titanium oxide, indium tin oxide (hereinafter referred to as ITO), indium zinc oxide, indium tin oxide to which silicon oxide is added, or the like.

The electrode layers 255 and 265 can also be formed using a conductive composition including a conductive high molecule (also referred to as a conductive polymer). A pixel electrode formed using the conductive composition preferably has a sheet resistance of less than or equal to 10000 Ω/square and a light transmittance of greater than or equal to 70% at a wavelength of 550 nm. Further, the resistivity of the conductive high molecule included in the conductive composition is preferably less than or equal to 0.1 Ω·cm.

As the conductive high molecule, a so-called π-electron conjugated conductive polymer can be used. For example, polyaniline or a derivative thereof, polypyrrole or a derivative thereof, polythiophene or a derivative thereof, a copolymer of two or more kinds of them, and the like can be given.

Through this process, a highly reliable liquid crystal display device as a semiconductor device can be manufactured.

This embodiment can be combined with any of the other embodiments as appropriate.

EMBODIMENT 8

In this embodiment, an example of electronic paper will be described as a semiconductor device according to an embodiment of the present invention.

Figure 30:
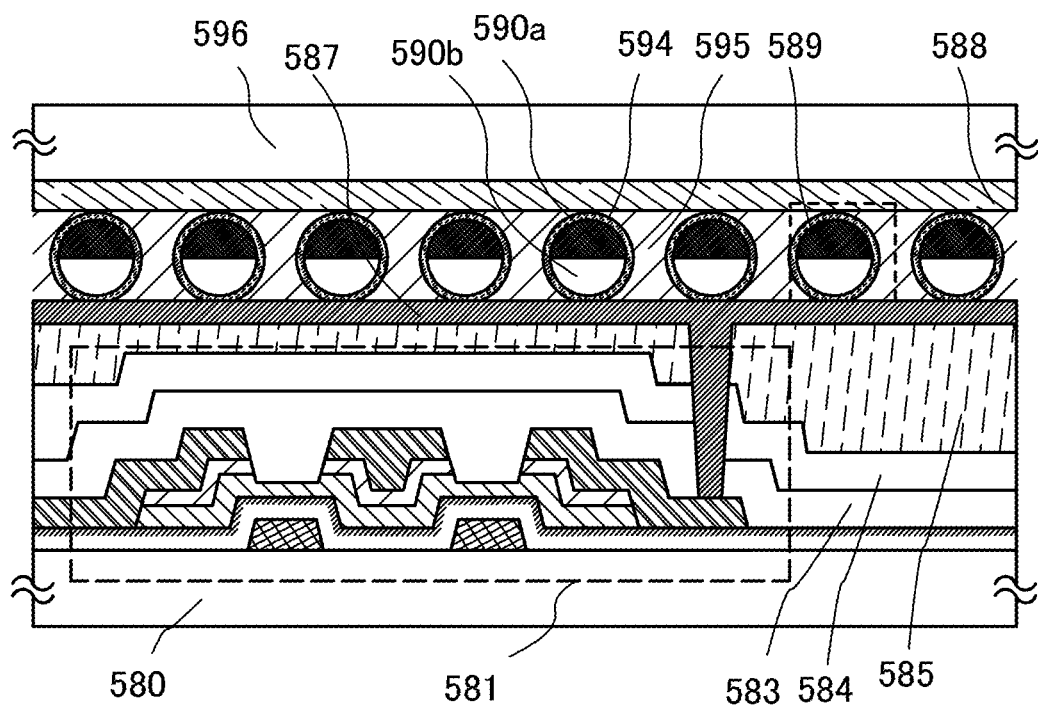
FIG. 30 illustrates a semiconductor device of an embodiment of the present invention.

FIG. 30 illustrates active matrix electronic paper as an example of a semiconductor device to which an embodiment of the present invention is applied. A thin film transistor 581 used for the semiconductor device can be manufactured in a similar manner to the thin film transistor described in Embodiment 2. The thin film transistor 581 is a thin film transistor having high reliability, which includes an oxygen-excess oxide semiconductor layer over a gate insulating layer subjected to oxygen radical treatment and oxygen-deficient oxide semiconductor layers functioning as source and drain regions. Any of the thin film transistors described in Embodiments 1, 3, and 4 can also be used as the thin film transistor 581 of this embodiment.

The electronic paper in FIG. 30 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 is an inverted staggered thin film transistor with a multi-gate structure, and a source electrode layer or a drain electrode layer thereof is in contact with a first electrode layer 587 at an opening formed in an insulating layer 585, whereby the thin film transistor 581 is electrically connected to the first electrode layer 587. Between the first electrode layer 587 and a second electrode layer 588, spherical particles 589 each having a black region 590a, a white region 590b, and a cavity 594 around the regions which is filled with liquid are provided. A space around the spherical particles 589 is filled with a filler 595 such as a resin (see FIG. 30).

Further, instead of the twisting ball, an electrophoretic element can also be used. A microcapsule having a diameter of about 10 μm to 200 μm in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and black microparticles move to opposite sides, so that white or black can be displayed. A display element using this principle is an electrophoretic display element and is called electronic paper in general. The electrophoretic display element has higher reflectivity than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

Through this process, highly reliable electronic paper can be manufactured as a semiconductor device.

This embodiment can be combined with the structure described in other embodiments, as appropriate.

EMBODIMENT 9

In this embodiment, an example of a light-emitting display device will be described as a semiconductor device according an embodiment of the present invention. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made here using an organic EL element as a light-emitting element.

Figure 26A:
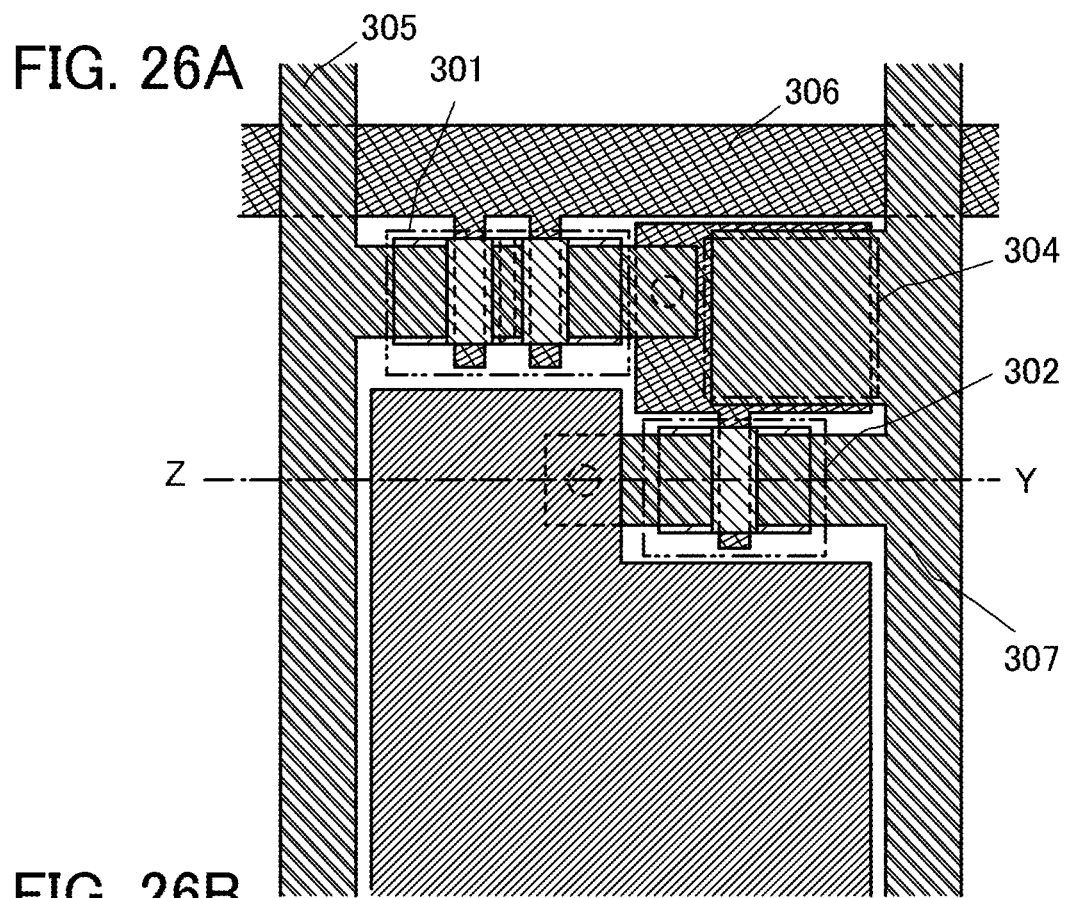
FIGS. 26A and 26B illustrate a semiconductor device of an embodiment of the present invention.
Figure 26B:
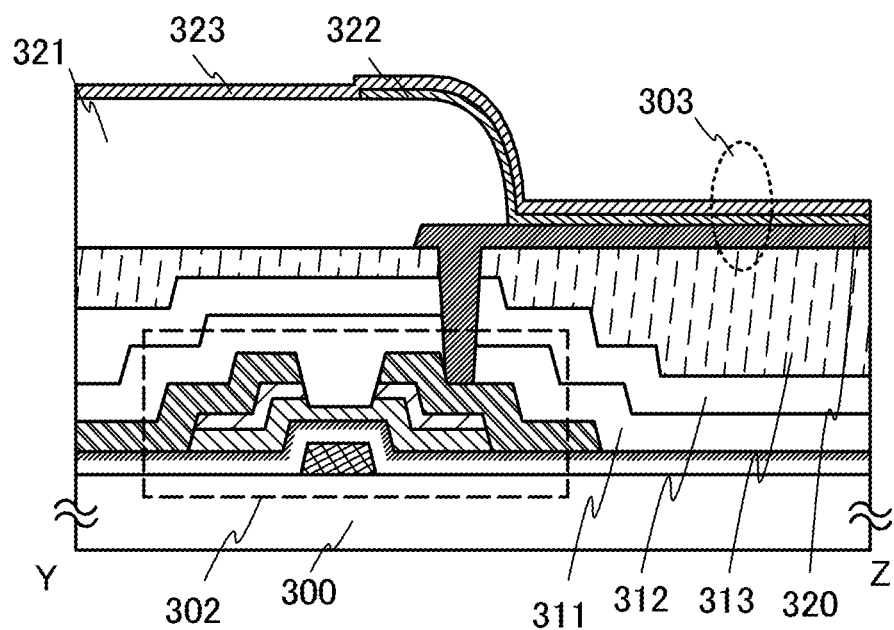
Figure 27:
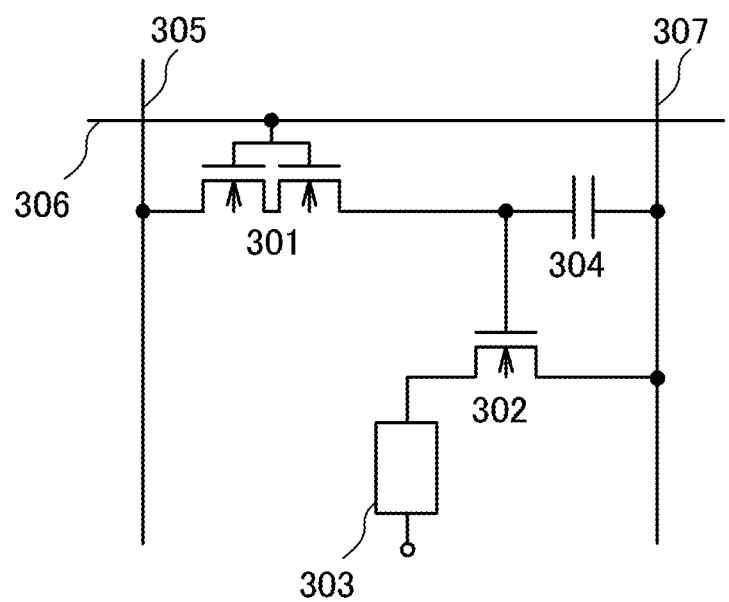
FIG. 27 illustrates a semiconductor device of an embodiment of the present invention.

FIGS. 26A and 26B illustrate an active matrix light-emitting display device as an example of a semiconductor device to which an embodiment of the present invention is applied. FIG. 26A is a plan view of the light-emitting display device, and FIG. 26B is a cross-sectional view along line Y-Z of FIG. 26A. FIG. 27 shows an equivalent circuit of the light-emitting display device illustrated in FIGS. 26A and 26B.

Thin film transistors 301 and 302 used for the semiconductor device can be manufactured in a similar manner to the thin film transistors described in Embodiment 1 and Embodiment 2. The thin film transistors 301 and 302 are thin film transistors having high reliability, each of which includes an oxygen-excess oxide semiconductor layer over a gate insulating layer subjected to oxygen radical treatment and oxygen-deficient oxide semiconductor layers functioning as source and drain regions. The thin film transistor described in Embodiments 3 or 4 can also be used as the thin film transistors 301 and 302 of this embodiment.

The light-emitting display device of this embodiment illustrated in FIG. 26A and FIG. 26B includes the thin film transistors 301 with a multi-gate structure, the thin film transistor 302, a light-emitting element 303, a capacitor element 304, a source wiring layer 305, a gate wiring layer 306, and a power source line 307. The thin film transistors 301 and 302 are n-channel thin film transistors.

In FIG. 26B, the light-emitting display device of this embodiment includes the thin film transistor 302; an insulating layer 311; an insulating layer 312; an insulating layer 313; a partition wall 321; and a first electrode layer 320, an electroluminescent layer 322, and a second electrode layer 323 which are used for the light-emitting element 303.

The insulating layer 313 is preferably formed using an organic resin such as acrylic, polyimide, or polyamide or using siloxane.

Since the thin film transistor 302 in the pixel is n-type in this embodiment, the first electrode layer 320 which is a pixel electrode layer is desirably used as a cathode. Specifically, for the cathode, a material with a low work function such as Ca, Al, MgAg, or AlLi can be used.

The partition wall 321 is formed using an organic resin film, an inorganic insulating film, or organic polysiloxane. It is particularly preferable that the partition wall 321 be formed using a photosensitive material and an opening be formed over the first electrode layer 320 so that a sidewall of the opening is formed as an inclined surface with continuous curvature.

The electroluminescent layer 322 may be formed using a single layer or a plurality of layers stacked.

The second electrode layer 323 used as an anode is formed to cover the electroluminescent layer 322. The second electrode layer 323 can be formed using a light-transmitting conductive film using any of the light-transmitting conductive materials listed in Embodiment 7 for the pixel electrode layer. The second electrode layer 323 may also be formed using a titanium nitride film or a titanium film instead of the above-described light-transmitting conductive film. The light-emitting element 303 is formed by overlapping of the first electrode layer 320, the electroluminescent layer 322, and the second electrode layer 323. After that, a protective film may be formed over the second electrode layer 323 and the partition wall 321 in order to prevent entry of oxygen, hydrogen, moisture, carbon dioxide, or the like into the light-emitting element 303. As the protective film, a silicon nitride film, a silicon nitride oxide film, a DLC film, or the like can be formed.

Further, in a practical case, it is preferable that a display device completed to the state illustrated in FIG. 26B be packaged (sealed) with a protective film (such as a laminate film or an ultraviolet curable resin film) or a cover material with high air-tightness and little degasification so that the display device is not exposed to the outside air.

Next, structures of the light-emitting element will be described with reference to FIGS. 28A to 28C. A cross-sectional structure of a pixel will be described by taking an n-channel driving TFT as an example. TFTs 7001, 7011, and 7021 which are driving TFTs used for the semiconductor devices of FIGS. 28A to 28C can be manufactured in a similar manner to the thin film transistor described in Embodiment 1. The TFTs 7001, 7011, and 7021 are thin film transistors having high reliability, each of which includes an oxygen-excess oxide semiconductor layer over a gate insulating layer subjected to oxygen radical treatment and oxygen-deficient oxide semiconductor layers functioning as source and drain regions. Alternatively, any of the thin film transistors described in Embodiments 2 to 4 can be employed as the driving TFTs 7001, 7011, and 7021.

In order to extract light emitted from the light-emitting element, at least one of the anode and the cathode is required to be transparent. A thin film transistor and a light-emitting element are formed over a substrate. A light-emitting element can have a top emission structure in which light emission is extracted through the surface opposite to the substrate; a bottom emission structure in which light emission is extracted through the surface on the substrate side; or a dual emission structure in which light emission is extracted through the surface opposite to the substrate and the surface on the substrate side. The pixel structure according to an embodiment of the present invention can be applied to a light-emitting element having any of these emission structures.

Figure 28A:
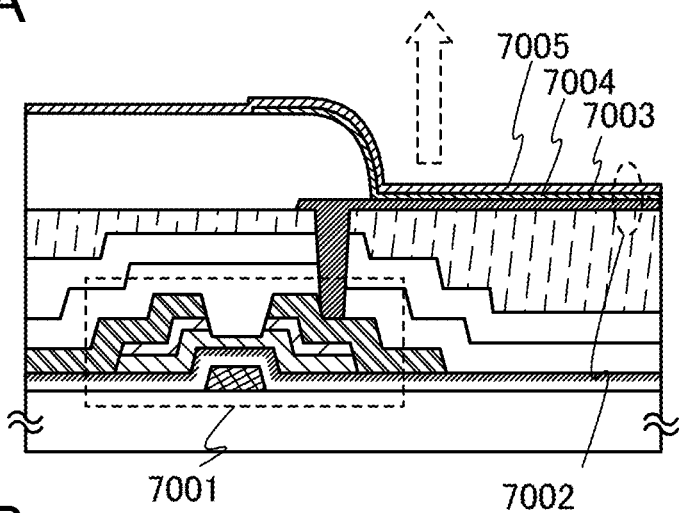
FIGS. 28A to 28C each illustrate a semiconductor device of an embodiment of the present invention.

A light-emitting element having a top emission structure will be described with reference to FIG. 28A FIG. 28A is a cross-sectional view of a pixel in the case where the driving TFT 7001 is of an n-type and light is emitted from a light-emitting element 7002 to an anode 7005 side. In FIG. 28A, a cathode 7003 of the light-emitting element 7002 is electrically connected to the driving TFT 7001, and a light-emitting layer 7004 and the anode 7005 are stacked in this order over the cathode 7003. The cathode 7003 can be formed using a variety of conductive materials as long as they have a low work function and reflect light. For example, Ca, Al, CaF, MgAg, AlLi, or the like is preferably used. The light-emitting layer 7004 may be formed using a single layer or a plurality of layers stacked. When the light-emitting layer 7004 is formed using a plurality of layers, the light-emitting layer 7004 is formed by stacking an electron-injecting layer, an electron-transporting layer, a light-emitting layer, a hole-transporting layer, and a hole-injecting layer in this order over the cathode 7003. It is not necessary to form all of these layers. The anode 7005 is formed using a light-transmitting conductive film such as a film of indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

The light-emitting element 7002 corresponds to a region where the cathode 7003 and the anode 7005 sandwich the light-emitting layer 7004. In the case of the pixel illustrated in FIG. 28A, light is emitted from the light-emitting element 7002 to the anode 7005 side as indicated by an arrow.

Next, a light-emitting element having a bottom emission structure will be described with reference to FIG. 28B. FIG. 28B is a cross-sectional view of a pixel in the case where the driving TFT 7011 is of an n-type and light is emitted from a light-emitting element 7012 to a cathode 7013 side. In FIG. 28B, the cathode 7013 of the light-emitting element 7012 is formed over a light-transmitting conductive film 7017 that is electrically connected to the driving TFT 7011, and a light-emitting layer 7014 and an anode 7015 are stacked in this order over the cathode 7013. A light-blocking film 7016 for reflecting or blocking light may be formed to cover the anode 7015 when the anode 7015 has a light-transmitting property. For the cathode 7013, various materials can be used as in the case of FIG. 28A as long as they are conductive materials having a low work function. The cathode 7013 is formed to have a thickness that can transmit light (preferably, approximately 5 nm to 30 nm). For example, an aluminum film with a thickness of 20 nm can be used as the cathode 7013. In a manner similar to the case of FIG. 28A, the light-emitting layer 7014 may be formed using either a single layer or a plurality of layers stacked. The anode 7015 is not required to transmit light, but can be formed using a light-transmitting conductive material as in the case of FIG. 28A. As the light-blocking film 7016, a metal or the like that reflects light can be used for example; however, it is not limited to a metal film. For example, a resin or the like to which black pigments are added can also be used.

The light-emitting element 7012 corresponds to a region where the cathode 7013 and the anode 7015 sandwich the light-emitting layer 7014. In the case of the pixel illustrated in FIG. 28B, light is emitted from the light-emitting element 7012 to the cathode 7013 side as indicated by an arrow.

Next, a light-emitting element having a dual emission structure will be described with reference to FIG. 28C. In FIG. 28C, a cathode 7023 of a light-emitting element 7022 is formed over a light-transmitting conductive film 7027 which is electrically connected to the driving TFT 7021, and a light-emitting layer 7024 and an anode 7025 are stacked in this order over the cathode 7023. As in the case of FIG. 28A, the cathode 7023 can be formed using a variety of conductive materials as long as they have a low work function. The cathode 7023 is formed to have a thickness that can transmit light. For example, a film of Al having a thickness of 20 nm can be used as the cathode 7023. As in FIG. 28A, the light-emitting layer 7024 may be formed using either a single layer or a plurality of layers stacked. The anode 7025 can be formed using a light-transmitting conductive material as in the case of FIG. 28A.

The light-emitting element 7022 corresponds to a region where the cathode 7023, the light-emitting layer 7024, and the anode 7025 overlap with one another. In the case of the pixel illustrated in FIG. 28C, light is emitted from the light-emitting element 7022 to both the anode 7025 side and the cathode 7023 side as indicated by arrows.

Note that, although an organic EL element is described here as a light-emitting element, an inorganic EL element can also be provided as a light-emitting element.

In this embodiment, the example is described in which a thin film transistor (a driving TFT) which controls the driving of a light-emitting element is electrically connected to the light-emitting element; however, a structure may be employed in which a current control TFT is connected between the driving TFT and the light-emitting element.

Figure 28B:
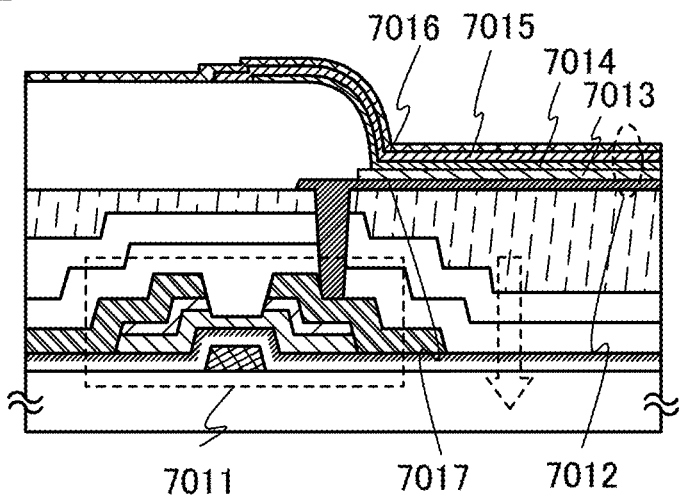
Figure 28C:
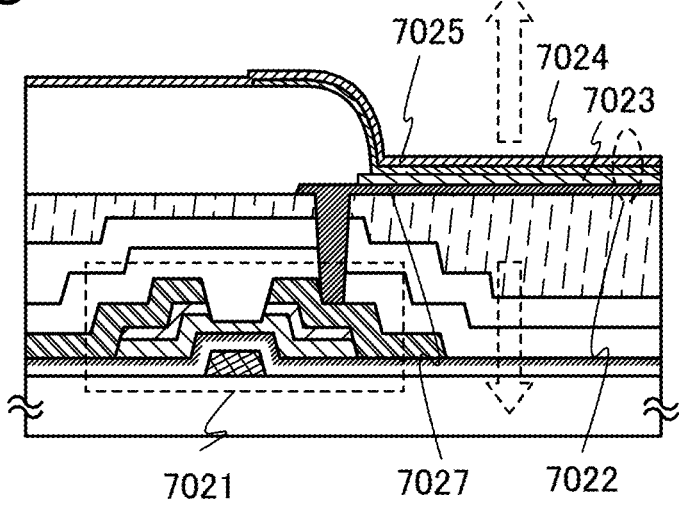

A semiconductor device described in this embodiment is not limited to the structures illustrated in FIGS. 28A to 28C and can be reformed in various ways based on the spirit of techniques according to the present invention Through this process, a highly reliable light-emitting display device can be manufactured as a semiconductor device.

This embodiment can be combined with the structure described in other embodiments, as appropriate.

EMBODIMENT 10

Next, a structure of a display panel, which is an embodiment of the semiconductor device of the present invention, will be described below. In this embodiment, a liquid crystal display panel (also referred to as a liquid crystal panel), which is one embodiment of a liquid crystal display device having a liquid crystal element as a display element, and a light-emitting display panel (also referred to as a light-emitting panel), which is one embodiment of a semiconductor device having a light-emitting element as a display element, will be described.

The appearance and a cross section of a light-emitting display panel, which is one embodiment of the semiconductor device of the present invention, will be described with reference to FIGS. 29A and 29B. FIG. 29A is a top view of a panel in which a light-emitting element and a thin film transistor having high reliability are sealed with a sealant between a first substrate and a second substrate. The thin film transistor includes an oxygen-excess oxide semiconductor layer over a gate insulating layer which is formed over the first substrate and which is subjected to oxygen radical treatment, and oxygen-deficient oxide semiconductor layers functioning as source and drain regions. FIG. 29B is a cross-sectional view taken along a line H-I of FIG. 29A.

A sealant 4505 is provided so as to surround a pixel portion 4502, signal line driver circuits 4503a and 4503b, and scanning line driver circuits 4504a and 4504b which are provided over a first substrate 4501. In addition, a second substrate 4506 is provided over the pixel portion 4502, the signal line driver circuits 4503a and 4503b, and the scanning line driver circuits 4504a and 4504b. Accordingly, the pixel portion 4502, the signal line driver circuits 4503a and 4503b, and the scanning line driver circuits 4504a and 4504b are sealed together with a filler 4507, by the first substrate 4501, the sealant 4505, and the second substrate 4506.

The pixel portion 4502, the signal line driver circuits 4503a and 4503b, and the scanning line driver circuits 4504a and 4504b formed over the first substrate 4501 each include a plurality of thin film transistors, and a thin film transistor 4510 included in the pixel portion 4502 and a thin film transistor 4509 included in the signal line driver circuit 4503a are illustrated as examples in FIG. 29B.

The thin film transistors 4509 and 4510 correspond to thin film transistors having high reliability, each of which includes an oxygen-excess oxide semiconductor layer over a gate insulating layer subjected to oxygen radical treatment, and oxygen-deficient oxide semiconductor layers functioning as source and drain regions. The thin film transistor described in Embodiment 1, Embodiment 2, Embodiment 3, or Embodiment 4 can be used for the thin film transistors 4509 and 4510. In this embodiment, the thin film transistors 4509 and 4510 are n-channel thin film transistors.

Moreover, reference numeral 4511 denotes a light-emitting element. A first electrode layer 4517 which is a pixel electrode included in the light-emitting element 4511 is electrically connected to a source electrode layer or a drain electrode layer of the thin film transistor 4510. Note that a structure of the light-emitting element 4511 is not limited to that described in this embodiment. The structure of the light-emitting element 4511 can be changed as appropriate depending on the direction in which light is extracted from the light-emitting element 4511, or the like.

In addition, a variety of signals and a potential are supplied to the signal line driver circuits 4503a and 4503b, the scanning line driver circuits 4504a and 4504b, or the pixel portion 4502 from FPCs 4518a and 4518b.

In this embodiment, a connection terminal 4515 is formed with the same conductive film as that for forming a second electrode layer 4512, and a wiring 4516 is formed with the same conductive film as that for forming the first electrode layer 4517 included in the light-emitting element 4511.

The connection terminal 4515 is electrically connected to a terminal included in the FPC 4518a through an anisotropic conductive film 4519.

The second substrate 4506 located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin can be used, in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. In this embodiment, nitrogen is used for the filler 4507.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

The signal line driver circuits 4503a and 4503b and the scanning line driver circuits 4504a and 4504b may be mounted as driver circuits formed using a single crystal semiconductor film or polycrystalline semiconductor film over a substrate separately prepared. In addition, only the signal line driver circuits or part thereof, or the scanning line driver circuits or part thereof may be separately formed and mounted. This embodiment is not limited to the structure illustrated in FIGS. 29A and 29B.

Figure 24A:
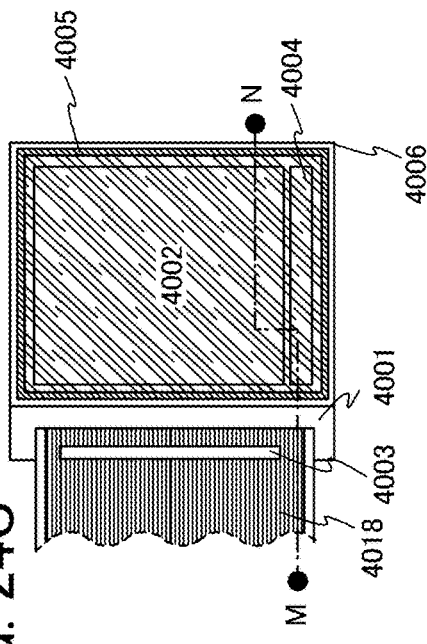
FIGS. 24A to 24C illustrate a semiconductor device of an embodiment of the present invention.
Figure 24C:
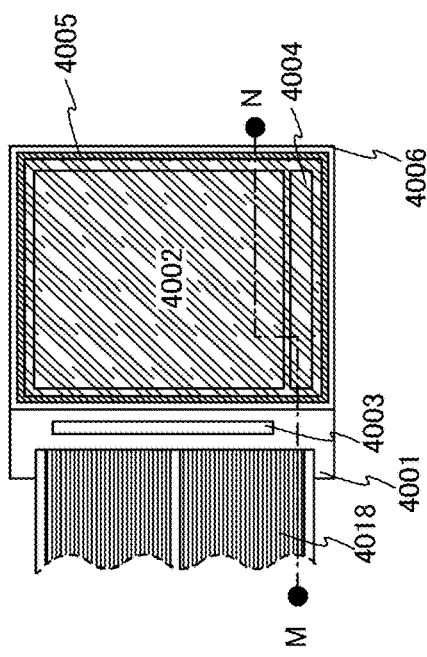
Figure 24B:
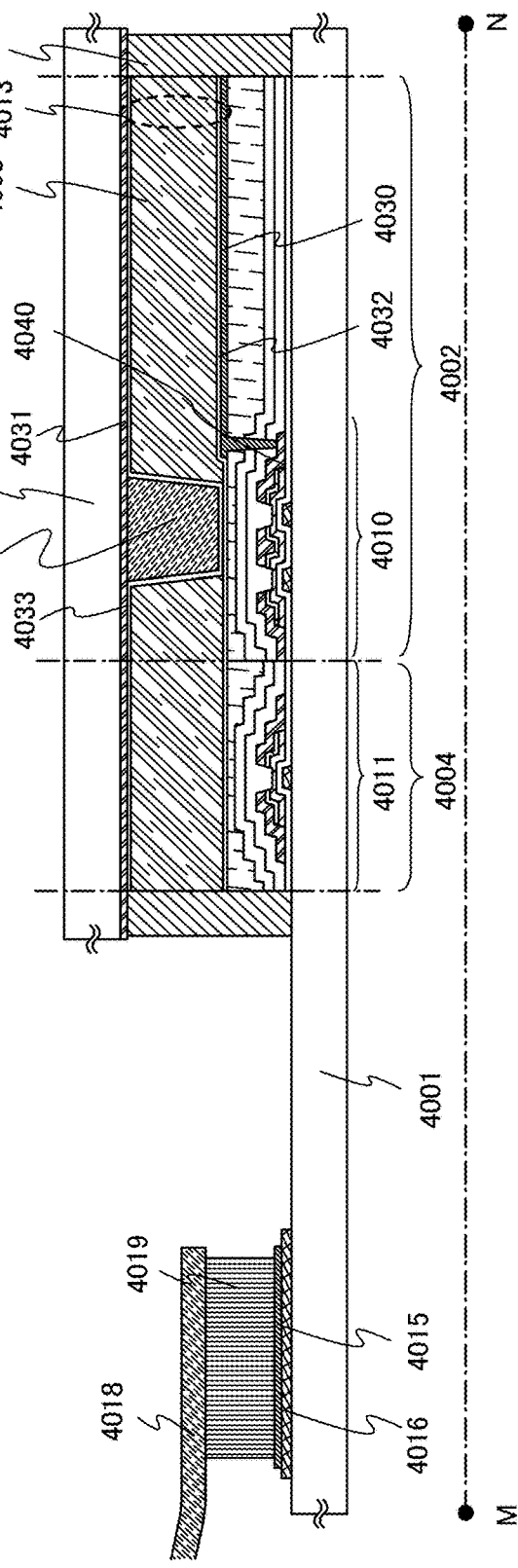

Next, the appearance and a cross section of a liquid crystal display panel, which is one embodiment of the semiconductor device of the present invention, will be described with reference to FIGS. 24A to 24B. FIGS. 24A and 24B each illustrate a top view of a panel in which a liquid crystal element 4013 and thin film transistors 4010 and 4011 having high reliability are sealed with a sealant 4005 between a first substrate 4001 and a second substrate 4006. Each of the thin film transistors 4010 and 4011 includes an oxygen-excess oxide semiconductor layer over a gate insulating layer which is formed over the first substrate 4001 and which is subjected to oxygen radical treatment, and oxygen-deficient oxide semiconductor layers functioning as source and drain regions. FIG. 24B is a cross-sectional view taken along a line M-N of FIGS. 24A and 24B.

The sealant 4005 is provided so as to surround a pixel portion 4002 and a scanning line driver circuit 4004 which are provided over the first substrate 4001. The second substrate 4006 is provided over the pixel portion 4002 and the scanning line driver circuit 4004. Therefore, the pixel portion 4002 and the scanning line driver circuit 4004 are sealed together with liquid crystal 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that the connection method of a driver circuit which is separately formed is not particularly limited, and a COG method, a wire bonding method, a TAB method, or the like can be used. FIG. 24A illustrates an example of mounting the signal line driver circuit 4003 by a COG method, and FIG. 24C illustrates an example of mounting the signal line driver circuit 4003 by a TAB method.

The pixel portion 4002 and the scanning line driver circuit 4004 provided over the first substrate 4001 each include a plurality of thin film transistors. FIG. 24B illustrates the thin film transistor 4010 included in the pixel portion 4002 and the thin film transistor 4011 included in the scanning line driver circuit 4004.

The thin film transistors 4010 and 4011 correspond to thin film transistors having high reliability, each of which includes an oxygen-excess oxide semiconductor layer over a gate insulating layer subjected to oxygen radical treatment, and oxygen-deficient oxide semiconductor layers functioning as source and drain regions. The thin film transistor described in Embodiment 1, Embodiment 2, Embodiment 3, or Embodiment 4 can be used for the thin film transistors 4010 and 4011. In this embodiment, the thin film transistors 4010 and 4011 are n-channel thin film transistors.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 respectively which each function as an alignment film, and sandwich the liquid crystal layer 4008 with the insulating layers 4032 and 4033 interposed therebetween.

Note that the first substrate 4001 and the second substrate 4006 can be formed by using glass, metal (typically, stainless steel), ceramic, or plastic. As an example of plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

Reference numeral 4035 denotes a columnar spacer obtained by selectively etching an insulating film and is provided to control the distance between the pixel electrode layer 4030 and the counter electrode layer 4031 (a cell gap). Further, a spherical spacer may also be used.

Further, a variety of signals and a potential are supplied to the signal line driver circuit 4003 which is formed separately, the scanning line driver circuit 4004, or the pixel portion 4002 from an FPC 4018.

In this embodiment, a connection terminal 4015 is formed with the same conductive film as that for the pixel electrode layer 4030 included in the liquid crystal element 4013, and a wiring 4016 is formed with the same conductive film as that for gate electrode layers of the thin film transistors 4010 and 4011.

The connection terminal 4015 is electrically connected to a terminal included in the FPC 4018 through an anisotropic conductive film 4019.

Note that FIGS. 20A to 20C illustrate an example in which the signal line driver circuit 4003 is formed separately and mounted on the first substrate 4001; however, this embodiment is not limited to this structure. The scanning line driver circuit may be separately formed and then mounted, or only part of the signal line driver circuit or part of the scanning line driver circuit may be separately formed and then mounted.

Figure 25:
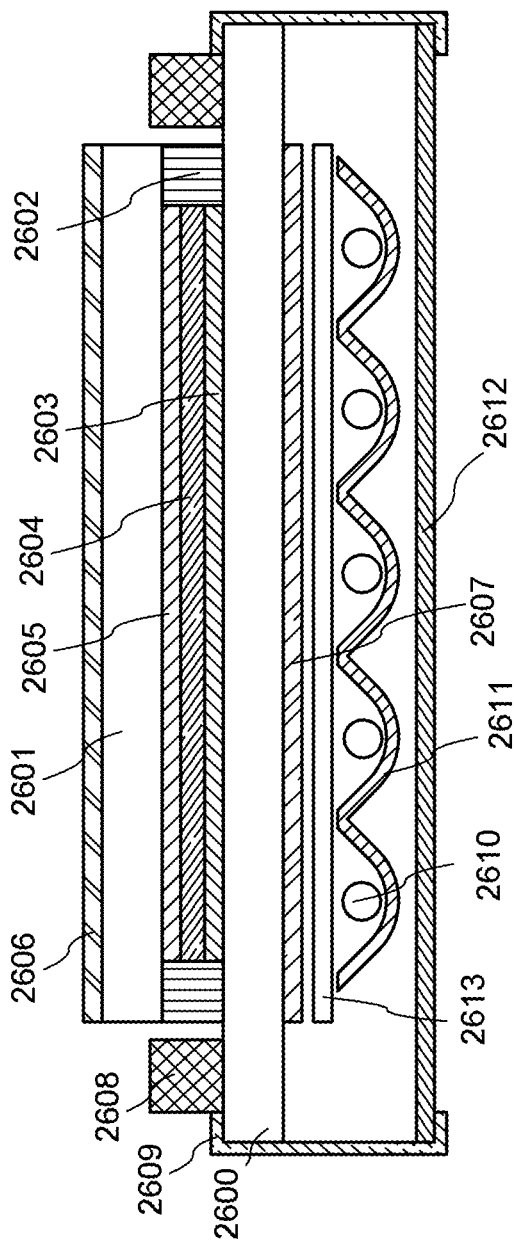
FIG. 25 illustrates a semiconductor device of an embodiment of the present invention.

FIG. 25 illustrates an example in which a liquid crystal display module is formed as a semiconductor device by using a TFT substrate 2600 manufactured according to an embodiment of the present invention.

FIG. 25 illustrates an example of a liquid crystal display module, in which the TFT substrate 2600 and a counter substrate 2601 are fixed to each other with a sealant 2602, and a pixel portion 2603 including a TFT or the like, a display element 2604 including a liquid crystal layer, and a coloring layer 2605 are provided between the substrates to form a display region. The coloring layer 2605 is necessary to perform color display. In the case of the RGB system, coloring layers corresponding to colors of red, green, and blue are provided for respective pixels. Polarizing plates 2606 and 2607 and a diffusion plate 2613 are provided outside the TFT substrate 2600 and the counter substrate 2601. A light source includes a cold cathode tube 2610 and a reflective plate 2611, and a circuit substrate 2612 is connected to a wiring circuit portion 2608 of the TFT substrate 2600 through a flexible wiring board 2609 and includes an external circuit such as a control circuit or a power source circuit. The polarizing plate and the liquid crystal layer may be stacked with a retardation plate interposed therebetween.

For the liquid crystal display module, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (anti-ferroelectric liquid crystal) mode, or the like can be used.

Through this process, a highly reliable display panel can be manufactured as a semiconductor device.

This embodiment can be combined with the structure described in other embodiments, as appropriate.

EMBODIMENT 11

A semiconductor device according to an embodiment of the present invention can be applied to electronic paper. Electronic paper can be used for electronic appliances of a variety of fields as long as they can display data. For example, electronic paper can be applied to an electronic book device (e-book reader), a poster, an advertisement in a vehicle such as a train, displays of various cards such as a credit card, and the like. Examples of the electronic appliances are illustrated in FIGS. 31A and 31B and FIG. 32.

Figure 31A:
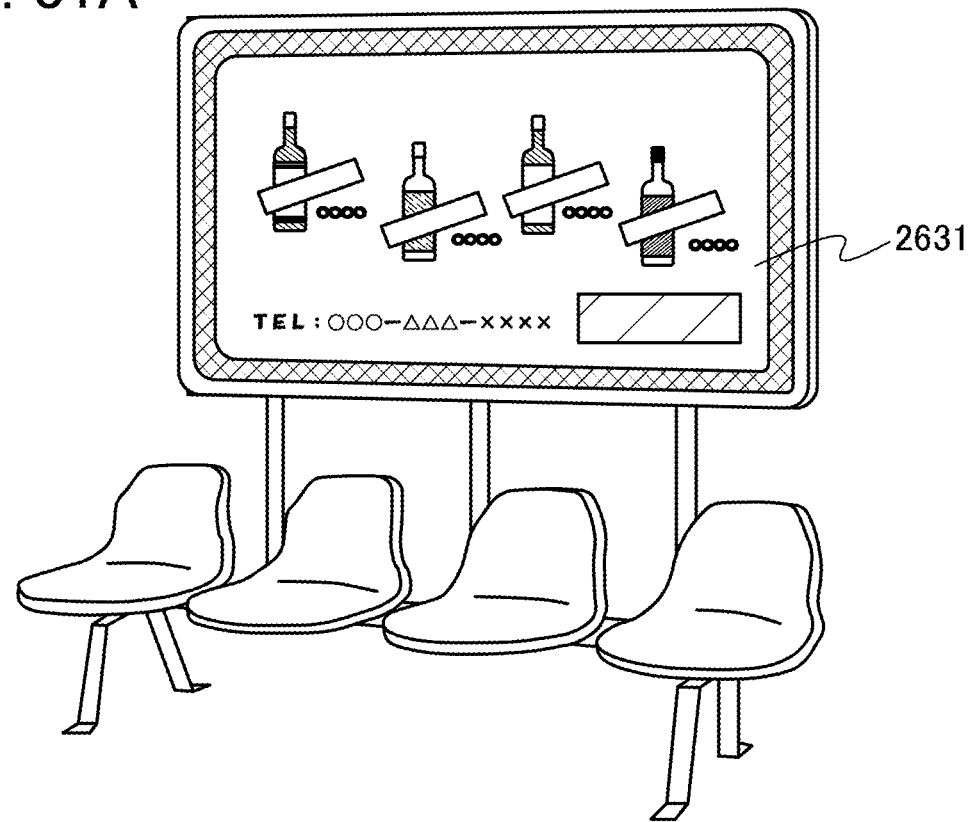
FIGS. 31A and 31B each illustrate an example of a usage pattern of electronic paper.

FIG. 31A illustrates a poster 2631 formed using electronic paper. In the case where an advertising medium is printed paper, the advertisement is replaced by manpower; however, by using electronic paper to which the present invention is applied, the advertising display can be changed in a short time. Further, an image can be stably displayed without being distorted. Note that the poster may transmit and receive data wirelessly.

Figure 31B:
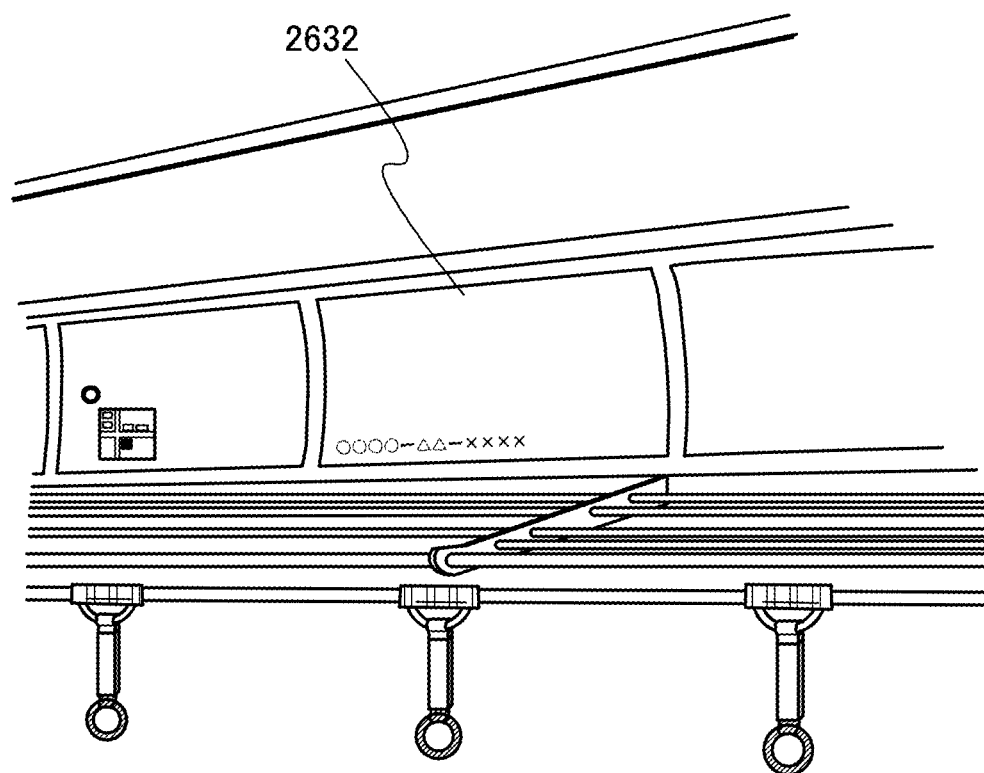

FIG. 31B illustrates an advertisement 2632 in a vehicle such as a train. In the case where an advertising medium is printed paper, the advertisement is replaced by manpower; however, by using electronic paper to which the present invention is applied, the advertising display can be changed in a short time without a lot of manpower. Further, an image can be stably displayed without being distorted. Note that the advertisement in a vehicle may transmit and receive data wirelessly.

Figure 32:
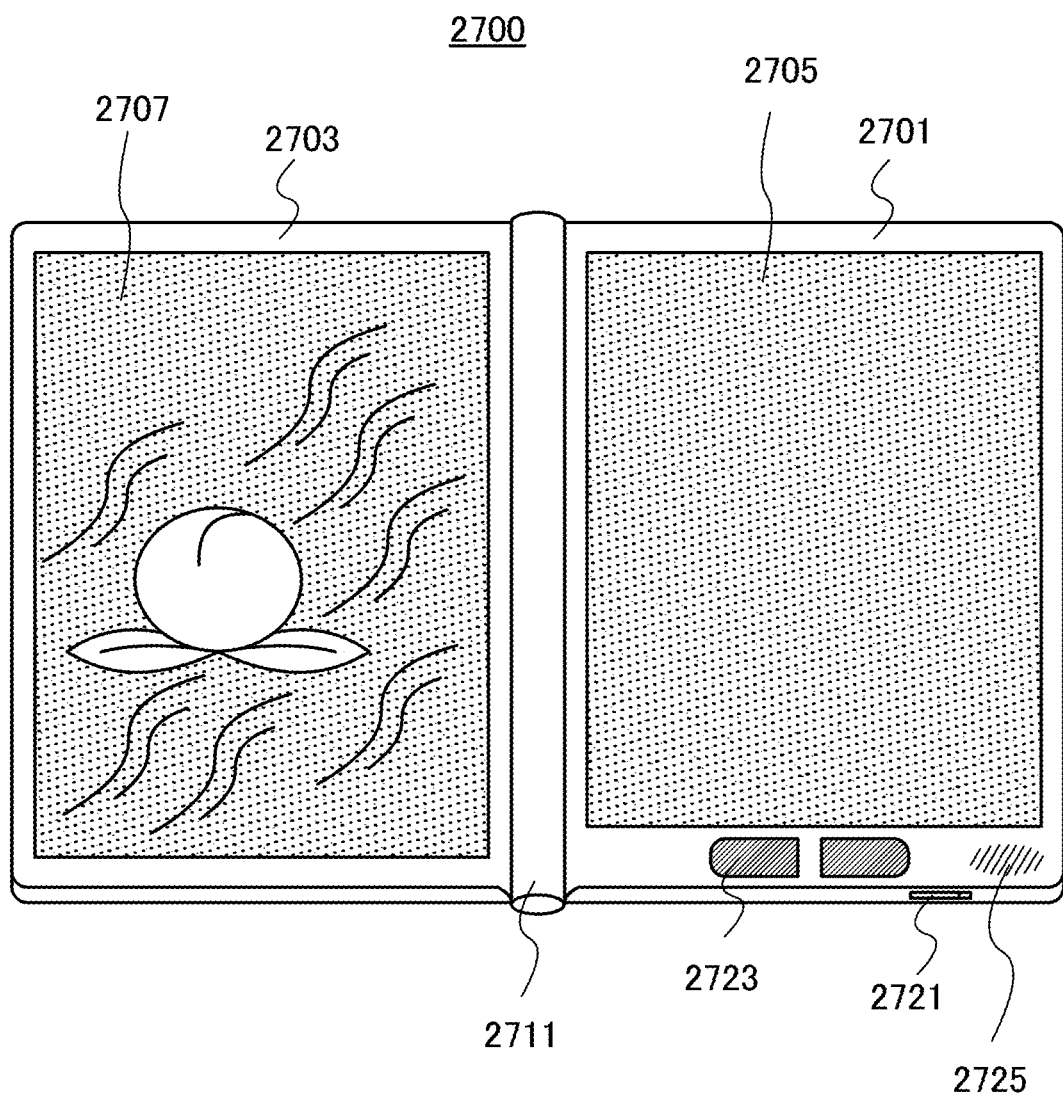
FIG. 32 is an external view of an example of an e-book reader.

FIG. 32 illustrates an example of an electronic book device 2700. For example, the electronic book device 2700 includes two housings, a housing 2701 and a housing 2703. The housing 2701 and the housing 2703 are combined with a hinge 2711 so that the electronic book device 2700 can be opened and closed with the hinge 2711 as an axis. With such a structure, the electronic book device 2700 can be operated like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 32) can display text and a display portion on the left side (the display portion 2707 in FIG. 32) can display graphics.

FIG. 32 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the surface of the housing, on which the display portion is provided. Further, an external connection terminal (an earphone terminal, a USB terminal, a terminal that can be connected to an AC adapter and various cables such as a USB cable, or the like), a recording medium insert portion, and the like may be provided on the back surface or the side surface of the housing. Further, the electronic book device 2700 may have a function of an electronic dictionary.

The electronic book device 2700 may transmit and receive data wirelessly. A structure can be employed in which desired book data or the like is purchased and downloaded from an electronic book server wirelessly.

EMBODIMENT 12

A semiconductor device according to an embodiment of the present invention can be applied to a variety of electronic appliances (including an amusement machine). Examples of the electronic appliances are a television set (also referred to as a television or a television receiver), a monitor of a computer or the like, a camera such as a digital camera or a digital video camera, a digital photo frame, a mobile phone set (also referred to as a mobile phone or a mobile phone device), a portable game machine, a portable information terminal, an audio reproducing device, a large-sized game machine such as a pachinko machine, and the like.

Figure 33A:
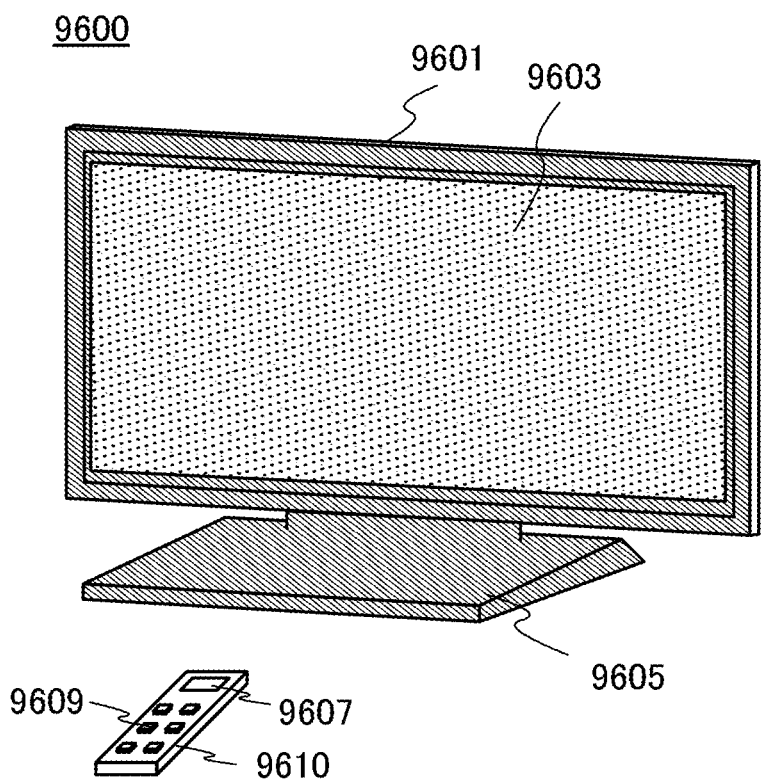
FIG. 33A is an external view of an example of a television device and FIG. 33B is an external view of an example of a digital photo frame.

FIG. 33A illustrates an example of a television set 9600. In the television set 9600, a display portion 9603 is incorporated in a housing 9601. The display portion 9603 can display an image. Further, the housing 9601 is supported by a stand 9605 here.

The television set 9600 can be operated by an operation switch of the housing 9601 or a separate remote controller 9610. Channels and volume can be controlled by an operation key 9609 of the remote controller 9610 so that an image displayed on the display portion 9603 can be controlled. Further, the remote controller 9610 may be provided with a display portion 9607 for displaying data output from the remote controller 9610.

Note that the television set 9600 is provided with a receiver, a modem, and the like. With the receiver, a general television broadcast can be received. Further, when the television set 9600 is connected to a communication network by wired or wireless connection via the modem, one-way (from a transmitter to a receiver) or two-way (between a transmitter and a receiver or between receivers) data communication can be performed.

Figure 33B:
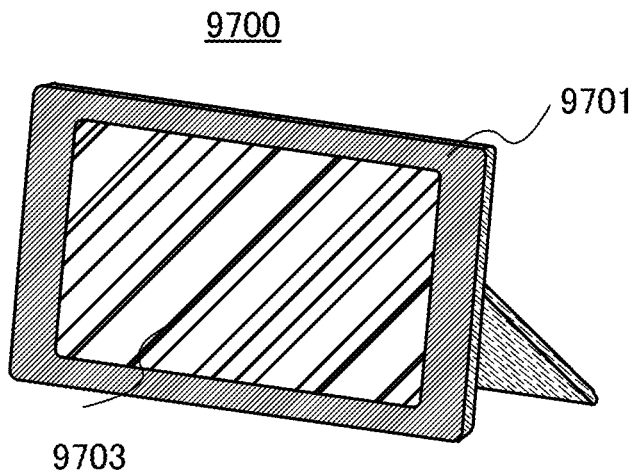

FIG. 33B illustrates an example of a digital photo frame 9700. For example, in the digital photo frame 9700, a display portion 9703 is incorporated in a housing 9701. The display portion 9703 can display various images. For example, the display portion 9703 can display data of an image shot by a digital camera or the like to function as a normal photo frame.

Note that the digital photo frame 9700 is provided with an operation portion, an external connection portion (a USB terminal, a terminal that can be connected to various cables such as a USB cable, or the like), a recording medium insert portion, and the like. Although they may be provided on the surface on which the display portion is provided, it is preferable to provide them on the side surface or the back surface for the design of the digital photo frame 9700. For example, a memory storing data of an image shot by a digital camera is inserted in the recording medium insert portion of the digital photo frame, whereby the image data can be transferred and displayed on the display portion 9703.

The digital photo frame 9700 may transmit and receive data wirelessly. A structure may be employed in which desired image data is transferred wirelessly to be displayed.

Figure 34A:
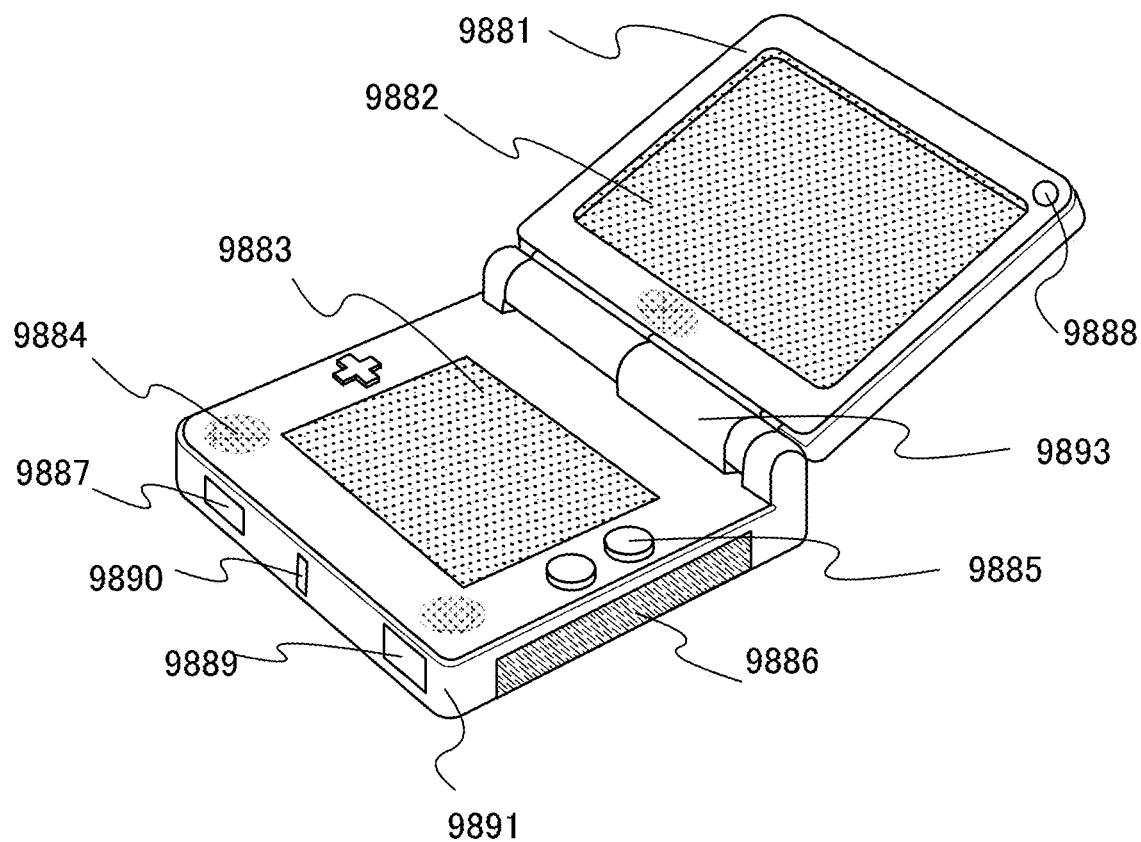
FIGS. 34A and 34B are external views of examples of an amusement machine.

FIG. 34A is a portable amusement machine including two housings, a housing 9881 and a housing 9891. The housings 9881 and 9891 are connected with a connection portion 9893 so as to be opened and closed. A display portion 9882 is incorporated in the housing 9881, and a display portion 9883 is incorporated in the housing 9891. In addition, the portable amusement machine illustrated in FIG. 34A includes a speaker portion 9884, a recording medium insert portion 9886, an LED lamp 9890, an input means (an operation key 9885, a connection terminal 9887, a sensor 9888 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 9889), and the like. Of course, the structure of the portable amusement machine is not limited to the above and a structure provided with at least a semiconductor device according to the present invention may be employed. The structure can include other accessory equipment as appropriate. The portable amusement machine illustrated in FIG. 34A has a function of reading a program or data stored in a recording medium to display it on the display portion, and a function of sharing information with another portable amusement machine by wireless communication. The portable amusement machine illustrated in FIG. 34A can have various functions without limitation to the above.

Figure 34B:
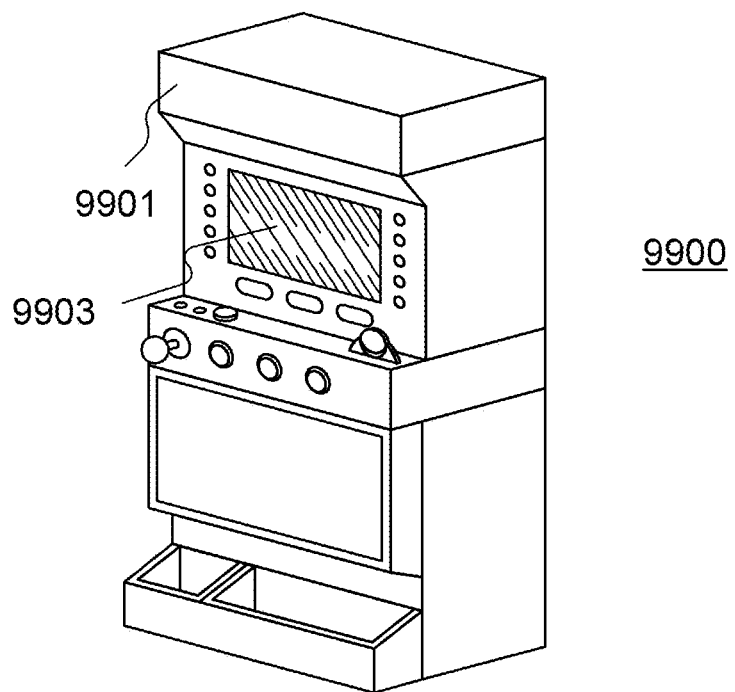

FIG. 34B illustrates an example of a slot machine 9900 which is an amusement machine with a big size. The slot machine 9900 includes a display portion 9903 incorporated in a housing 9901. In addition, the slot machine 9900 includes an operation means such as a start lever or a stop switch, a coin slot, a speaker, and the like. Of course, the structure of the slot machine 9900 is not limited to the above and a structure provided with at least a semiconductor device according to the present invention may be employed. The structure can include other accessory equipment as appropriate.

Figure 35:
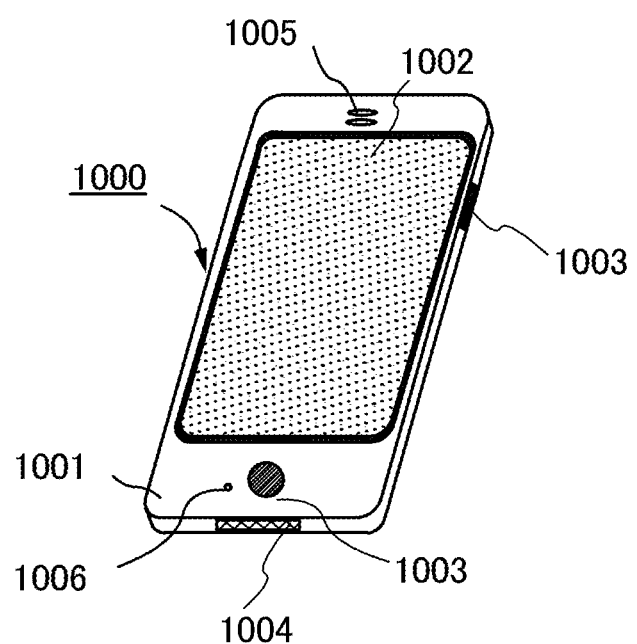
FIG. 35 is an external view of an example of a mobile phone handset.

FIG. 35 illustrates an example of a mobile phone set 1000. The mobile phone set 1000 is provided with a display portion 1002 incorporated in a housing 1001, operation buttons 1003, an external connection port 1004, a speaker 1005, a microphone 1006, and the like.

When the display portion 1002 of the mobile phone set 1000 illustrated in FIG. 35 is touched with a finger or the like, data can be input into the mobile phone set 1000. Further, operations such as making calls and composing mails can be performed by touching the display portion 1002 with a finger or the like.

There are mainly three screen modes of the display portion 1002. The first mode is a display mode mainly for displaying an image. The second mode is an input mode mainly for inputting data such as text. The third mode is a display-and-input mode in which two modes of the display mode and the input mode are combined.

For example, in the case of making a call or composing a mail, a text input mode mainly for inputting text is selected for the display portion 1002 so that text displayed on a screen can be input. In that case, it is preferable to display a keyboard or number buttons on almost all area of the screen of the display portion 1002.

When a detection device including a sensor for detecting inclination, such as a gyroscope or an acceleration sensor, is provided inside the mobile phone set 1000, display in the screen of the display portion 1002 can be automatically switched by determining the direction of the mobile phone set 1000 (whether the mobile phone set 1000 stands upright or is laid down on its side).

The screen modes are switched by touching the display portion 1002 or operating the operation buttons 1003 of the housing 1001. Alternatively, the screen modes may be switched depending on the kind of the image displayed on the display portion 1002. For example, when a signal of an image displayed on the display portion is the one of moving image data, the screen mode is switched to the display mode. When the signal is the one of text data, the screen mode is switched to the input mode.

Further, in the input mode, when input by touching the display portion 1002 is not performed for a certain period while a signal detected by the optical sensor in the display portion 1002 is detected, the screen mode may be controlled so as to be switched from the input mode to the display mode.

The display portion 1002 may function as an image sensor. For example, an image of the palm print, the fingerprint, or the like is taken by touching the display portion 1002 with the palm or the finger, whereby personal authentication can be performed. Further, by providing a backlight or sensing light source emitting a near-infrared light for the display portion, an image of a finger vein, a palm vein, or the like can be taken.

EMBODIMENT 13

In this embodiment, an example of a channel protective thin film transistor of the present invention will be described. Accordingly, except the channel protective structure, the thin film transistor can be formed in a manner similar to Embodiment 1 or 2, and repetitive description of the same portions as or portions having functions similar to those in Embodiment 1 or 2 and manufacturing steps will be omitted.

In this embodiment, a thin film transistor 175 included in a semiconductor device will be described with reference to FIG. 36.

Figure 36:
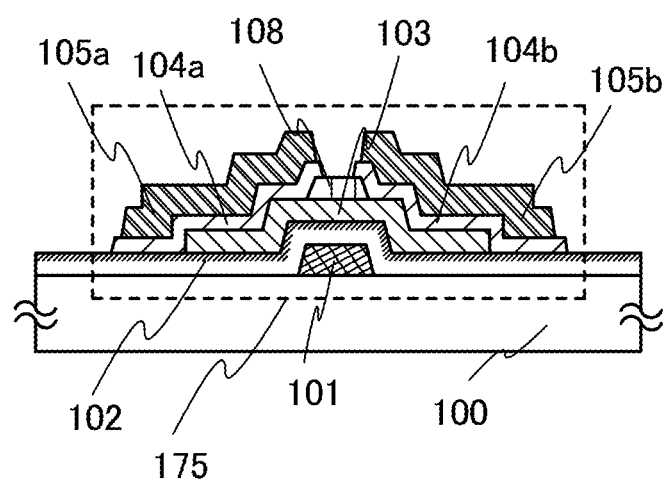
FIG. 36 illustrates a semiconductor device of an embodiment of the present invention.
Figure 37:
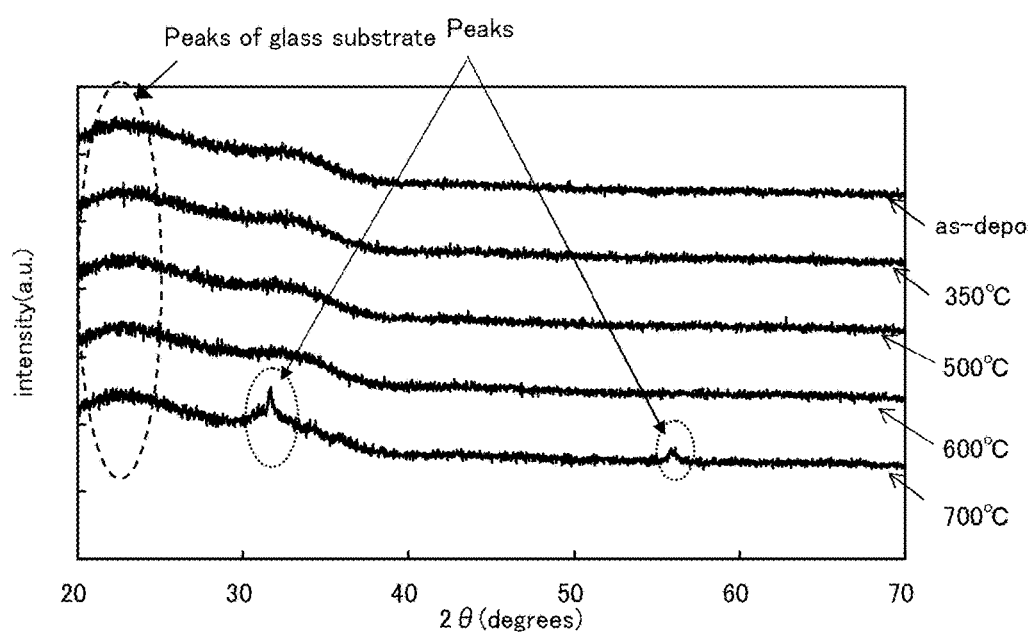
FIG. 37 illustrates results of XRD measurement.
Figure 38:
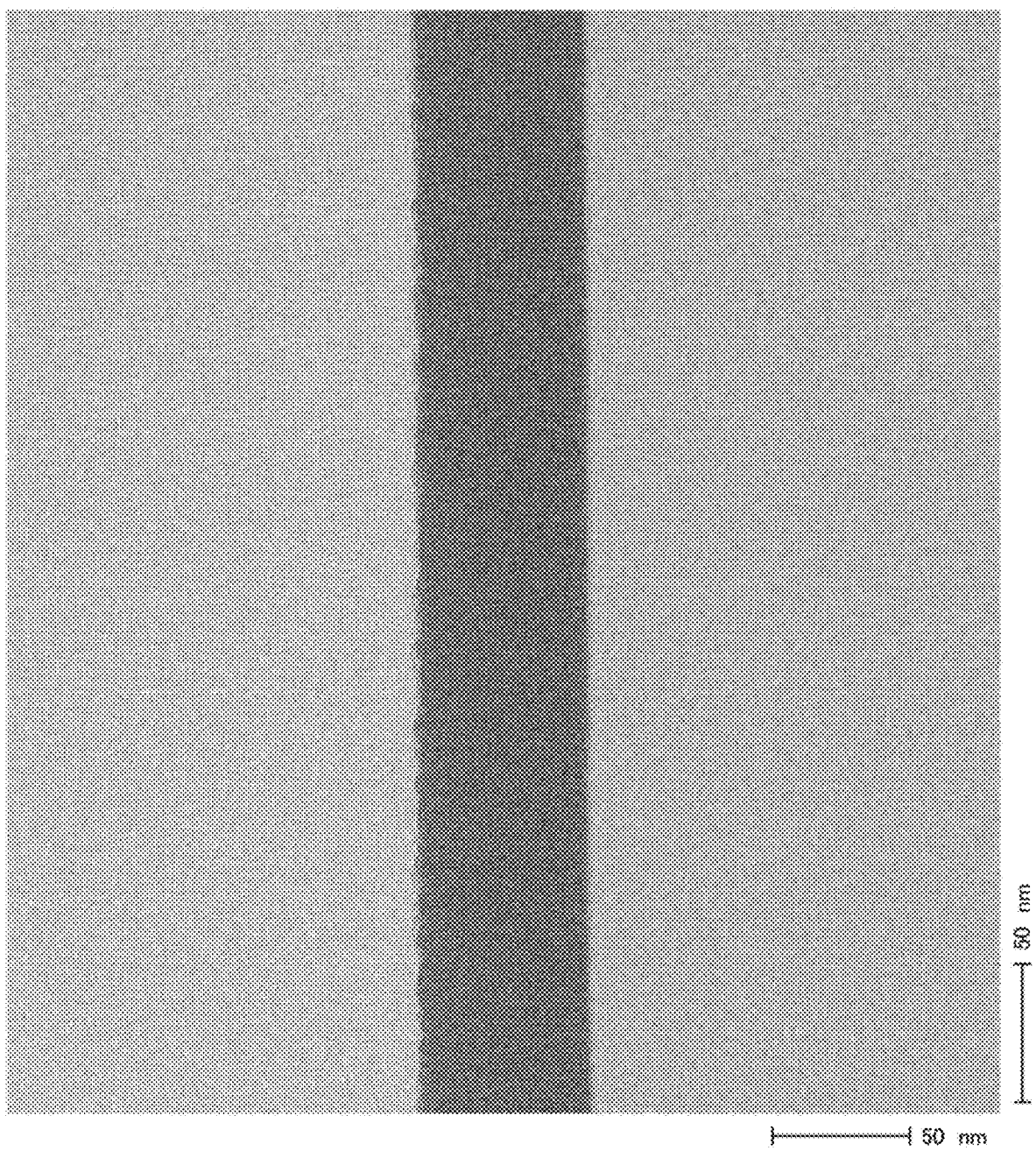
FIG. 38 is a cross-sectional TEM photograph (magnified 0.5 million times) of Sample 1 obtained under oxygen-excess conditions.
Figure 39:
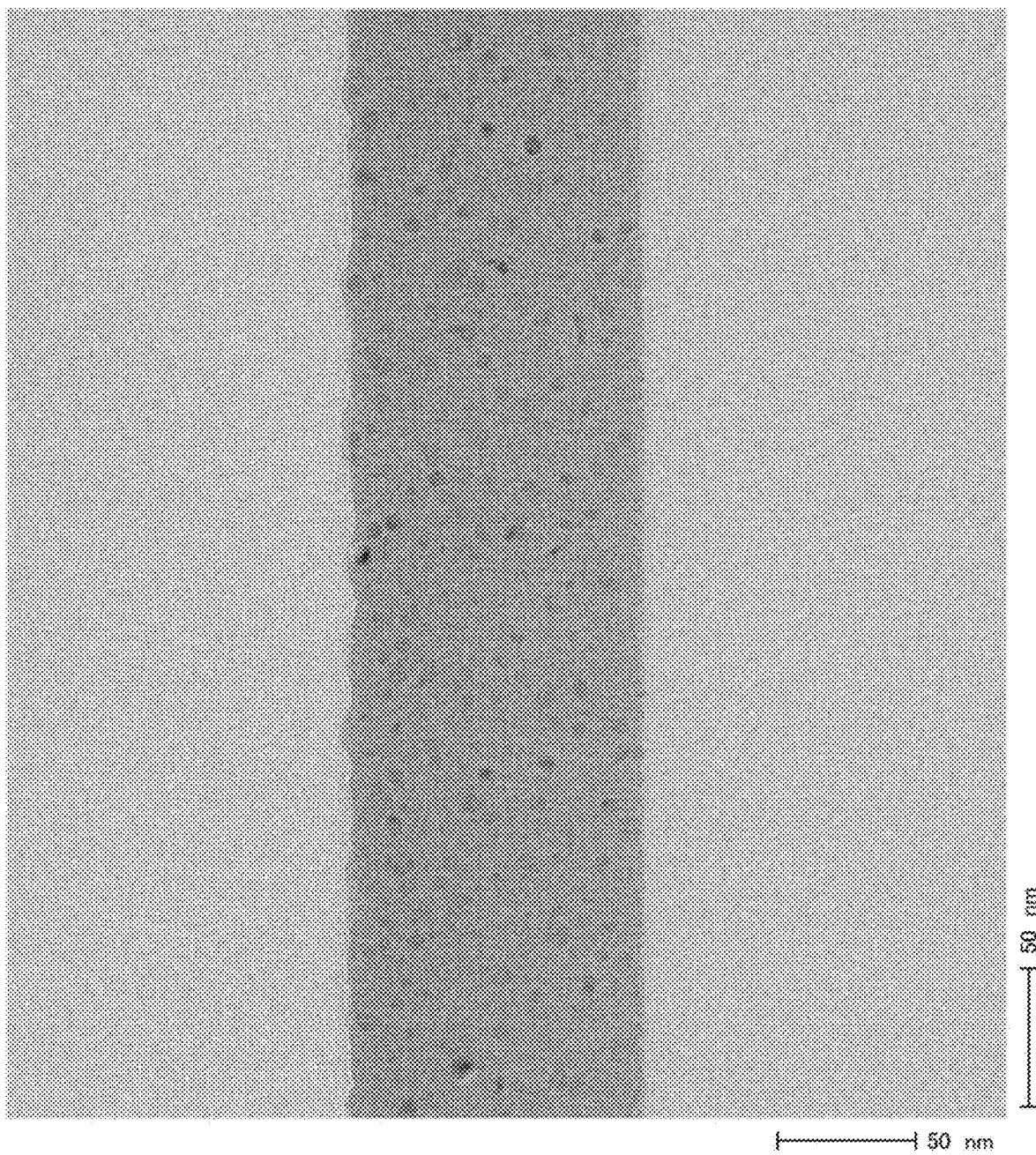
FIG. 39 is a cross-sectional TEM photograph (magnified 0.5 million times) of Sample 2 obtained under oxygen-deficient conditions.
Figure 40:
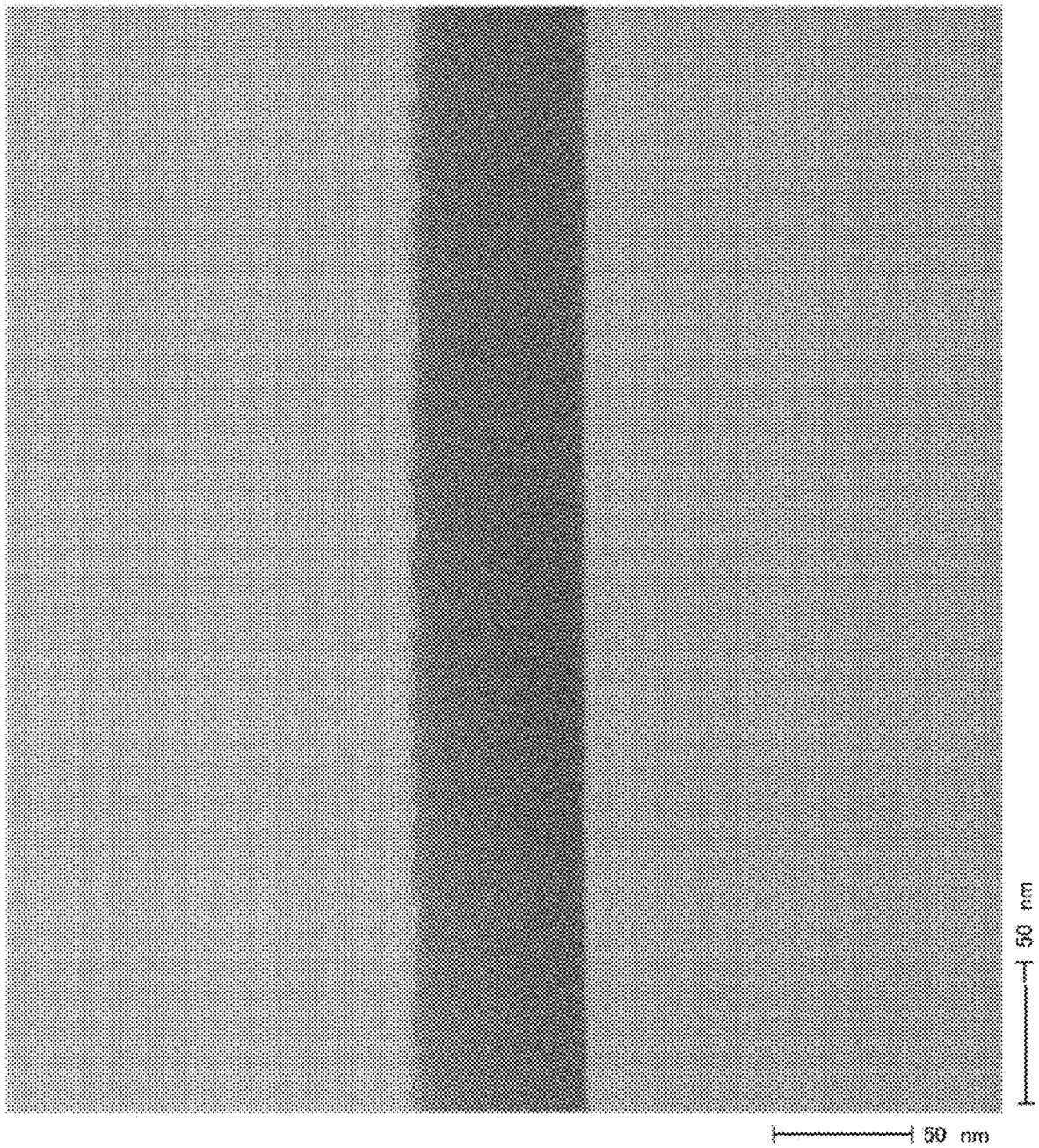
FIG. 40 is a cross-sectional TEM photograph (magnified 0.5 million times) of Sample 3 obtained under oxygen-excess conditions and further subjected to heat treatment.
Figure 41:
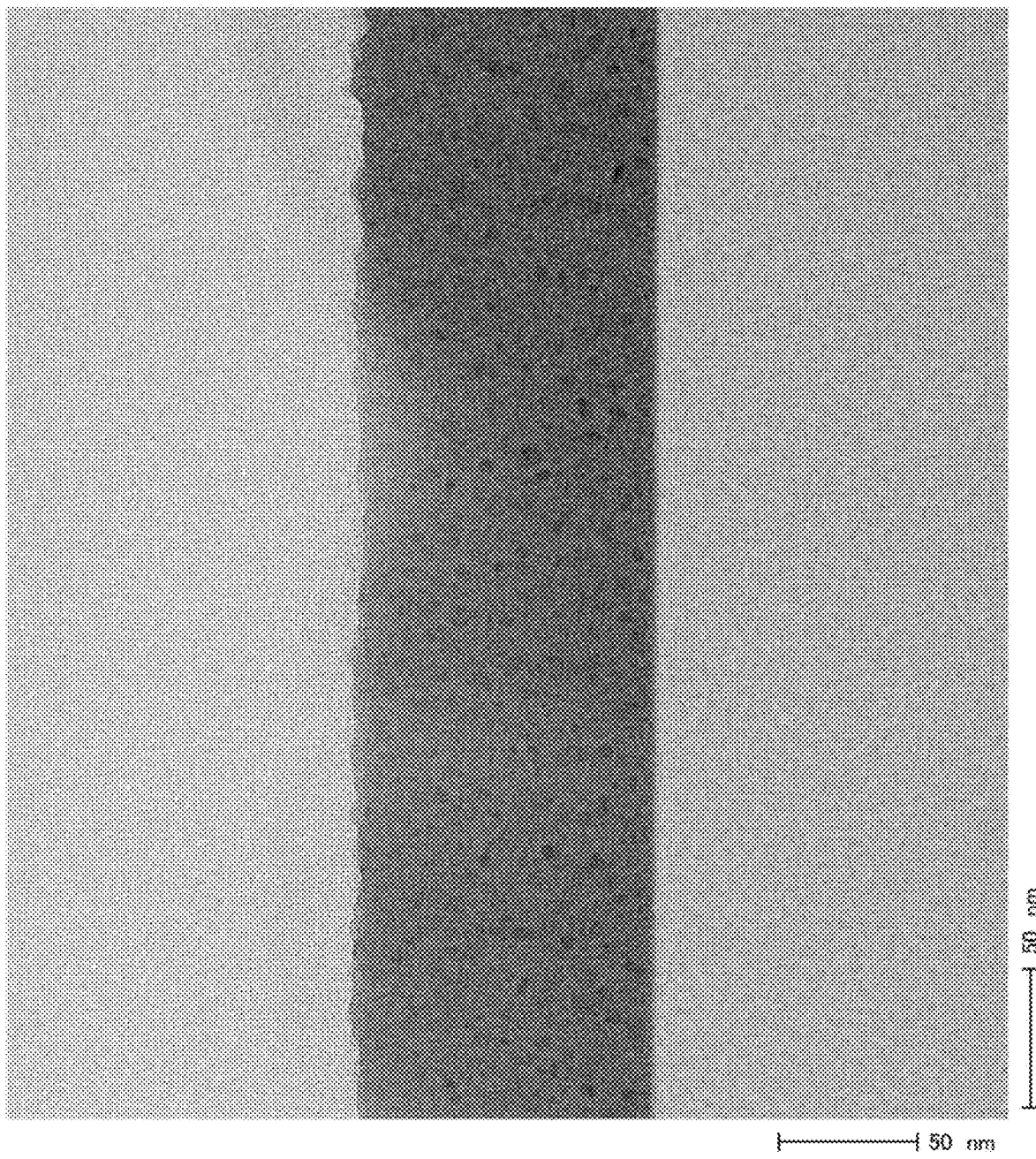
FIG. 41 is a cross-sectional TEM photograph (magnified 0.5 million times) of Sample 4 obtained under oxygen-deficient conditions and further subjected to heat treatment.
Figure 42:
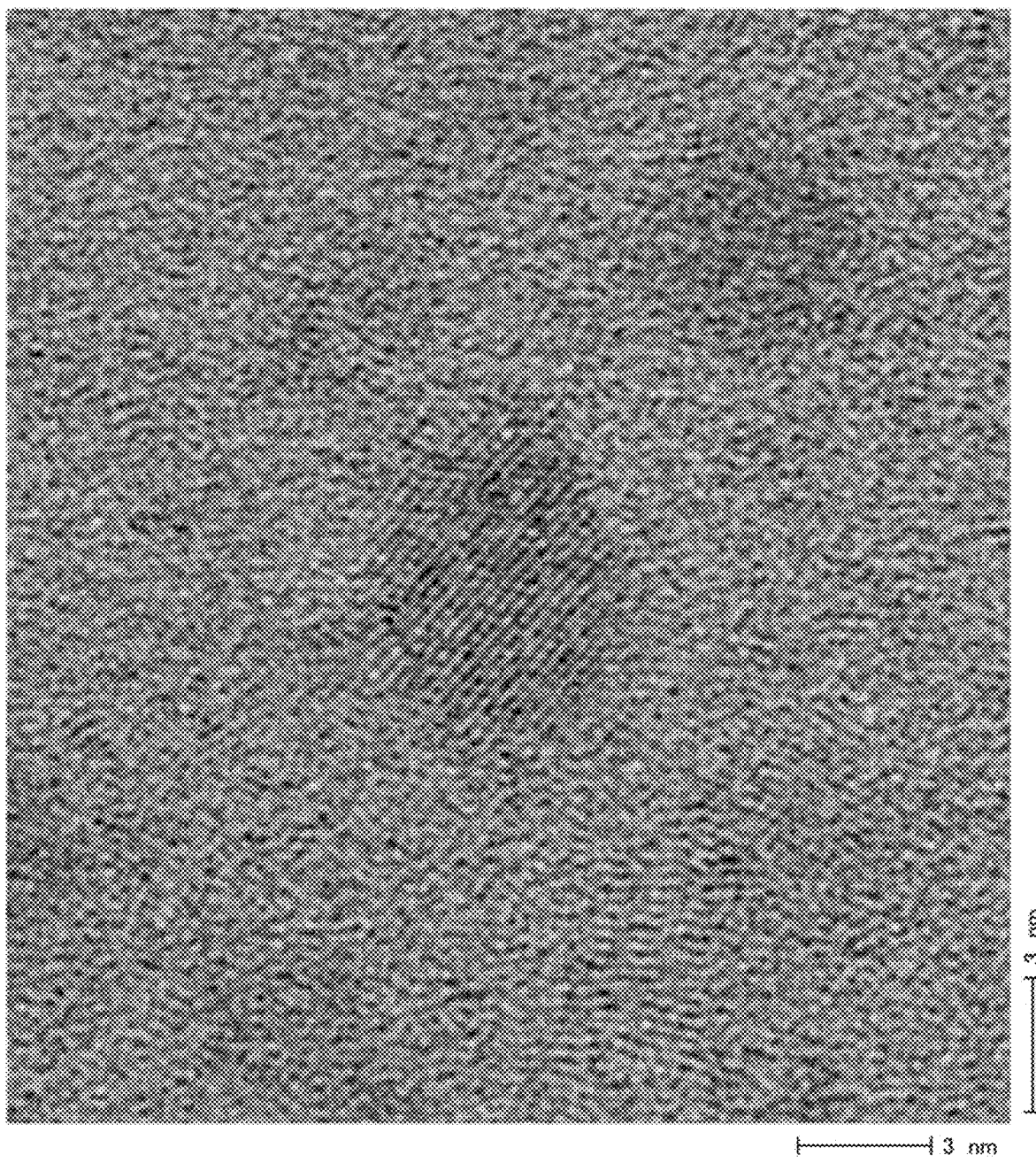
FIG. 42 is a cross-sectional TEM photograph (magnified 8 million times) of Sample 2 obtained under oxygen-deficient conditions.
Figure 43:
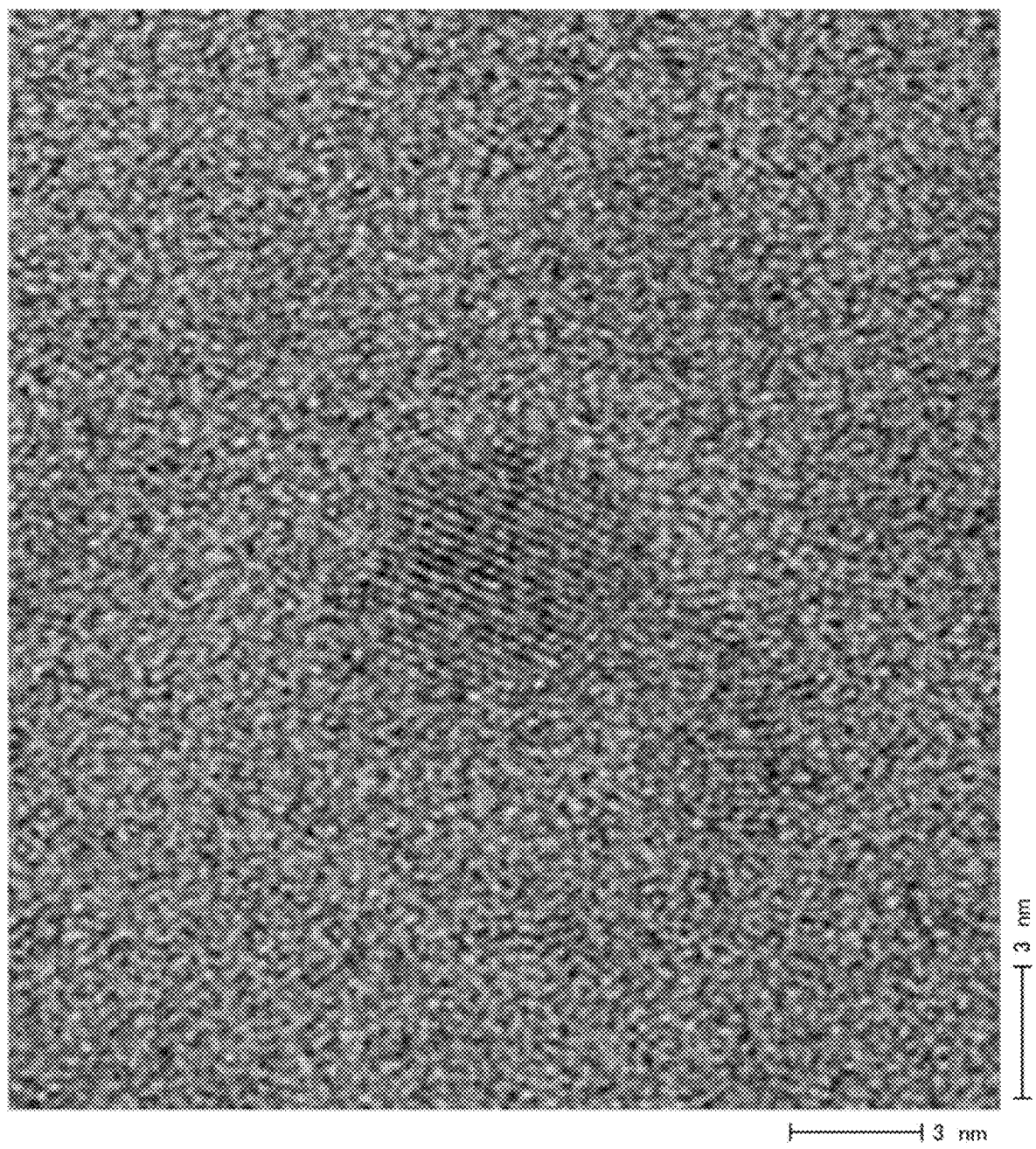
FIG. 43 is a cross-sectional TEM photograph (magnified 8 million times) of Sample 4 obtained under oxygen-deficient conditions.
Figure 44:
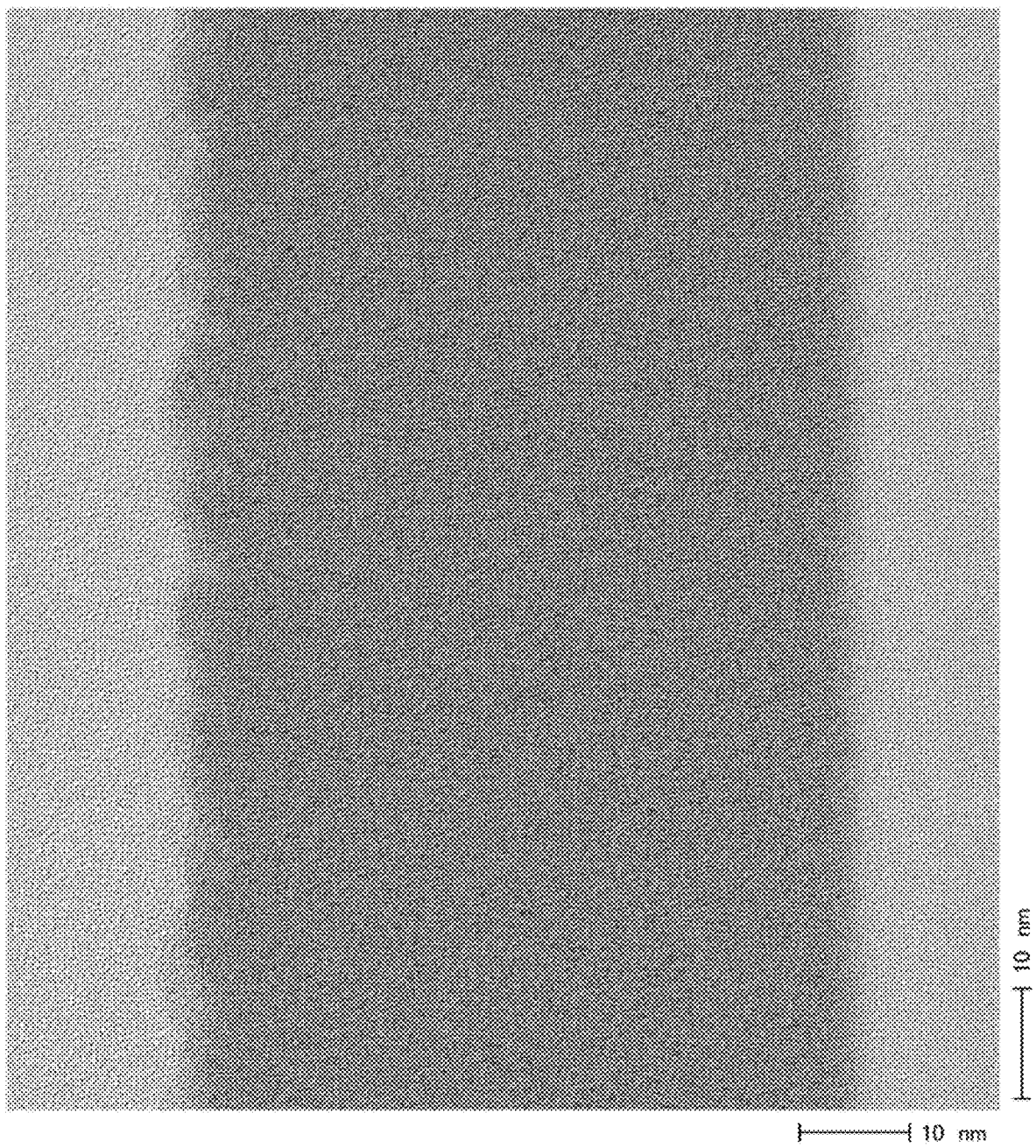
FIG. 44 is a cross-sectional TEM photograph (magnified 2 million times) of Sample 1 obtained under oxygen-excess conditions.
Figure 45:
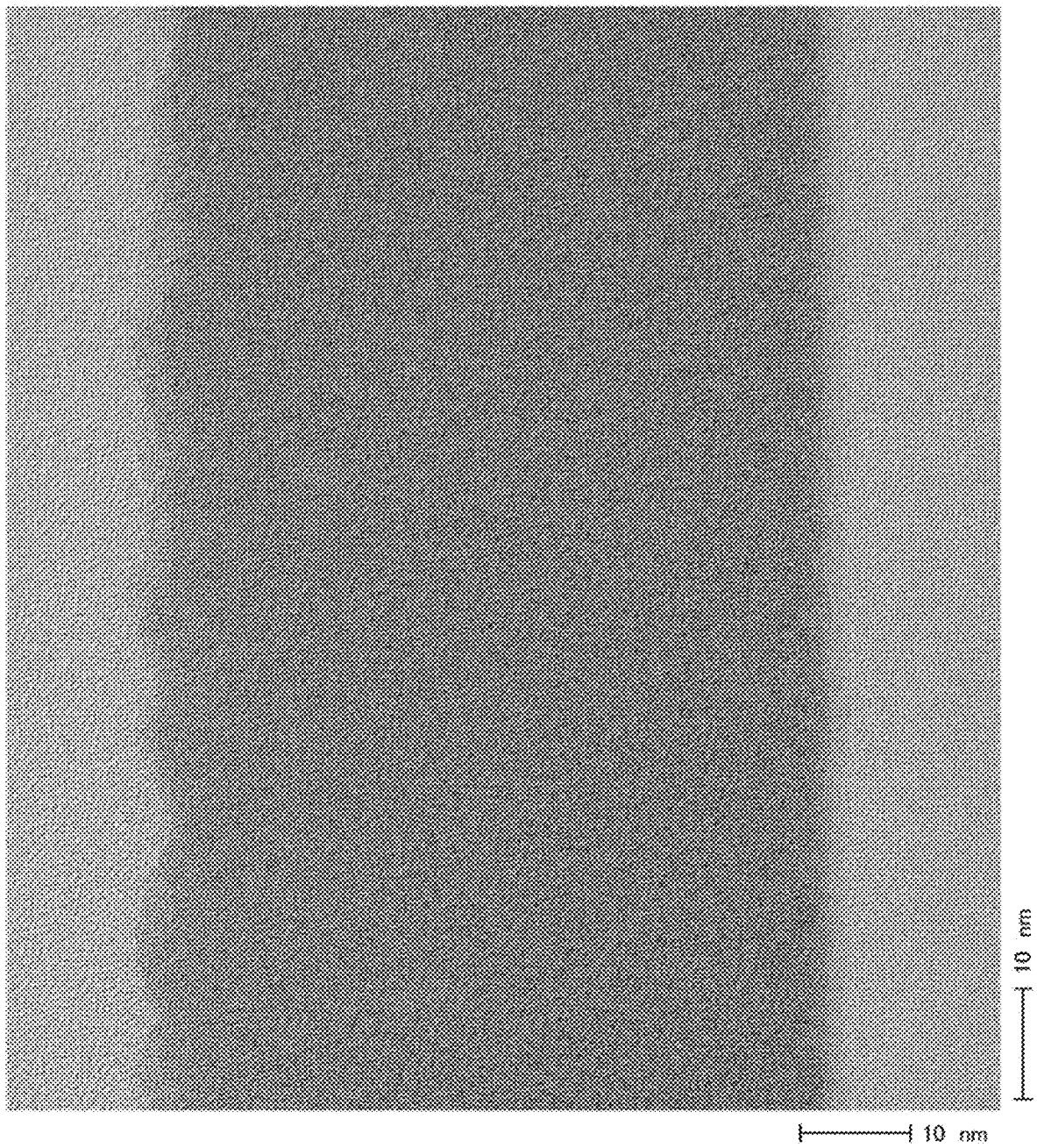
FIG. 45 is a cross-sectional TEM photograph (magnified 2 million times) of Sample 3 obtained under oxygen-excess conditions and further subjected to heat treatment.
Figure 46:
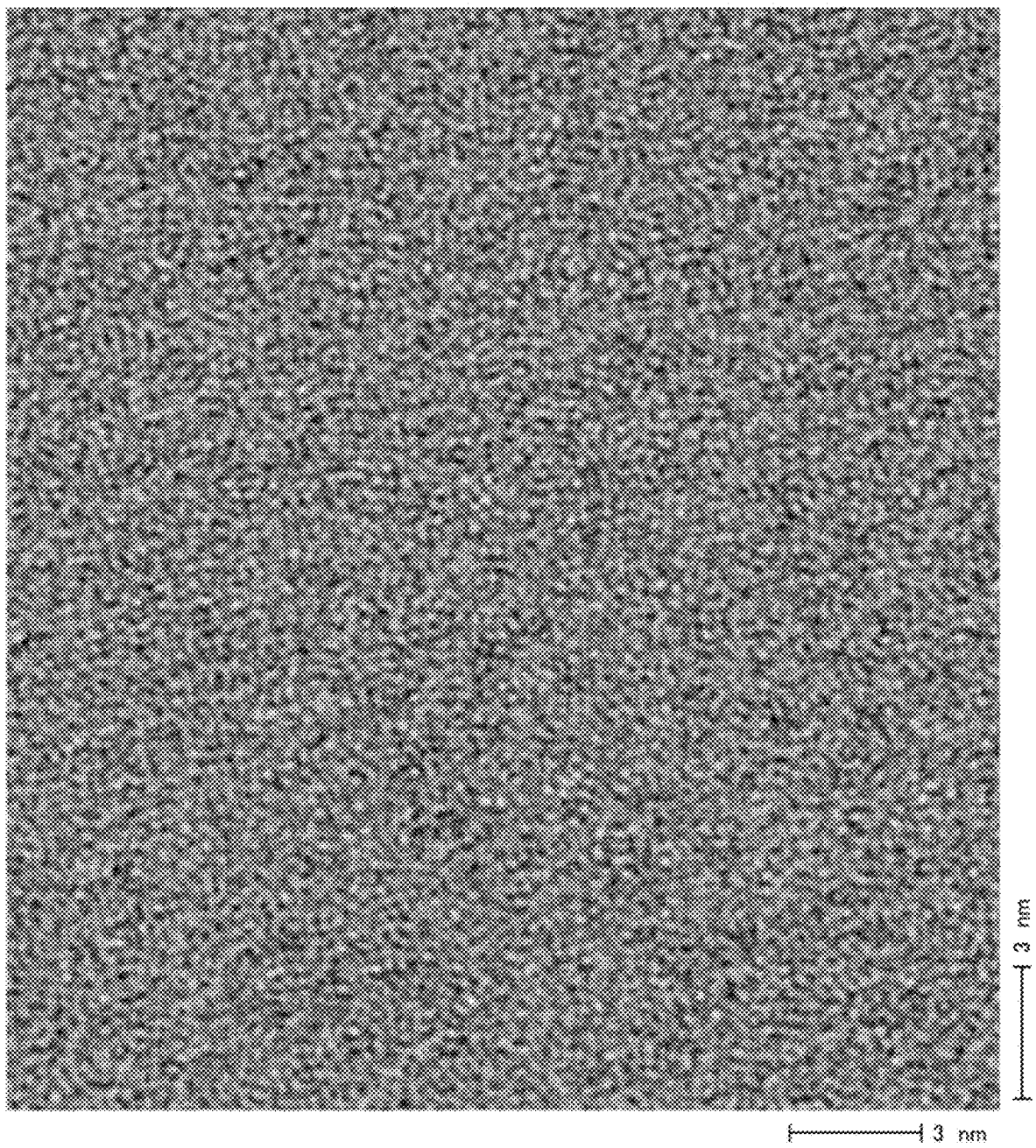
FIG. 46 is a cross-sectional TEM photograph (magnified 8 million times) of Sample 1 obtained under oxygen-excess conditions.
Figure 47:
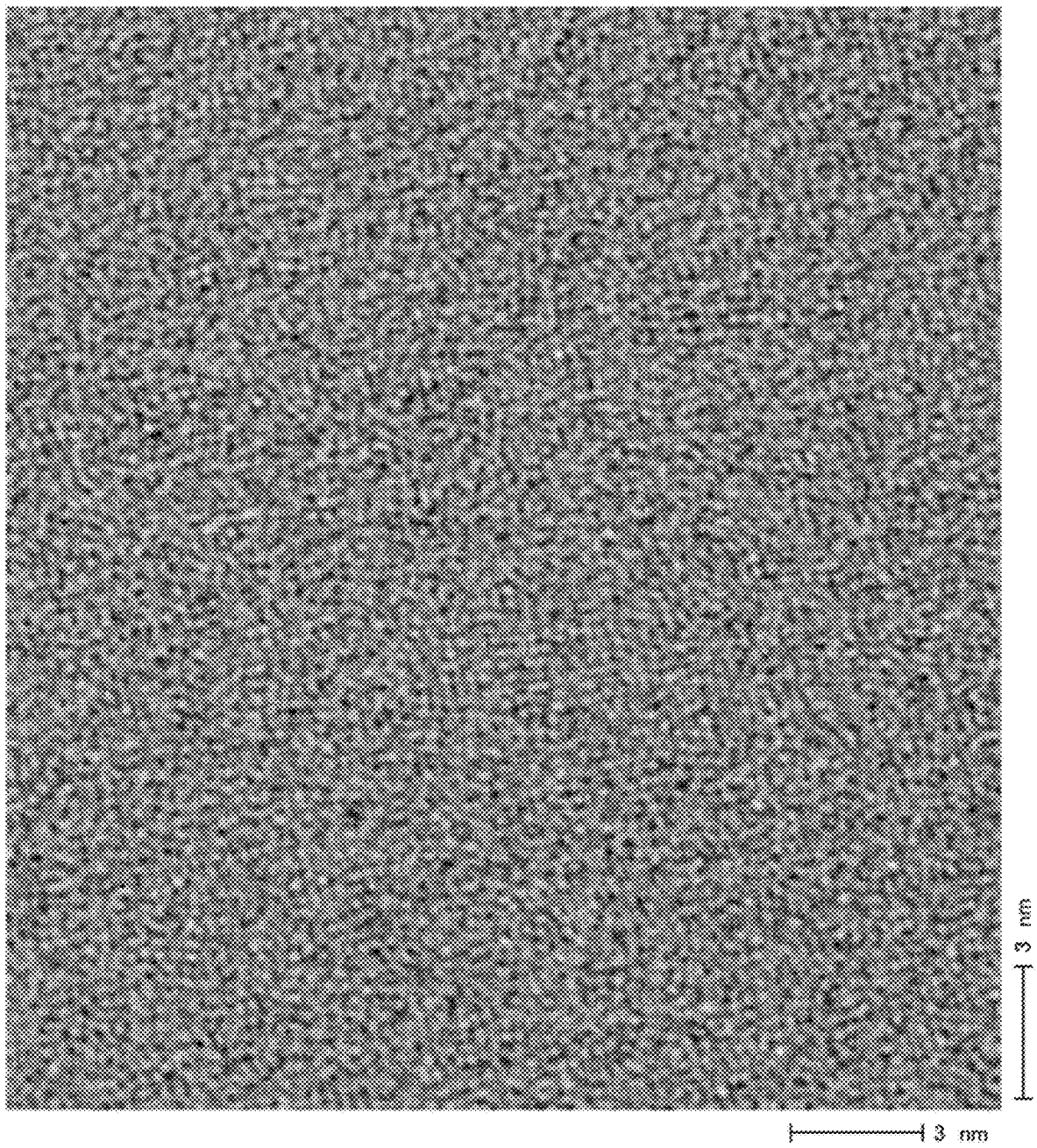
FIG. 47 is a cross-sectional TEM photograph (magnified 8 million times) of Sample 3 obtained under oxygen-excess conditions and further subjected to heat treatment.
Figure 48:
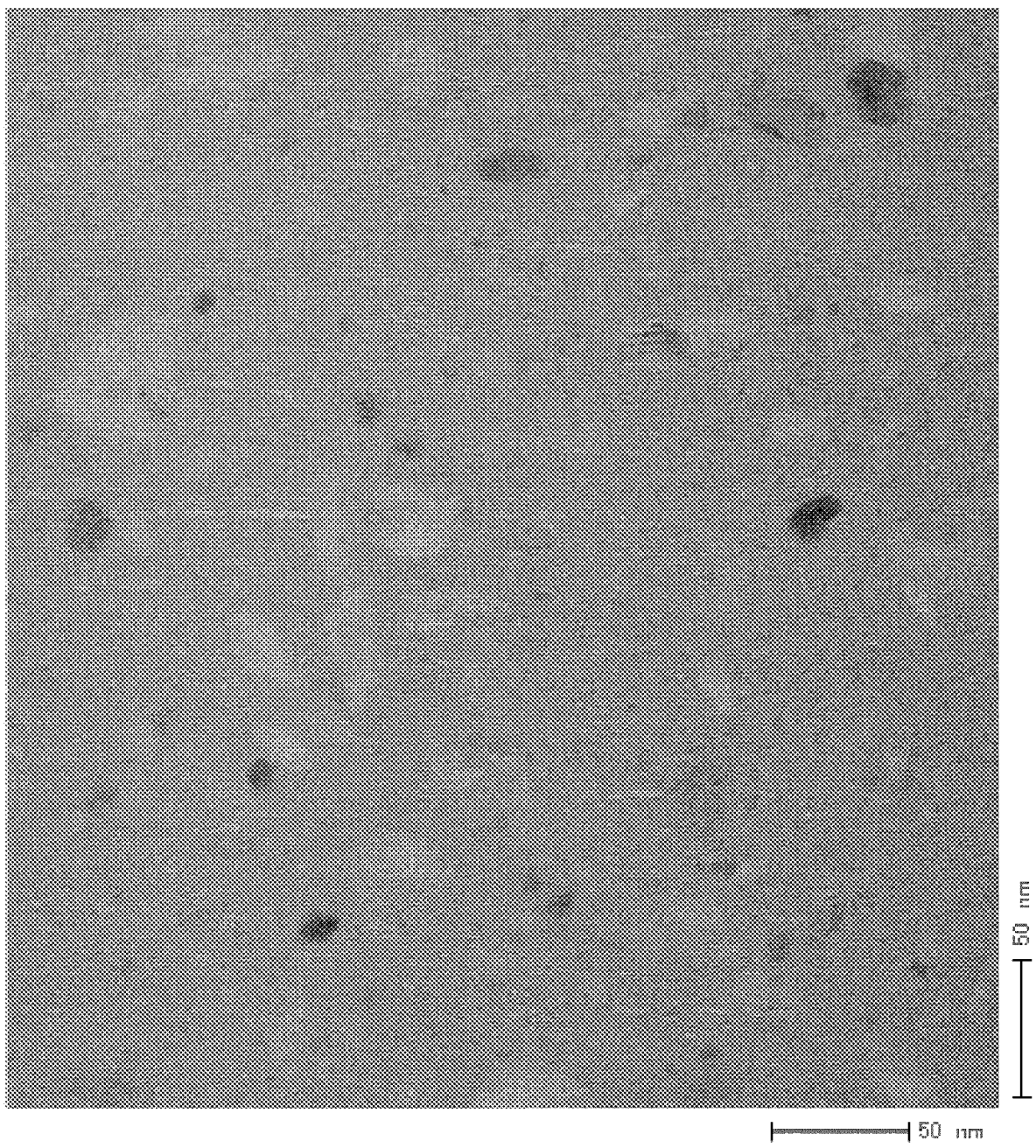
FIG. 48 is a cross-sectional TEM photograph (magnified 0.5 million times) of a sample subjected to heat treatment at 700° C.
Figure 49:
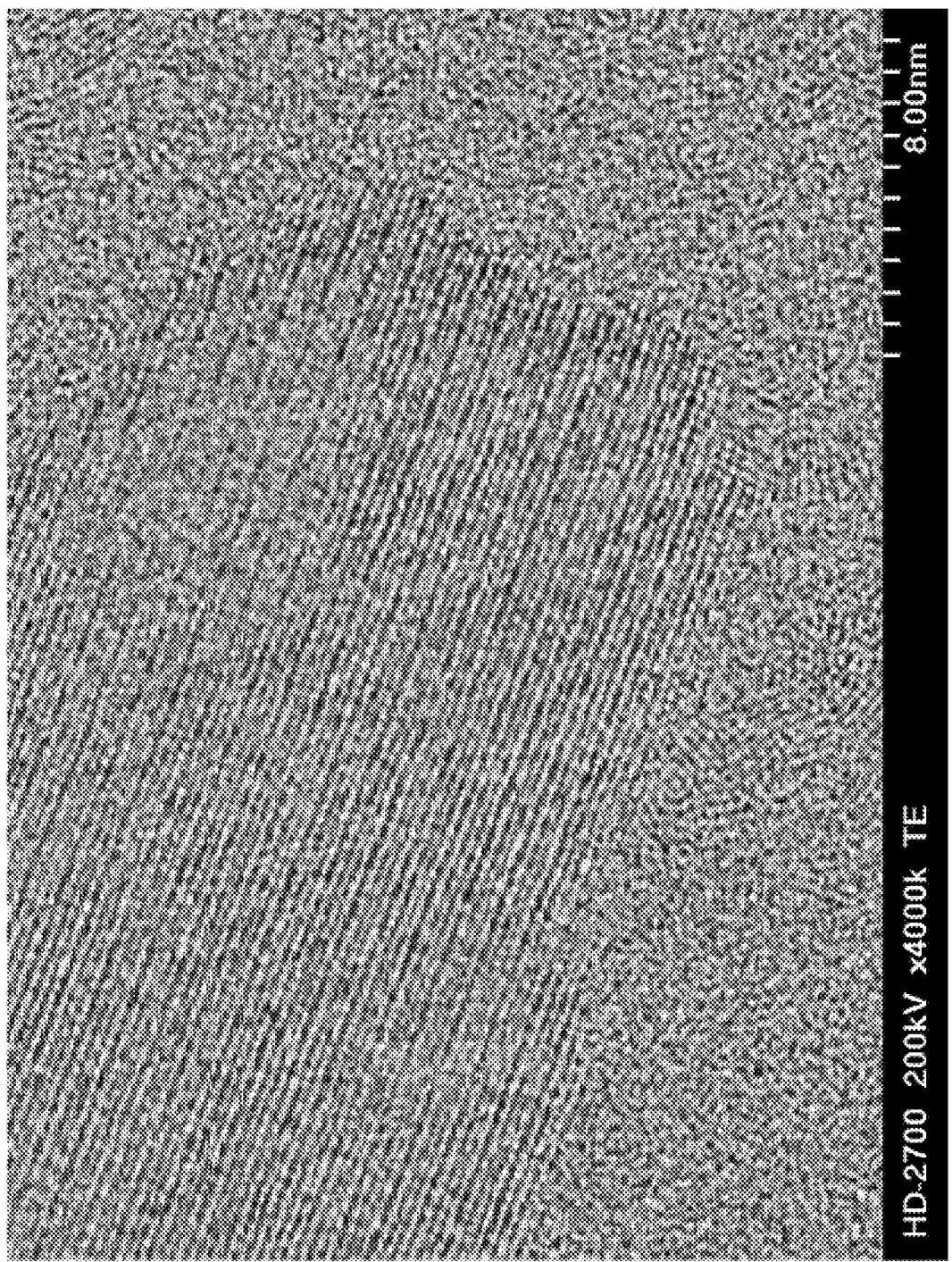
FIG. 49 is a STEM photograph (magnified 6 million times) of a sample subjected to heat treatment at 700° C.

As illustrated in FIG. 36, the thin film transistor 175 including a gate electrode layer 101, a gate insulating layer 102, a semiconductor layer 103, a channel protective layer 108, source and drain regions 104a and 104b, and source and drain electrode layers 105a and 105b is provided over a substrate 100.

n the thin film transistor 175 of this embodiment, the channel protective layer 108 is provided over a channel formation region of the semiconductor layer 103. The semiconductor layer 103 is not etched because the channel protective layer 108 functions as a channel stopper. The channel protective layer 108 may also be formed by successive formation after the gate insulating layer 102 and the semiconductor layer 103 without being exposed to the air. By successive formation of a stack of thin films without exposure to air, productivity can be improved.

The channel protective layer 108 can be formed using an inorganic material (such as silicon oxide, silicon nitride, silicon oxynitride, silicon nitride oxide, aluminum oxide, aluminum nitride, aluminum oxynitride, or aluminum nitride oxide). As a formation method, a sputtering method can be used.

The semiconductor layer 103 is an oxygen-excess oxide semiconductor layer containing In, Ga, and Zn, and the source and drain regions 104a and 104b are oxygen-deficient oxide semiconductor layers containing In, Ga, and Zn.

The gate insulating layer having an oxygen-excess region and the semiconductor layers which are oxygen-excess oxide semiconductor layers are compatible with each other and can provide favorable interface characteristics.

After the gate insulating layer 102 is formed, a surface of the gate insulating layer 102 is subjected to oxygen radical treatment to form an oxygen-excess region. The gate insulating layer 102 and the semiconductor layer 103 are formed successively.

The source and drain regions 104a and 104b which are oxygen-deficient oxide semiconductor layers include crystal grains with a size of 1 nm to 10 nm and have a higher carrier concentration than the semiconductor layer 103.

The thin film transistor described in this embodiment has a structure in which the gate electrode layer, the gate insulating layer, the semiconductor layer (an oxygen-excess oxide semiconductor layer), the source and drain regions (oxygen-deficient oxide semiconductor layers), and the source and drain electrode layers are stacked. By using oxygen-deficient oxide semiconductor layers including crystal grains and having a high carrier concentration as the source and drain regions, the parasitic capacitance can be reduced while the thickness of the semiconductor layer is kept small. Note that the parasitic capacitance is sufficiently suppressed even when the source and drain regions have a small thickness, because the thickness of the source and drain regions is sufficient with respect to that of the gate insulating layer.

According to this embodiment, a thin film transistor with small photoelectric current, small parasitic capacitance, and high on-off ratio can be obtained, so that a thin film transistor having excellent dynamic characteristics can be manufactured. Therefore, a semiconductor device which includes thin film transistors having excellent electrical characteristics and high reliability can be provided.

This embodiment can be combined with any of the other embodiments as appropriate.

This application is based on Japanese Patent Application serial no. 2008-224034 filed with Japan Patent Office on Sep. 1, 2008, the entire contents of which are hereby incorporated by reference.

What is claimed is:

1. A semiconductor device comprising:
    a gate electrode layer;
    a gate insulating layer over the gate electrode layer;
    an oxide semiconductor layer over the gate electrode layer with the gate insulating layer therebetween, the oxide semiconductor layer comprising indium and zinc;
    a first region over the oxide semiconductor layer;
    a second region over the oxide semiconductor layer,
    a third region over the oxide semiconductor layer, wherein each of the first region, the second region and the third region comprises indium and zinc;
    a first electrode layer on the first region; and
    a second electrode layer on the second region,
    a third electrode layer on the third region between the first electrode layer and the second electrode layer,
    wherein the first electrode layer is electrically connected to a pixel electrode, and
    wherein the second electrode layer is electrically connected to a source line.

2. The semiconductor device according to claim 1, wherein an oxygen concentration in the oxide semiconductor layer at an interface with the gate insulating layer is higher than at a portion distant from the interface.

3. The semiconductor device according to claim 1, wherein the oxide semiconductor layer further comprises gallium.

4. The semiconductor device according to claim 1, wherein each of the first electrode layer and the second electrode layer comprises a metal selected from the group consisting of aluminum, copper, titanium and molybdenum.

5. The semiconductor device according to claim 1, wherein an oxygen concentration in the first region and the second region is lower than an oxygen concentration in the oxide semiconductor layer.

6. A semiconductor device comprising:
    a gate electrode layer;
    a gate insulating layer over the gate electrode layer;
    an oxide semiconductor layer over the gate electrode layer with the gate insulating layer therebetween, the oxide semiconductor layer comprising indium and zinc;
    a first region over the oxide semiconductor layer;
    a second region over the oxide semiconductor layer,
    a third region over the oxide semiconductor layer, wherein each of the first region, the second region and third region comprises indium and zinc;
    a first electrode layer on the first region; and
    a second electrode layer on the second region,
    a third electrode layer on the third region between the first electrode layer and the second electrode layer,
    wherein the first electrode layer, the second electrode layer and the third electrode layer overlap with the gate electrode layer,
    wherein the first electrode layer is electrically connected to a pixel electrode, and
    wherein second electrode layer is electrically connected to a source line.

7. The semiconductor device according to claim 6, wherein each of the first region and the second region comprises crystal grains having a diameter of 1 nm to 10 nm.

8. The semiconductor device according to claim 6, wherein an oxygen concentration in the oxide semiconductor layer at an interface with the gate insulating layer is higher than at a portion distant from the interface.

9. The semiconductor device according to claim 6, wherein each of the first region and the second region further comprises gallium.

10. The semiconductor device according to claim 6, wherein the gate electrode layer comprises a metal selected from the group consisting of titanium, molybdenum, chromium, tantalum, tungsten, aluminum and an alloy thereof.

11. The semiconductor device according to claim 6, wherein an oxygen concentration in the first region and the second region is lower than an oxygen concentration in the oxide semiconductor layer.

* * * * *